(12) United States Patent
Kawashima et al.

(10) Patent No.: US 11,869,428 B2
(45) Date of Patent: Jan. 9, 2024

(54) DISPLAY APPARATUS

(71) Applicant: Semiconductor Energy Laboratory Co., Ltd., Atsugi (JP)

(72) Inventors: Susumu Kawashima, Atsugi (JP); Koji Kusunoki, Isehara (JP); Kazunori Watanabe, Machida (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 17/781,409

(22) PCT Filed: Dec. 10, 2020

(86) PCT No.: PCT/IB2020/061719
§ 371 (c)(1),
(2) Date: Jun. 1, 2022

(87) PCT Pub. No.: WO2021/130581
PCT Pub. Date: Jul. 1, 2021

(65) Prior Publication Data
US 2023/0005424 A1    Jan. 5, 2023

(30) Foreign Application Priority Data
Dec. 24, 2019   (JP) .................................. 2019-233399

(51) Int. Cl.
*G09G 3/3233*    (2016.01)
*H10K 65/00*    (2023.01)
(Continued)

(52) U.S. Cl.
CPC ........... *G09G 3/3233* (2013.01); *H10K 65/00* (2023.02); *G06F 3/0412* (2013.01);
(Continued)

(58) Field of Classification Search
CPC .. H10K 59/00–95; H10K 59/12; H10K 59/60; H10K 59/40; H10K 59/65;
(Continued)

(56) References Cited

U.S. PATENT DOCUMENTS

| 8,586,905 B2 | 11/2013 | Kurokawa |
| 9,024,248 B2 | 5/2015 | Kurokawa |

(Continued)

FOREIGN PATENT DOCUMENTS

| CN | 109791937 A | 5/2019 |
| EP | 3525238 A | 8/2019 |

(Continued)

OTHER PUBLICATIONS

International Search Report (Application No. PCT/IB2020/061719), dated Mar. 23, 2021.
(Continued)

*Primary Examiner* — Sanjiv D. Patel
(74) *Attorney, Agent, or Firm* — ROBINSON INTELLECTUAL PROPERTY LAW OFFICE, P.C.; Eric J. Robinson

(57) ABSTRACT

A display apparatus capable of image capturing with high sensitivity is provided. The display apparatus is configured to include first to third switches, a first transistor, a second transistor, and a light-emitting/receiving element. The first switch is electrically connected to a gate of the first transistor. The second switch is positioned between one of a source and a drain of the first transistor and one electrode of the light-emitting/receiving element. The third switch is positioned between the one electrode of the light-emitting/receiving element and a gate of the second transistor. The other of the source and the drain of the first transistor is supplied with a first potential. The other electrode of the light-emitting/receiving element is supplied with a second
(Continued)

potential. The light-emitting/receiving element has a function of emitting light of a first color and a function of receiving light of a second color.

14 Claims, 28 Drawing Sheets

(51) Int. Cl.
*G06V 40/13* (2022.01)
*G06F 3/041* (2006.01)
*G06F 3/042* (2006.01)

(52) U.S. Cl.
CPC ........ *G06F 3/0421* (2013.01); *G06V 40/1318* (2022.01); *G09G 2300/0426* (2013.01); *G09G 2300/0852* (2013.01); *G09G 2330/021* (2013.01); *G09G 2354/00* (2013.01); *G09G 2360/14* (2013.01)

(58) Field of Classification Search
CPC .................. G06F 3/0412; G06F 3/042; G06F 3/041–047; G06F 2203/041–04114; G06V 40/1318; G09G 3/3233
See application file for complete search history.

(56) References Cited

U.S. PATENT DOCUMENTS

| | | | |
|---|---|---|---|
| 9,088,006 B2 | 7/2015 | Yamazaki et al. | |
| 9,627,648 B2 | 4/2017 | Yamazaki et al. | |
| 10,003,047 B2 | 6/2018 | Yamazaki et al. | |
| 10,381,599 B2 | 8/2019 | Yamazaki et al. | |
| 10,535,689 B2 | 1/2020 | Kurokawa | |
| 10,903,453 B2 | 1/2021 | Yamazaki et al. | |
| 10,916,573 B2 | 2/2021 | Kurokawa | |
| 11,057,551 B2 | 7/2021 | Nishide et al. | |
| 2005/0179626 A1* | 8/2005 | Yuki | G09G 3/3233 345/76 |
| 2008/0252223 A1 | 10/2008 | Toyoda et al. | |
| 2011/0198483 A1 | 8/2011 | Kurokawa | |
| 2015/0221706 A1* | 8/2015 | Udaka | H10K 39/32 257/40 |
| 2019/0222733 A1 | 7/2019 | Nishide et al. | |
| 2020/0395576 A1 | 12/2020 | Yamazaki et al. | |
| 2021/0297565 A1 | 9/2021 | Nishide et al. | |

FOREIGN PATENT DOCUMENTS

| | | |
|---|---|---|
| JP | 2002-237923 A | 8/2002 |
| JP | 2008-262176 A | 10/2008 |
| JP | 2014-197522 A | 10/2014 |
| JP | 2017-028297 A | 2/2017 |
| JP | 2018-060980 A | 4/2018 |
| WO | WO-2002/065752 | 8/2002 |
| WO | WO-2011/099336 | 8/2011 |
| WO | WO-2018/066225 | 4/2018 |

OTHER PUBLICATIONS

Written Opinion (Application No. PCT/IB2020/061719), dated Mar. 23, 2021.

\* cited by examiner

Data writing period

Holding and light-emitting period

Light exposure period

Transfer period

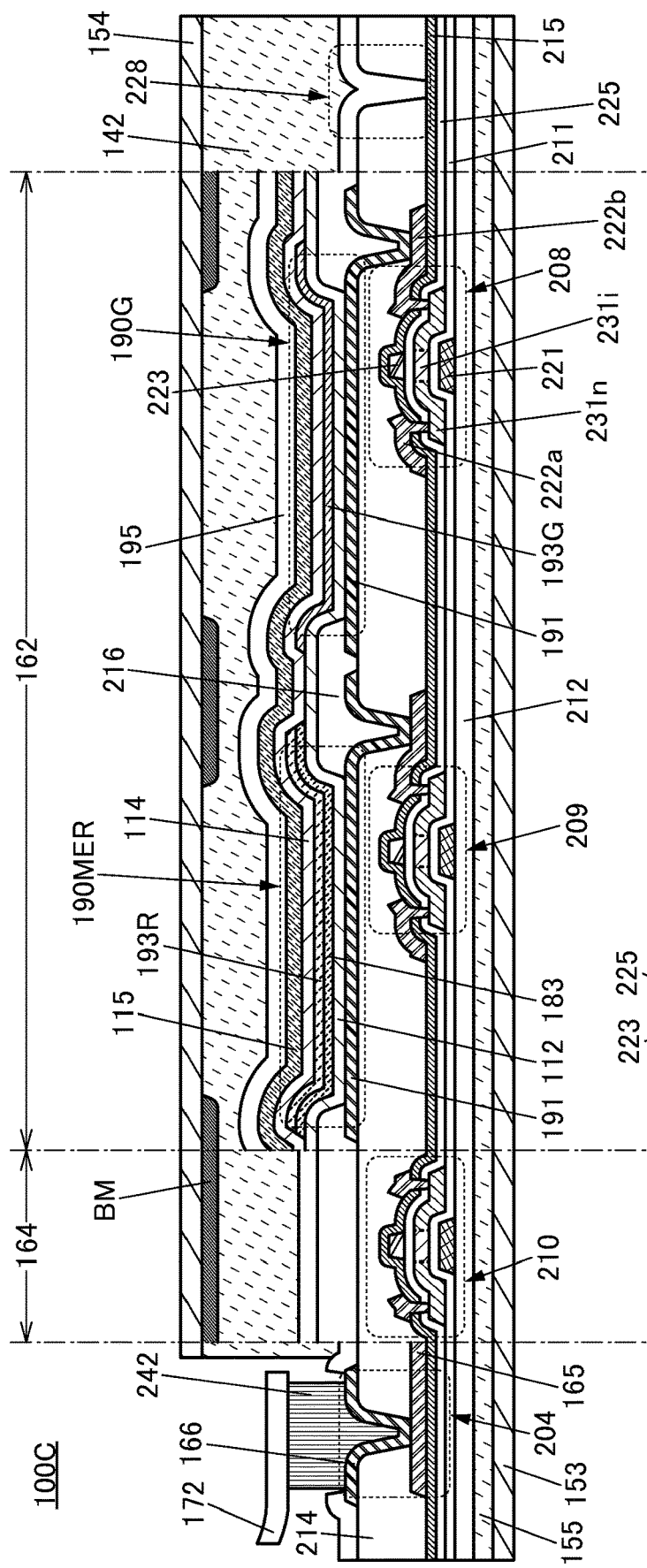
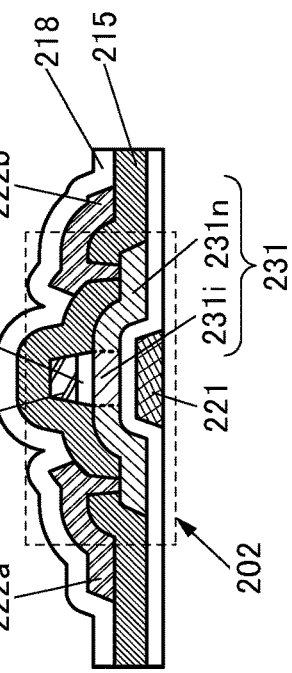
FIG. 25A
FIG. 25B

DISPLAY APPARATUS

TECHNICAL FIELD

One embodiment of the present invention relates to a display apparatus. One embodiment of the present invention relates to a display apparatus having an image capturing function.

Note that one embodiment of the present invention is not limited to the above technical field. Examples of the technical field of one embodiment of the present invention disclosed in this specification and the like include a semiconductor device, a display apparatus, a light-emitting apparatus, a power storage device, a memory device, an electronic device, a lighting device, an input device, an input/output device, a driving method thereof, and a manufacturing method thereof. A semiconductor device generally means a device that can function by utilizing semiconductor characteristics.

BACKGROUND ART

In recent years, display apparatuses have been required to have higher definition in order to display high-resolution images. In addition, display apparatuses used in information terminal devices such as smartphones, tablet terminals, and laptop PCs (personal computers) have been required to have lower power consumption as well as higher definition. Furthermore, display apparatuses have been required to have a variety of functions such as a touch panel function and a function of capturing images of fingerprints for authentication, in addition to a function of displaying images.

Light-emitting apparatuses including light-emitting elements have been developed, for example, as display apparatuses. Light-emitting elements utilizing an electroluminescence (hereinafter referred to as EL) phenomenon (also referred to as EL elements) have features such as ease of reduction in thickness and weight, high-speed response to an input signal, and driving with direct-current constant voltage, and have been used in display apparatuses. For example, Patent Document 1 discloses a flexible light-emitting apparatus including an organic EL element.

REFERENCE

Patent Document

[Patent Document 1] Japanese Published Patent Application No. 2014-197522

SUMMARY OF THE INVENTION

Problems to be Solved by the Invention

An object of one embodiment of the present invention is to provide a display apparatus having an image capturing function. An object of one embodiment of the present invention is to provide an imaging apparatus or a display apparatus capable of capturing high-resolution images. An object of one embodiment of the present invention is to provide an imaging apparatus or a display apparatus capable of image capturing with high sensitivity. An object of one embodiment of the present invention is to provide an imaging apparatus or a display apparatus that is less likely to be affected by noise. An object of one embodiment of the present invention is to provide a display apparatus capable of obtaining biological information such as fingerprints. An object of one embodiment of the present invention is to provide a display apparatus functioning as a touch panel.

An object of one embodiment of the present invention is to reduce the number of components of an electronic device. An object of one embodiment of the present invention is to provide a display apparatus, an imaging apparatus, an electronic device, or the like that has a novel configuration. An object of one embodiment of the present invention is to alleviate at least one of problems of the conventional technique.

Note that the description of these objects does not preclude the existence of other objects. One embodiment of the present invention does not have to achieve all these objects. Objects other than these can be derived from the description of the specification, the drawings, the claims, and the like.

Means for Solving the Problems

One embodiment of the present invention is a display apparatus including first to third switches, a first transistor, a second transistor, and a light-emitting/receiving element. The first switch is electrically connected to a gate of the first transistor. The second switch is positioned between one of a source and a drain of the first transistor and one electrode of the light-emitting/receiving element. The third switch is positioned between the one electrode of the light-emitting/receiving element and a gate of the second transistor. The other of the source and the drain of the first transistor is supplied with a first potential. The other electrode of the light-emitting/receiving element is supplied with a second potential. The light-emitting/receiving element has a function of emitting light of a first color and a function of receiving light of a second color.

In the above embodiment, preferably, the first switch is on and the second switch is on or off in a period during which a potential is supplied to the gate of the first transistor. Preferably, the second switch is on in a period during which the light-emitting/receiving element emits light. Preferably, the second switch is off and the third switch is off in a period during which the light-emitting/receiving element receives light. Preferably, the second switch is off and the third switch is on in a period during which electric charge is transferred from the light-emitting/receiving element to the gate of the second transistor.

Another embodiment of the present invention is a display apparatus including a pixel, a first wiring, and a second wiring. The pixel includes a first subpixel. The first subpixel includes first to seventh transistors and a light-emitting/receiving element. One of a source and a drain of the first transistor is supplied with a first potential, and the other of the source and the drain of the first transistor is electrically connected to one of a source and a drain of the fourth transistor. One of a source and a drain of the third transistor is electrically connected to the first wiring, and the other of the source and the drain of the third transistor is electrically connected to a gate of the first transistor. The other of the source and the drain of the fourth transistor is electrically connected to one electrode of the light-emitting/receiving element and one of a source and a drain of the fifth transistor. The other of the source and the drain of the fifth transistor is electrically connected to one of a source and a drain of the sixth transistor and a gate of the second transistor. One of a source and a drain of the second transistor is electrically connected to one of a source and a drain of the seventh transistor. The other of the source and the drain of the seventh transistor is electrically connected to the second wiring. The other electrode of the light-emitting/receiving element is supplied with a second potential. The light-emitting/receiving element has a function of emitting light of a first color and a function of receiving light of a second color.

In the above embodiment, the fourth transistor is preferably controlled to be turned on in a period during which the light-emitting/receiving element emits light, and to be turned off in a period during which the light-emitting/receiving element receives light and a period during which electric charge is transferred from the light-emitting/receiving element to the gate of the second transistor through the fifth transistor.

In the above embodiment, the display apparatus preferably also includes an eighth transistor, a first capacitor, and a third wiring. In that case, it is preferred that one of a source and a drain of the eighth transistor be electrically connected to the third wiring, and the other of the source and the drain of the eighth transistor be electrically connected to one electrode of the first capacitor and the other of the source and the drain of the first transistor. Preferably, the other electrode of the first capacitor is electrically connected to the gate of the first transistor.

In the above embodiment, the display apparatus preferably also includes a ninth transistor, a tenth transistor, a second capacitor, and a fourth wiring. In that case, it is preferred that one of a source and a drain of the ninth transistor be electrically connected to the fourth wiring, and the other of the source and the drain of the ninth transistor be electrically connected to one electrode of the second capacitor and one of a source and a drain of the tenth transistor. Preferably, the other electrode of the second capacitor is electrically connected to the gate of the first transistor. Preferably, the other of the source and the drain of the tenth transistor is electrically connected to the other of the source and the drain of the first transistor.

In the above embodiment, the first wiring is preferably supplied with a first data potential in a first period. Furthermore, the fourth wiring is preferably supplied with a reset potential in the first period, and supplied with second data in a second period.

In any of the above embodiments, the other of the source and the drain of the sixth transistor is preferably supplied with a third potential. In that case, it is preferred that the first potential be higher than the second potential, and the third potential be lower than the second potential.

In any of the above embodiments, the pixel preferably includes a second subpixel including a light-emitting element. In that case, the light-emitting element preferably has a function of emitting light of the second color.

In the above embodiment, the light-emitting/receiving element and the light-emitting element are preferably provided on one plane.

In the above embodiment, it is preferred that the light-emitting/receiving element include an electron-injection layer, an electron-transport layer, a light-emitting layer, an active layer, a hole-injection layer, and a hole-transport layer between a pixel electrode and a first electrode; and the light-emitting element include at least one of the first electrode, the electron-injection layer, the electron-transport layer, the hole-injection layer, and the hole-transport layer.

Another embodiment of the present invention is a display module including any of the above-described display apparatuses, and a connector or an integrated circuit.

Another embodiment of the present invention is an electronic device including the above-described display module and at least one of an antenna, a battery, a housing, a camera, a speaker, a microphone, a touch sensor, and an operation button.

Effect of the Invention

According to one embodiment of the present invention, a display apparatus having an image capturing function can be provided. According to one embodiment of the present invention, an imaging apparatus or a display apparatus capable of capturing high-resolution images can be provided. According to one embodiment of the present invention, an imaging apparatus or a display apparatus capable of image capturing with high sensitivity can be provided. According to one embodiment of the present invention, an imaging apparatus or a display apparatus that is less likely to be affected by noise can be provided. According to one embodiment of the present invention, a display apparatus capable of obtaining biological information such as fingerprints can be provided. According to one embodiment of the present invention, a display apparatus functioning as a touch panel can be provided.

According to one embodiment of the present invention, the number of components of an electronic device can be reduced. According to one embodiment of the present invention, a display apparatus, an imaging apparatus, an electronic device, or the like that has a novel configuration can be provided. According to one embodiment of the present invention, at least one of problems of the conventional technique can be alleviated.

Note that the description of these effects does not preclude the existence of other effects. One embodiment of the present invention does not have to have all of these effects. Effects other than these can be derived from the description of the specification, the drawings, the claims, and the like.

BRIEF DESCRIPTION OF THE DRAWINGS

FIG. 25A is a cross-sectional view illustrating an example of a display apparatus. FIG. 25B is a cross-sectional view illustrating an example of a transistor.

MODE FOR CARRYING OUT THE INVENTION

Figure 1:
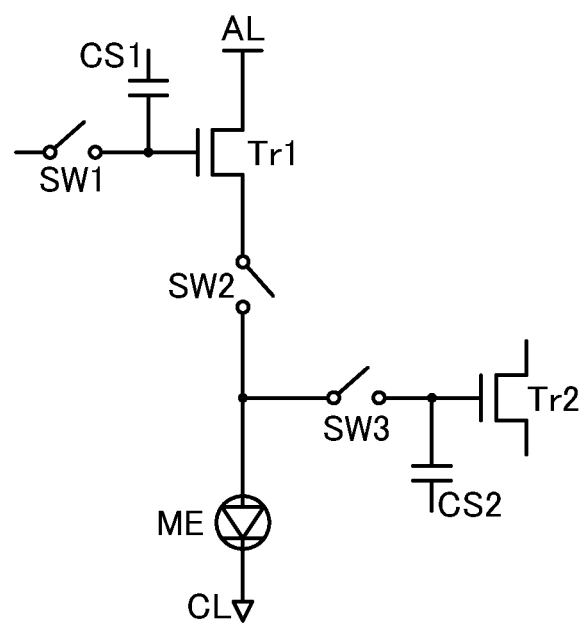
FIG. 1 shows an example of a pixel circuit.

Hereinafter, embodiments will be described with reference to the drawings. Note that the embodiments can be implemented in many different modes, and it is readily understood by those skilled in the art that modes and details thereof can be changed in various ways without departing from the spirit and scope thereof. Thus, the present invention should not be construed as being limited to the following description of the embodiments.

Note that in structures of the invention described below, the same portions or portions having similar functions are denoted by the same reference numerals in different drawings, and a description thereof is not repeated. Furthermore, the same hatch pattern is used for the portions having similar functions, and the portions are not especially denoted by reference numerals in some cases.

Note that in each drawing described in this specification, the size, the layer thickness, or the region of each component is exaggerated for clarity in some cases. Therefore, they are not limited to the illustrated scale.

Note that in this specification and the like, the ordinal numbers such as "first" and "second" are used in order to avoid confusion among components and do not limit the number.

A transistor is a kind of semiconductor elements and can achieve a function of amplifying current or voltage, switching operation for controlling conduction and non-conduction, and the like. An IGFET (Insulated Gate Field Effect Transistor) and a thin film transistor (TFT) are in the category of transistors in this specification.

Functions of a "source" and a "drain" are sometimes replaced with each other when a transistor of opposite polarity is used or when the direction of current is changed in circuit operation, for example. Therefore, the terms "source" and "drain" can be switched in this specification.

Note that in this specification, an EL layer refers to a layer containing at least a light-emitting substance (also referred to as a light-emitting layer) or a stack including a light-emitting layer, provided between a pair of electrodes of a light-emitting element.

In this specification and the like, a display panel that is one embodiment of a display apparatus has a function of displaying (outputting) an image or the like on (to) a display surface. Therefore, the display panel is one embodiment of an output device.

In this specification and the like, a substrate of a display panel to which a connector such as an FPC (Flexible Printed Circuit) or a TCP (Tape Carrier Package) is attached, or a substrate on which an IC is mounted by a COG (Chip On Glass) method or the like is referred to as a display panel module, a display module, or simply a display panel or the like in some cases.

Note that in this specification and the like, a touch panel that is one embodiment of a display apparatus has a function of displaying an image or the like on a display surface and a function of a touch sensor that senses a contact, press, approach, or the like of a sensing target such as a finger or a stylus with or to the display surface. Therefore, the touch panel is one embodiment of an input/output device.

A touch panel can be referred to as, for example, a display panel (or a display apparatus) with a touch sensor, or a display panel (or a display apparatus) having a touch sensor function. A touch panel can include a display panel and a touch sensor panel. Alternatively, a touch panel can have a function of a touch sensor in the display panel or on the surface of the display panel.

In this specification and the like, a substrate of a touch panel on which a connector, an IC, or the like is mounted is referred to as a touch panel module, a display module, or simply a touch panel or the like in some cases.

Embodiment 1

This embodiment will describe structure examples and an example of a driving method of a display apparatus of one embodiment of the present invention.

Structure Example 1

One embodiment of the present invention is a display apparatus including a plurality of pixels arranged in a matrix. Each pixel includes one or more subpixels. Each subpixel includes one or more light-emitting/receiving elements.

A light-emitting/receiving element (also referred to as a light-emitting/receiving device) is an element having a function of a light-emitting element (also referred to as a light-emitting device) that emits light of a first color, and a function of a photoelectric conversion element (also referred to as a photoelectric conversion device) that receives light of a second color. The light-emitting/receiving element can also be referred to as a multifunctional element, a multifunctional diode, a light-emitting photodiode, a bidirectional photodiode, or the like.

A plurality of subpixels each including a light-emitting/receiving element are arranged in a matrix, whereby the display apparatus can have a function of displaying images and a function of capturing images. Thus, the display apparatus can also be referred to as a complex device or a multifunctional device.

FIG. 1 illustrates part of a pixel circuit that can be used for the subpixel including a light-emitting/receiving element. The pixel circuit includes a switch SW1, a switch SW2, a switch SW3, a transistor Tr1, a transistor Tr2, and a light-emitting/receiving element ME. Moreover, the pixel circuit preferably includes a capacitor CS1 and a capacitor CS2 as capacitors for holding electric charge.

The switch SW1, the switch SW2, and the switch SW3 are each an element that has two terminals and can control electrical continuity and discontinuity between the terminals.

One of the terminals of the switch SW1 is electrically connected to a gate of the transistor Tr1 and one electrode of the capacitor CS1. One of a source and a drain of the transistor Tr1 is electrically connected to a wiring AL, and the other is electrically connected to one of the terminals of the switch SW2. The other terminal of the switch SW2 is electrically connected to one electrode of the light-emitting/receiving element ME and one of the terminals of the switch SW3. The other terminal of the switch SW3 is electrically connected to a gate of the transistor Tr2 and one electrode of the capacitor CS2. The other electrode of the light-emitting/receiving element ME is electrically connected to a wiring CL.

A constant potential is preferably supplied to the other electrode of the capacitor CS1 and the other electrode of the capacitor CS2. As the constant potential, a potential VDD, a potential VSS, a ground potential, a reference potential, a common potential, or the like can be used.

In FIG. 1, an anode of the light-emitting/receiving element ME is positioned on the switch SW2 side. In this case, a potential supplied to the wiring CL can be lower than a potential supplied to the wiring AL. Note that a cathode of the light-emitting/receiving element ME may be positioned on the switch SW2 side; in that case, the wiring CL can be supplied with a potential higher than a potential supplied to the wiring AL.

Although an example where n-channel transistors are used as the transistors is shown in FIG. 1 and the like, some or all of the transistors can be p-channel transistors. In that case, a variety of potentials, signals, or the like described below can be changed as appropriate in accordance with the change of the transistors.

The transistor Tr1 has a function of controlling a current flowing through the light-emitting/receiving element ME. The transistor Tr1 can control a current flowing through the light-emitting/receiving element ME in accordance with a potential supplied to its gate through the switch SW1. The light-emitting/receiving element ME can emit light with luminance corresponding to the current.

Electric charge (a potential) is transferred from the light-emitting/receiving element ME through the switch SW3 to a node to which the gate of the transistor Tr2 is connected. The conducting state of the transistor Tr2 is changed in accordance with the potential. The transistor Tr2 functions as a read transistor.

An example of a method for operating the circuit illustrated in FIG. 1 will be described below.

Figure 2A:
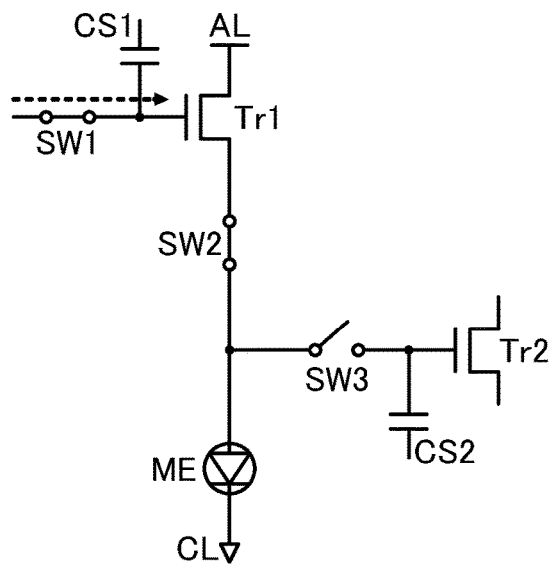
FIG. 2A to FIG. 2D are diagrams illustrating an example of a method for operating a pixel circuit.

FIG. 2A illustrates an operation in a period during which a data potential is written to the gate of the transistor Tr1 (a data writing period). In the data writing period, the switch SW1 and the switch SW2 are turned on, and the switch SW3 is turned off. Thus, the data potential is supplied to the gate of the transistor Tr1 through the switch SW1. In addition, the capacitor CS1 is charged at this time.

Figure 2B:
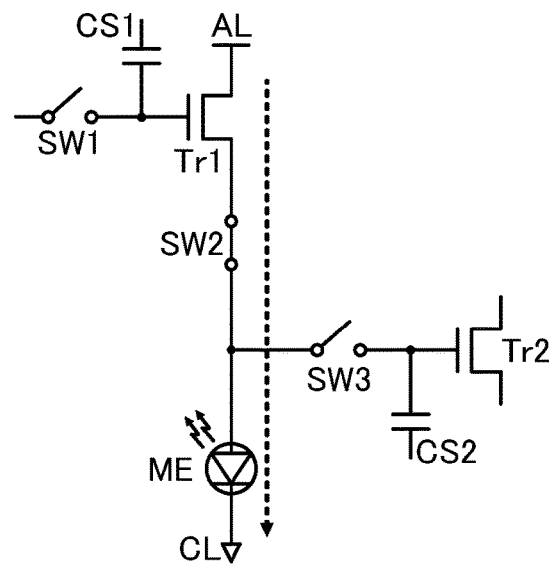

FIG. 2B illustrates an operation in a period during which the gate potential of the transistor Tr1 is held and the light-emitting/receiving element ME emits light in accordance with a current flowing through the transistor Tr1 (a holding and light-emitting period). In the holding and light-emitting period, the switch SW1 and the switch SW3 are turned off, and the switch SW2 is turned on. Thus, the current flowing through the transistor Tr1 flows into the light-emitting/receiving element ME through the switch SW2. In FIG. 2B, the path of current is indicated by a dashed arrow.

By turning off the switch SW3 in the data writing period and the holding and light-emitting period, the light-emitting/receiving element ME and the transistor Tr2 can be electrically insulated from each other.

Figure 2C:
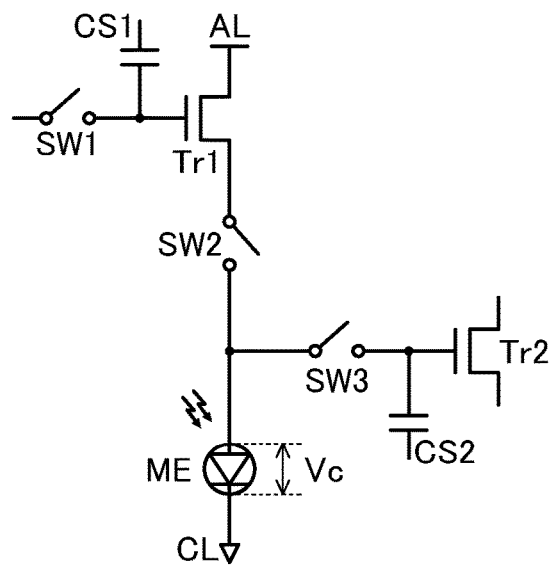

FIG. 2C illustrates an operation in a period during which the light-emitting/receiving element ME receives light and electric charge is accumulated in the light-emitting/receiving element (a light exposure period). Electric charge is accumulated at both ends of the light-emitting/receiving element ME in the light exposure period, whereby a potential difference Vc between the anode and the cathode of the light-emitting/receiving element ME is changed.

In the light exposure period, the switch SW1, the switch SW2, and the switch SW3 are all turned off. Thus, the light-emitting/receiving element ME is electrically insulated from both the transistor Tr1 and the transistor Tr2. Consequently, the electric charge accumulated on the anode side of the light-emitting/receiving element ME can be prevented from flowing toward the transistor Tr1 and the transistor Tr2. As a result, image capturing with high accuracy can be performed.

Note that in the light exposure period, the switch SW1 may be turned on. In that case, data potential writing may be performed in the light exposure period. In other words, a period during which light exposure and data writing are concurrently performed may be provided.

Figure 2D:
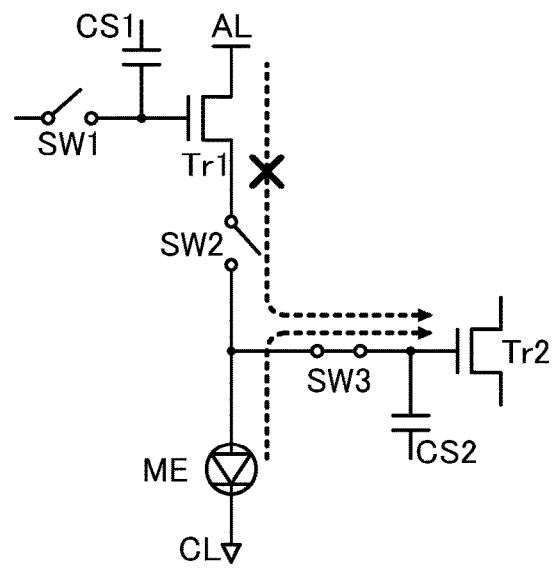

FIG. 2D illustrates an operation in a period during which the electric charge accumulated in the light-emitting/receiving element ME is transferred to the node to which the gate of the transistor Tr2 is connected (a transfer period). In the transfer period, the switch SW1 and the switch SW2 are turned off, and the switch SW3 is turned on. Thus, the electric charge accumulated in the light-emitting/receiving element ME is transferred through the switch SW3 to the node to which the gate of the transistor Tr2 is connected. By turning off the switch SW3 after transfer of the electric charge is completed, the potential of the gate of the transistor Tr2 is held.

By turning off the switch SW2 in the transfer period, the light-emitting/receiving element ME and the transistor Tr1 can be electrically insulated from each other. Thus, as illustrated in FIG. 2D, a current can be prevented from flowing from the wiring AL through the transistor Tr1, the switch SW2, and the switch SW3 to the node to which the gate of the transistor Tr2 is connected. In particular, in the case where the data potential is held at the gate of the transistor Tr1 and the transistor Tr1 is on, turning off the switch SW2 can favorably prevent electric charge from flowing from the wiring AL to the gate of the transistor Tr2.

In the light exposure period and the transfer period, the data potential is preferably held at the gate of the transistor Tr1. Thus, by switching the switch SW2 from the off state to the on state after the transfer period ends, the light-emitting/receiving element ME can be made to emit light immediately without additional data writing. Accordingly, a period during which an image is not displayed (a non-display period) is not caused in the period after the transfer period is completed until an image is displayed; hence, degradation of display quality can be prevented.

In this manner, the switch SW2 is controlled to be turned on in a period during which an image is displayed, and to be turned off in a period during which image capturing is performed (the light exposure period and the transfer period). That is, the switch SW2 can be referred to as a switch for switching between image display and image capturing. By providing the switch SW2 between the transistor Tr1 and the light-emitting/receiving element ME, the functions of the light-emitting/receiving element ME can be reliably switched.

Structure Example 2

A more specific structure example of the display apparatus of one embodiment of the present invention will be described below.

Figure 3A:
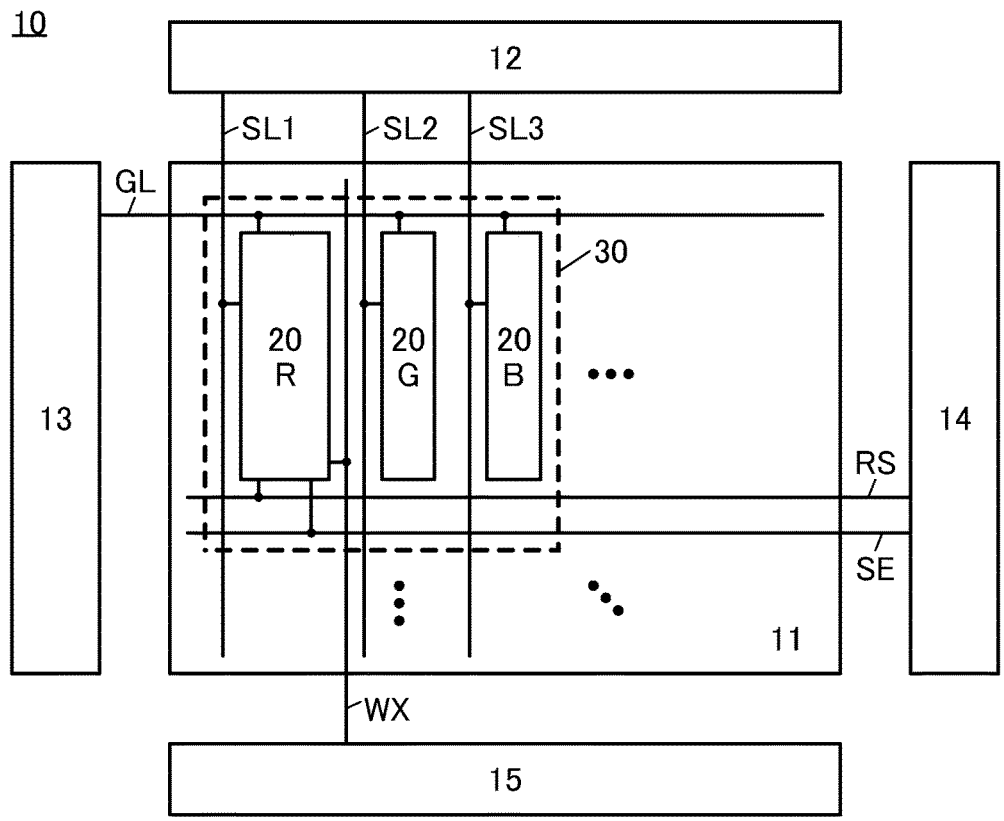
FIG. 3A is a diagram illustrating a structure example of a display apparatus.

FIG. 3A is a block diagram for illustrating a structure of a display apparatus 10. The display apparatus 10 includes a display portion 11, a driver circuit portion 12, a driver circuit portion 13, a driver circuit portion 14, a circuit portion 15, and the like.

The display portion 11 includes a plurality of pixels 30 arranged in a matrix. The pixel 30 includes a subpixel 20R, a subpixel 20G, and a subpixel 20B. The subpixel 20R includes a light-emitting/receiving element, and the subpixel 20G and the subpixel 20B each include a light-emitting element.

A wiring SL1, a wiring GL, a wiring RS, a wiring SE, a wiring WX, and the like are electrically connected to the subpixel 20R. A wiring SL2, the wiring GL, and the like are electrically connected to the subpixel 20G. A wiring SL3, the wiring GL, and the like are electrically connected to the subpixel 20B.

The wiring SL1, the wiring SL2, and the wiring SL3 are electrically connected to the driver circuit portion 12. The wiring GL is electrically connected to the driver circuit portion 13. The wiring RS and the wiring SE are electrically connected to the driver circuit portion 14. The wiring WX is electrically connected to the circuit portion 15. The driver circuit portion 12 functions as a source line driver circuit (also referred to as a source driver) and supplies a data signal (data potential) to the subpixels through the wiring SL1, the wiring SL2, and the wiring SL3. The driver circuit portion 13 functions as a gate line driver circuit (also referred to as a gate driver) and supplies a selection signal to the wiring GL.

The driver circuit portion 14 has a function of generating a signal to be supplied to the subpixel 20R and outputting the signal to the wiring SE, the wiring RS, and the like. The driver circuit portion 14 also has a function of generating and outputting a signal to be supplied to a wiring REN and a wiring TX that will be described later. Note that the driver circuit portion 13 or the driver circuit portion 12 may have a function of generating a signal to be supplied to one or both of the wiring REN and the wiring TX. The circuit portion 15 has a function of receiving a signal output from the subpixel 20R through the wiring WX and outputting the signal to the outside as imaging data. The circuit portion 15 functions as a reading circuit.

[Configuration Example of Pixel]

Figure 3B:
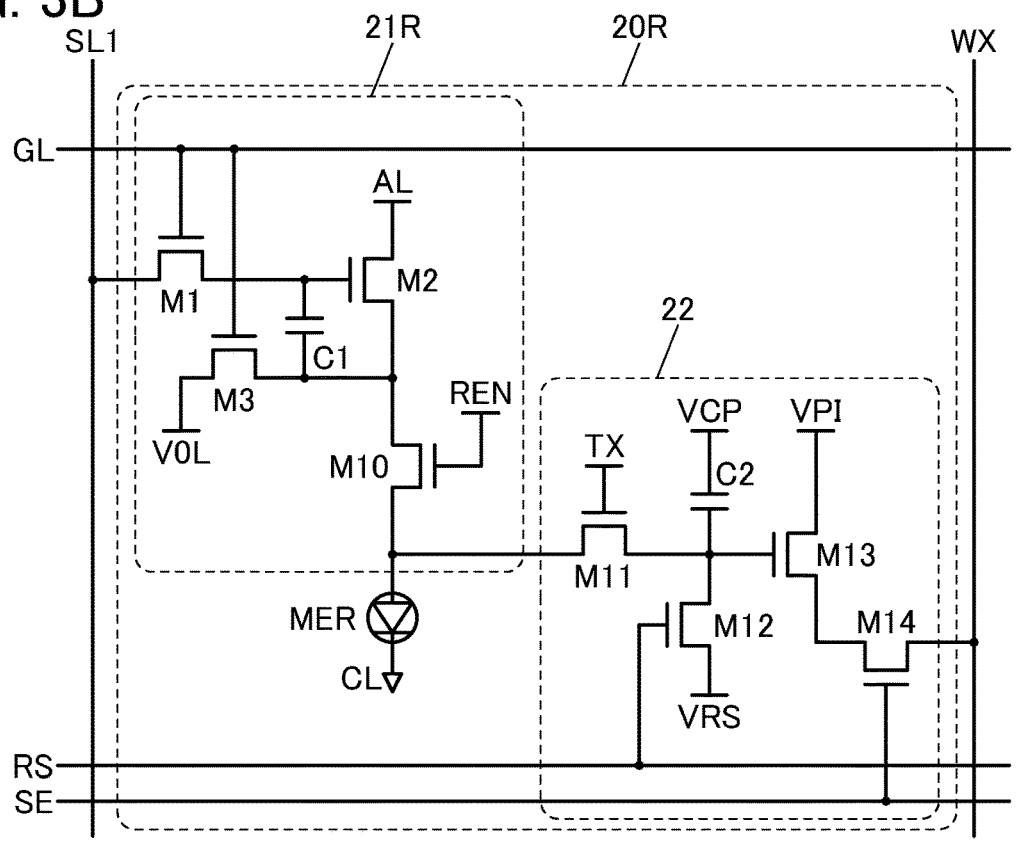
FIG. 3B is a circuit diagram illustrating an example of a subpixel.

FIG. 3B illustrates an example of a circuit diagram of the subpixel 20R. The subpixel 20R includes a circuit 21R, a circuit 22, and a light-emitting/receiving element MER. The circuit 21R includes transistors M1 to M3, a transistor M10, and a capacitor C1. The circuit 22 includes transistors M11 to M14 and a capacitor C2.

The circuit 21R functions as a circuit for controlling light emission of the light-emitting/receiving element MER when the light-emitting/receiving element MER is used as a light-emitting element. The circuit 21R has a function of controlling a current flowing through the light-emitting/receiving element MER in accordance with the value of a data potential supplied from the wiring SL1.

The circuit 22 functions as a sensor circuit for controlling the operation of the light-emitting/receiving element MER when the light-emitting/receiving element MER is used as a light-receiving element. The circuit 22 has a function of applying a reverse bias voltage to the light-emitting/receiving element MER, a function of controlling the light exposure period of the light-emitting/receiving element MER, a function of holding a potential based on electric charge transferred from the light-emitting/receiving element MER, a function of outputting a signal based on the potential to the wiring WX, and the like.

A gate of the transistor M1 is electrically connected to the wiring GL, one of a source and a drain of the transistor M1 is electrically connected to the wiring SL1, and the other thereof is electrically connected to a gate of the transistor M2 and one electrode of the capacitor C1. One of a source and a drain of the transistor M2 is electrically connected to the wiring AL, and the other thereof is electrically connected to one of a source and a drain of the transistor M10, an other of a source and a drain of the transistor M3, and the other electrode of the capacitor C1. A gate of the transistor M3 is electrically connected to the wiring GL, and one of the source and the drain of the transistor M3 is electrically connected to a wiring VOL. A gate of the transistor M10 is electrically connected to the wiring REN, and the other of the source and the drain of the transistor M10 is electrically connected to one electrode of the light-emitting/receiving element MER. The other electrode of the light-emitting/receiving element MER is electrically connected to the wiring CL.

A data potential is supplied to the wiring SL1. A constant potential is supplied to the wiring V0L. An anode potential is supplied to the wiring AL. A cathode potential is supplied to the wiring CL. In the configuration illustrated in FIG. 3B, the anode potential is higher than the cathode potential. A signal for controlling the on/off state of the transistor M10 is supplied to the wiring REN.

A gate of the transistor M11 is electrically connected to the wiring TX; one of a source and a drain of the transistor M11 is electrically connected to the one electrode of the light-emitting/receiving element MER; and the other thereof is electrically connected to a gate of the transistor M13, one of a source and a drain of the transistor M12, and one electrode of the capacitor C2. A gate of the transistor M12 is electrically connected to the wiring RS, and the other of the source and the drain of the transistor M12 is electrically connected to a wiring VRS. The other electrode of the capacitor C2 is electrically connected to a wiring VCP. One of a source and a drain of the transistor M13 is electrically connected to a wiring VPI, and the other thereof is electrically connected to one of a source and a drain of the transistor M14. A gate of the transistor M14 is electrically connected to the wiring SE, and the other of the source and the drain of the transistor M14 is electrically connected to the wiring WX.

A signal for controlling the on/off state of the transistor M11 is supplied to the wiring TX. A constant potential is supplied to the wiring VCP. A reset potential is supplied to the wiring VRS. A constant potential is supplied to the wiring VPI. In the configuration illustrated in FIG. 3B, a reset potential supplied to the wiring VRS is preferably lower than the cathode potential supplied to the wiring CL.

Here, the transistor M10 corresponds to the switch SW2 in Structure Example 1 above and FIG. 1; the transistor M2 corresponds to the transistor Tr1; the transistor M13 corresponds to the transistor Tr2; the transistor M1 corresponds to the switch SW1; and the transistor M11 corresponds to the switch SW3.

Here, transistors with an extremely low leakage current in the off state are preferably used as the transistor M1, the transistor M3, the transistor M10, the transistor M11, the transistor M12, and the transistor M14, which function as switches. In particular, transistors including an oxide semiconductor in a semiconductor layer where a channel is formed can be favorably used. It is preferable to use transistors including an oxide semiconductor also as the transistor M2 and the transistor M13, in which case all the transistors can be formed through the same manufacturing steps. Note that as for one or both of the transistor M2 and the transistor M13, silicon (including amorphous silicon, polycrystalline silicon, and single crystal silicon) may be used in a semiconductor layer where a channel is formed. Without limitation to the above, some or all of the transistors can be transistors using silicon. Alternatively, some or all of the transistors may be transistors using an inorganic semiconductor other than silicon, a compound semiconductor, an organic semiconductor, or the like.

Figure 4:
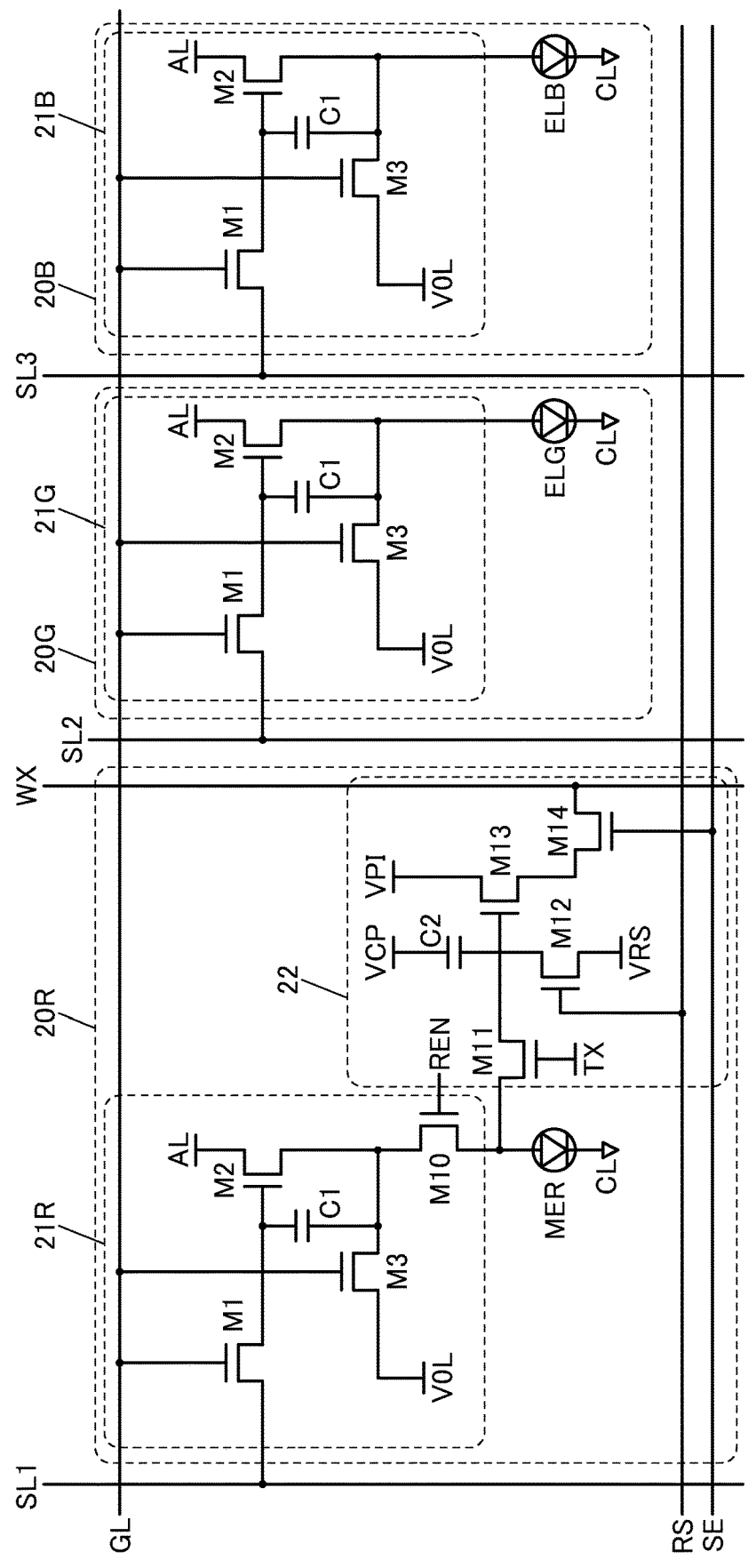
FIG. 4 is a circuit diagram illustrating an example of a pixel.

FIG. 4 illustrates an example of a circuit diagram of the pixel 30 including the subpixel 20R, the subpixel 20G, and the subpixel 20B.

The subpixel 20G includes a circuit 21G and a light-emitting element ELG. The subpixel 20B includes a circuit 21B and a light-emitting element ELB.

The circuit 21G and the circuit 21B have the same configuration as the circuit 21R included in the subpixel 20R except that the transistor M10 is not included. In the circuit 21G and the circuit 21B, the other of the source and the drain of the transistor M2 is electrically connected to one electrode of the light-emitting element ELG or the light-emitting element ELB.

For example, in the pixel 30, the light-emitting/receiving element MER is an element that emits red light and receives green or blue light, the light-emitting element ELG is an element that emits green light, and the light-emitting element ELB is an element that emits blue light. That is, the light-emitting/receiving element MER preferably functions as a photoelectric conversion element that receives light emitted from one or both of the light-emitting element ELG and the light-emitting element ELB. Thus, one or both of the light-emitting element ELG and the light-emitting element ELB can be used as a light source when an image of a fingerprint or the like is captured with the light-emitting/receiving element MER. For example, when light emitted from the light-emitting element ELG or the light-emitting element ELB is reflected by a subject such as a finger and the reflected light is sensed by the light-emitting/receiving element MER, a clear image of the subject can be captured.

Figures 5A, 5B:
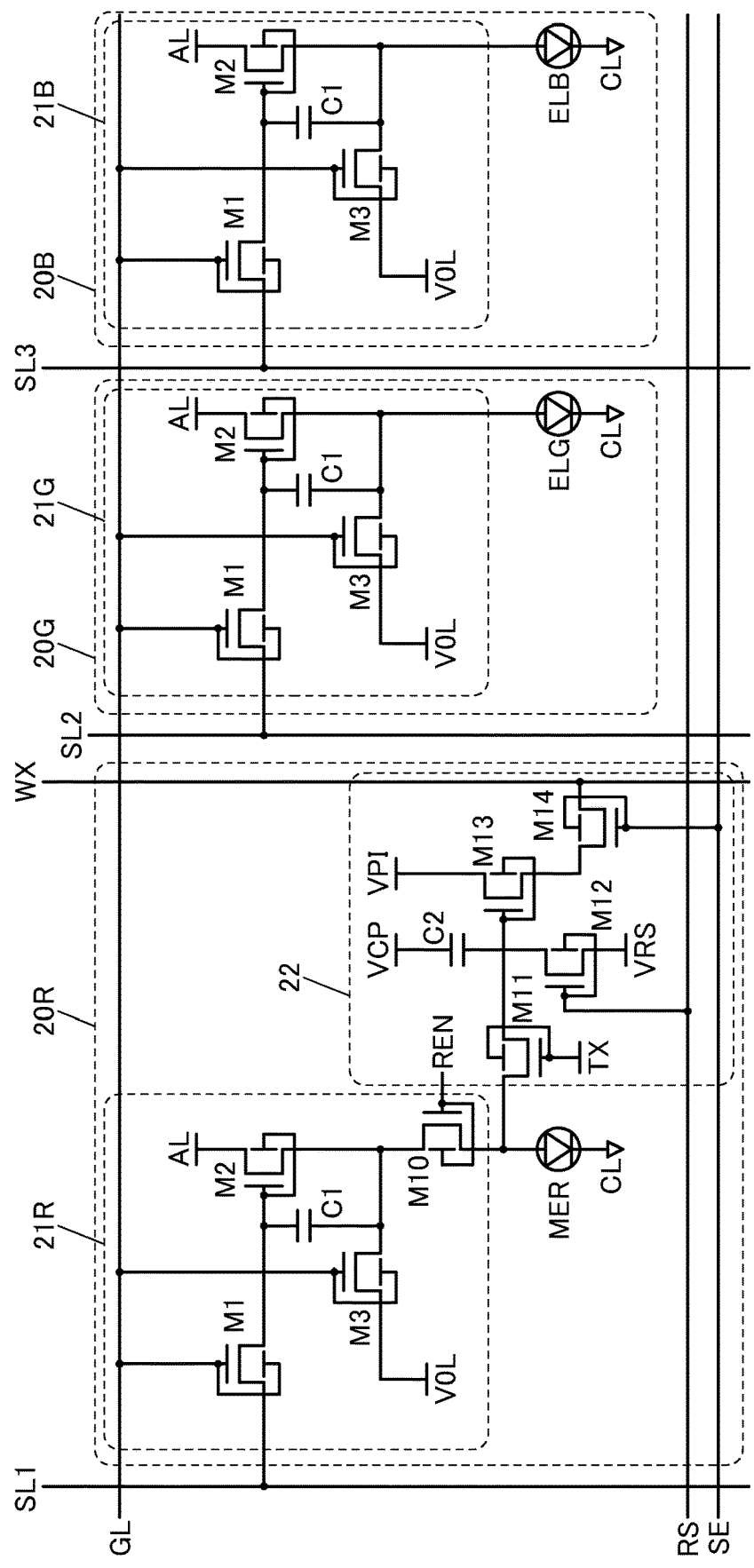
FIG. 5A is a circuit diagram illustrating an example of a pixel.
FIG. 5B shows an example of a transistor.

Here, as illustrated in FIG. 5A, each of the transistors may be a transistor having a back gate. In FIG. 5A, a pair of gates (the gate and the back gate) are electrically connected to each other.

Note that although FIG. 5A shows the structure where a pair of gates are electrically connected to each other in all the transistors, one embodiment of the present invention is not limited thereto. The pixel 30 may include a transistor having one of a pair of gates connected to another wiring. For example, when one of a pair of gates is connected to a wiring supplied with a constant potential, the stability of electrical characteristics can be improved. Alternatively, one of a pair of gates may be connected to a wiring supplied with a potential for controlling the threshold voltage of the transistor. Alternatively, a transistor in which one of a pair of gates is connected to one of a source and a drain as illustrated in FIG. 5B may be used. In this case, one of the gates is preferably connected to the source. The transistor illustrated in FIG. 5B can be favorably used as the transistor M2, the transistor M12, and the transistor M13 in the pixel 30, for example.

Although the example in which all the transistors each include a back gate is shown here, one embodiment of the present invention is not limited thereto, and a transistor that includes a back gate and a transistor that does not include a back gate may be used in combination.

Structure Example 3

A structure example of a display apparatus including a pixel having a configuration partly different from the above will be described below.

The pixel described below as an example is a pixel in which a light-emitting/receiving element and light-emitting elements can be made to emit light by using two kinds of data potentials. For example, grayscale can be corrected with one of the data potentials. A potential higher than the maximum potential that a source driver circuit for supplying the two data potentials is capable of supplying can be generated in the pixel described below. Thus, the power supply voltage of the source driver circuit can be lowered, so that the power consumption of the source driver circuit can be reduced.

Structure Example 3-1

Figure 6:
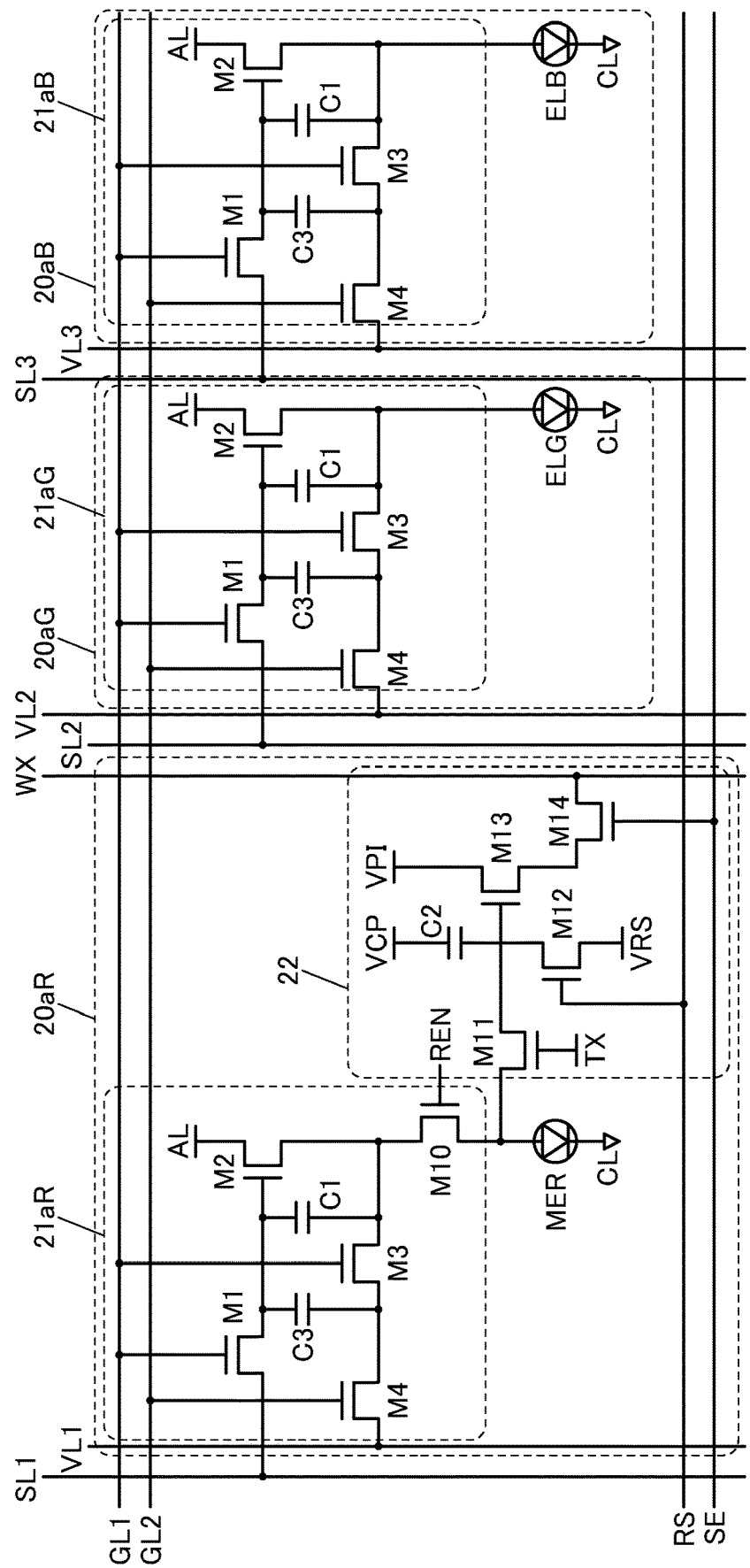
FIG. 6 is a circuit diagram illustrating an example of a pixel.

FIG. 6 is a circuit diagram of a pixel 30a. The pixel 30a includes a subpixel 20aR, a subpixel 20aG, and a subpixel 20aB. Instead of the wiring GL, a wiring GL1 and a wiring GL2 are connected to the pixel 30a. Moreover, a wiring VL1, a wiring VL2, and a wiring VL3 are connected to the pixel 30a. The wiring GL1 and the wiring GL2 are electrically connected to the driver circuit portion 13. The wiring VL1, the wiring VL2, and the wiring VL3 are electrically connected to the driver circuit portion 12.

The subpixel 20aR includes a circuit 21aR, the circuit 22, and the light-emitting/receiving element MER. The above description can be referred to for the circuit 22, which has a configuration similar to that in the subpixel 20R.

The circuit 21aR includes a transistor M4 and a capacitor C3 in addition to the above-described circuit 21R. Similarly, the circuit 21aG and the circuit 21aB each include the transistor M4 and the capacitor C3.

A gate of the transistor M4 is electrically connected to the wiring GL2, one of a source and a drain of the transistor M4 is electrically connected to the wiring VL1, and the other thereof is electrically connected to one of the source and the drain of the transistor M3 and an other electrode of the capacitor C3. One electrode of the capacitor C3 is electrically connected to the other of the source and the drain of the transistor M1, the gate of the transistor M2, and one electrode of the capacitor C1. The gates of the transistor M1 and the transistor M3 are electrically connected to the wiring GL1.

In the circuit 21aG, one of the source and the drain of the transistor M4 is electrically connected to the wiring VL2. In the circuit 21aB, one of the source and the drain of the transistor M4 is electrically connected to the wiring VL3.

Different selection signals are supplied to the wiring GL1 and the wiring GL2. A first data potential $D_R$ is supplied to the wiring SL1. A second data potential $W_R$ and a reset potential V0 are supplied to the wiring VL1 in different periods. Similarly, a first data potential $D_G$ is supplied to the wiring SL2, and a second data potential $W_G$ and the reset potential V0 are supplied to the wiring VL2. A first data potential $D_B$ is supplied to the wiring SL3, and a second data potential $W_B$ and the reset potential V0 are supplied to the wiring VL3.

An example of a data writing operation will be described using the circuit 21aR as an example. Note that the circuit 21aG and the circuit 21aB can also be driven by a similar method. For simplicity's sake, the following description will be made without consideration of the influence of the threshold voltage of each transistor, capacitance components of the transistors and the wirings, and the like.

First, the transistor M1, the transistor M3, and the transistor M4 are turned on, whereby the first data potential $D_R$ is supplied from the wiring SL1 and the reset potential V0 is supplied from the wiring VL1. Thus, the gate potential of the transistor M2 becomes the potential $D_R$, and a voltage $D_R$-V0 is stored in the capacitor C1 and the capacitor C3. Then, the transistor M1 and the transistor M3 are turned off and the transistor M4 is turned on, whereby the second data potential $W_R$ is supplied from the wiring VL1. At this time, the node to which the gate of the transistor M2 is connected is in a floating state; hence, the potential of the gate of the transistor M2 changes as the potential of the other electrode of the capacitor C3 changes from the potential V0 to the potential $W_R$. For example, when the potential $W_R$ is higher than the potential V0, the potential of the gate of the transistor M2 increases.

In the above manner, the circuit 21aR can generate the potential of the gate of the transistor M2 with the use of two data potentials. Similarly, the circuit 21aG and the circuit 21aB can generate the gate potential of the transistor M2 with the use of two data potentials.

When the first data potential $D_R$ and the reset potential V0 are supplied in the same period, the gate-source voltage of the transistor M2 can be determined regardless of the electrical characteristics of the light-emitting/receiving element or the light-emitting element. Thus, high-quality display is possible.

Figure 7:
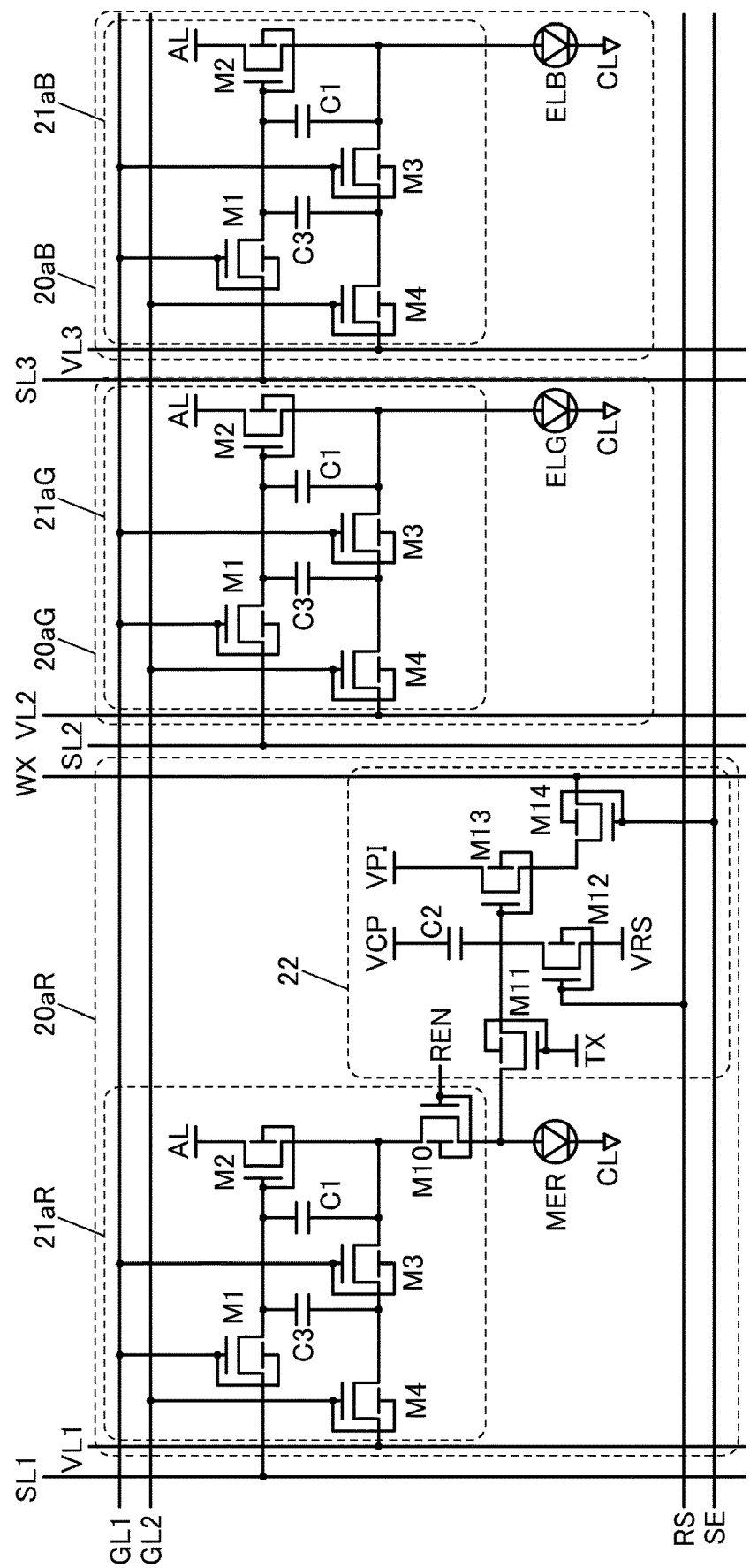
FIG. 7 is a circuit diagram illustrating an example of a pixel.

Here, as illustrated in FIG. 7, each of the transistors may be a transistor having a back gate. In FIG. 7, a pair of gates are electrically connected to each other. Alternatively, the transistor illustrated in FIG. 5B may be used as the transistor M2 or the like in the pixel 30a.

Although the example in which all the transistors each include a back gate is shown here, one embodiment of the present invention is not limited thereto, and a transistor that includes a back gate and a transistor that does not include a back gate may be used in combination.

Structure Example 3-2

The example where one pixel includes three subpixels is described above; an example where one pixel includes two subpixels will be described below.

Figure 8A:
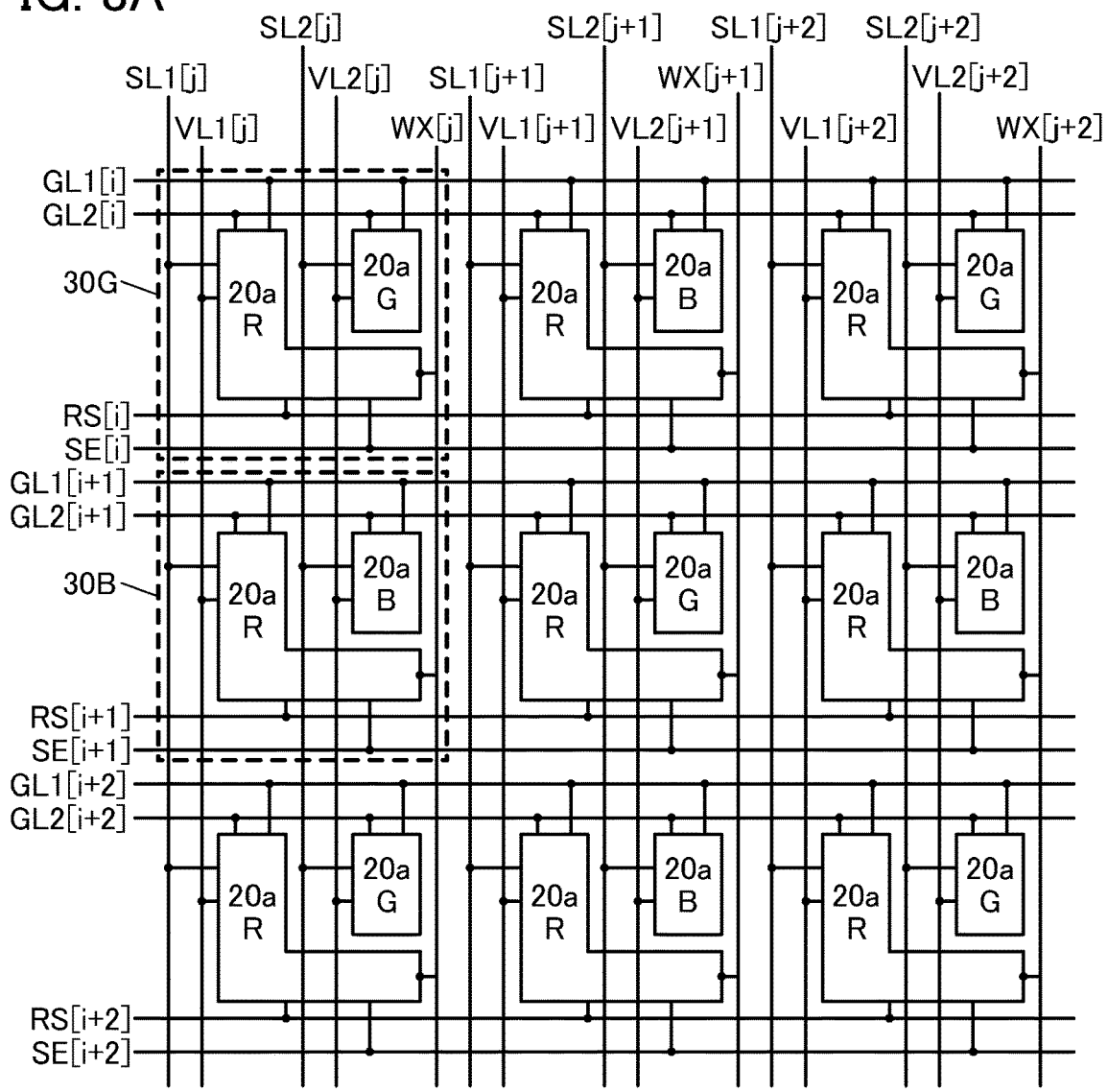
FIG. 8A is a circuit diagram illustrating an example of a method for arranging pixels.

FIG. 8A illustrates an example of method for arranging 3×3 pixels. FIG. 8A illustrates pixels in an i-th row and a j-th column (i and j are each independently an integer greater than or equal to 1) to an (i+2)th row and a (j+2)th column.

In FIG. 8A, the pixels 30G and the pixels 30B are alternately arranged in the row direction and the column direction. The pixel 30G includes the subpixel 20aR and the subpixel 20aG. The pixel 30B includes the subpixel 20aR and the subpixel 20aB.

For example, to the pixel 30G positioned in the i-th row and the j-th column, a wiring GL1[i], a wiring GL2[i], a wiring RS[i], and a wiring SE[i] that extend in the row direction and a wiring SL1[j], a wiring SL2[j], a wiring VL1[j], a wiring VL2[j], and a wiring WX[j] that extend in the column direction are connected.

Note that the subpixel 20R, the subpixel 20G, and the subpixel 20B shown in Structure example 2 above can alternatively be used instead of the subpixel 20aR, the subpixel 20aG, and the subpixel 20aB. In that case, the wiring GL2, the wiring VL1, the wiring VL2, and the like are omitted.

Figure 8B:
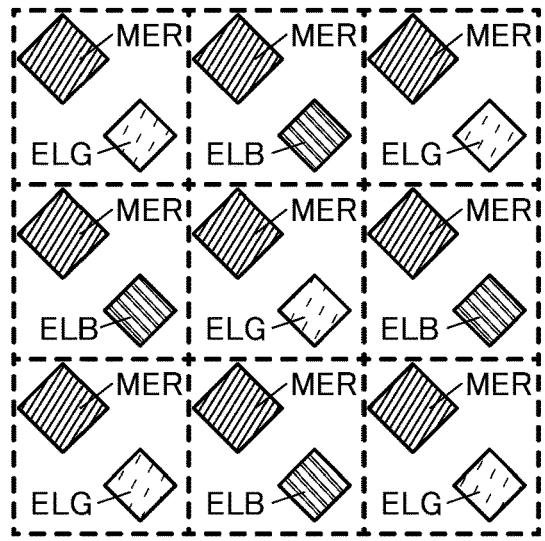
FIG. 8B is a diagram illustrating an example of a method for arranging light-emitting elements and light-emitting/receiving elements.

FIG. 8B illustrates an example of a method for arranging the light-emitting/receiving elements MER, the light-emitting elements ELG, and the light-emitting elements ELB. The light-emitting/receiving elements MER are arranged at regular intervals in the row direction and the column direction. The light-emitting elements ELG and the light-emitting elements ELB are alternately arranged in the row direction and the column direction. The light-emitting/receiving element MER, the light-emitting element ELG, and the light-emitting element ELB have a shape such that a square is tilted at approximately 45 degrees with respect to the arrangement direction. This can increase the distance between adjacent elements; hence, when the light-emitting elements and the light-emitting/receiving elements are separately formed, they can be formed with high yield.

Figure 9:
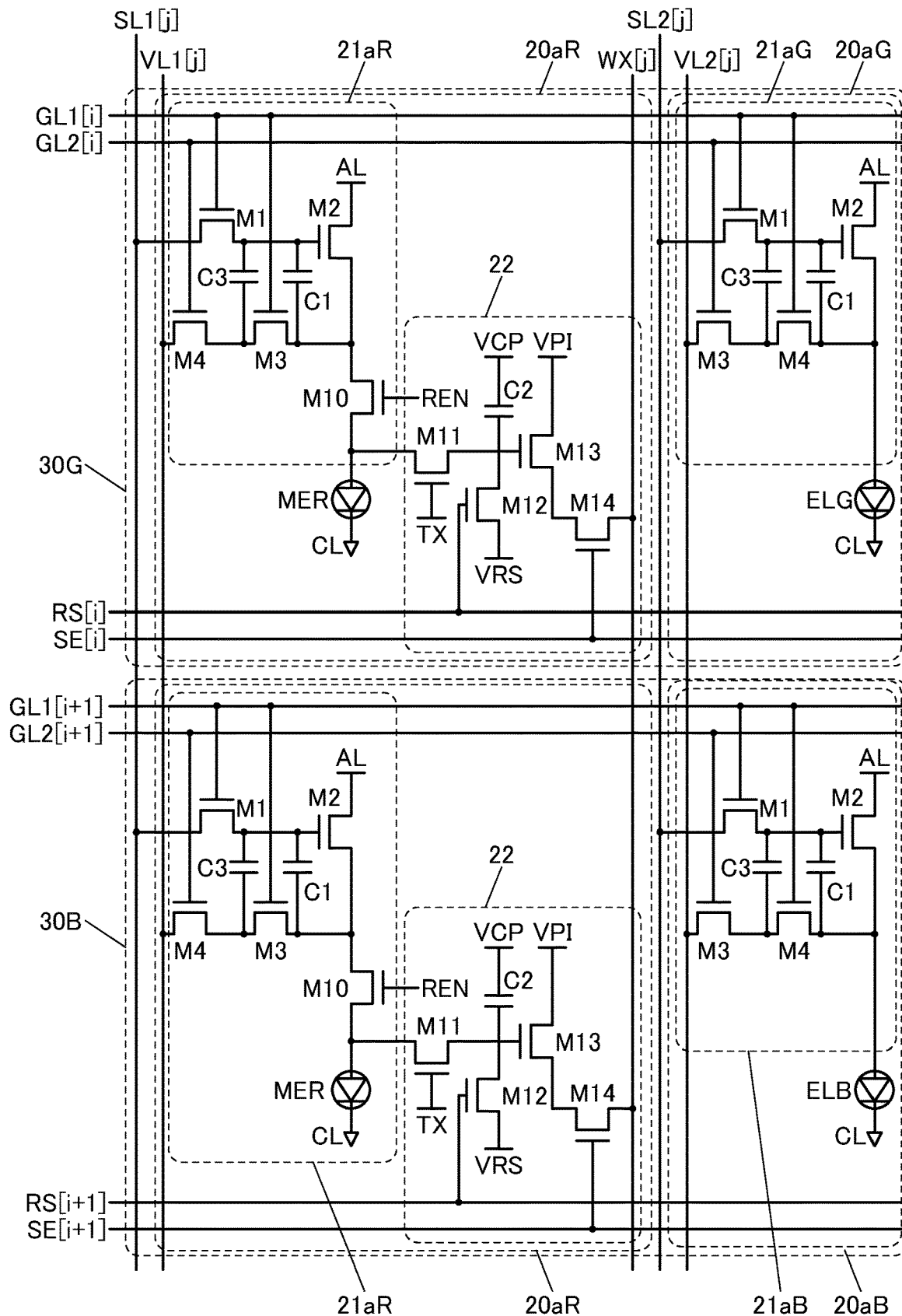
FIG. 9 is a circuit diagram illustrating an example of pixels.

FIG. 9 illustrates an example of a circuit diagram of the pixel 30G in the i-th row and the j-th column and the pixel 30B in the (i+1)th row and the j-th column. Structure example 3-1 above can be referred to for the configurations of the subpixel 20aR, the subpixel 20aG, and the subpixel 20aB.

[Driving Method Example]

An example of a method for driving the display apparatus will be described below. Here, the description will be made using the structure shown in Structure example 3-2 above, in which one pixel includes two subpixels, as an example.

In the following description, the display apparatus includes a display portion in which a plurality of pixels are arranged in a matrix of M rows and N columns (M and N are each independently an integer greater than or equal to 2).

Figure 10:
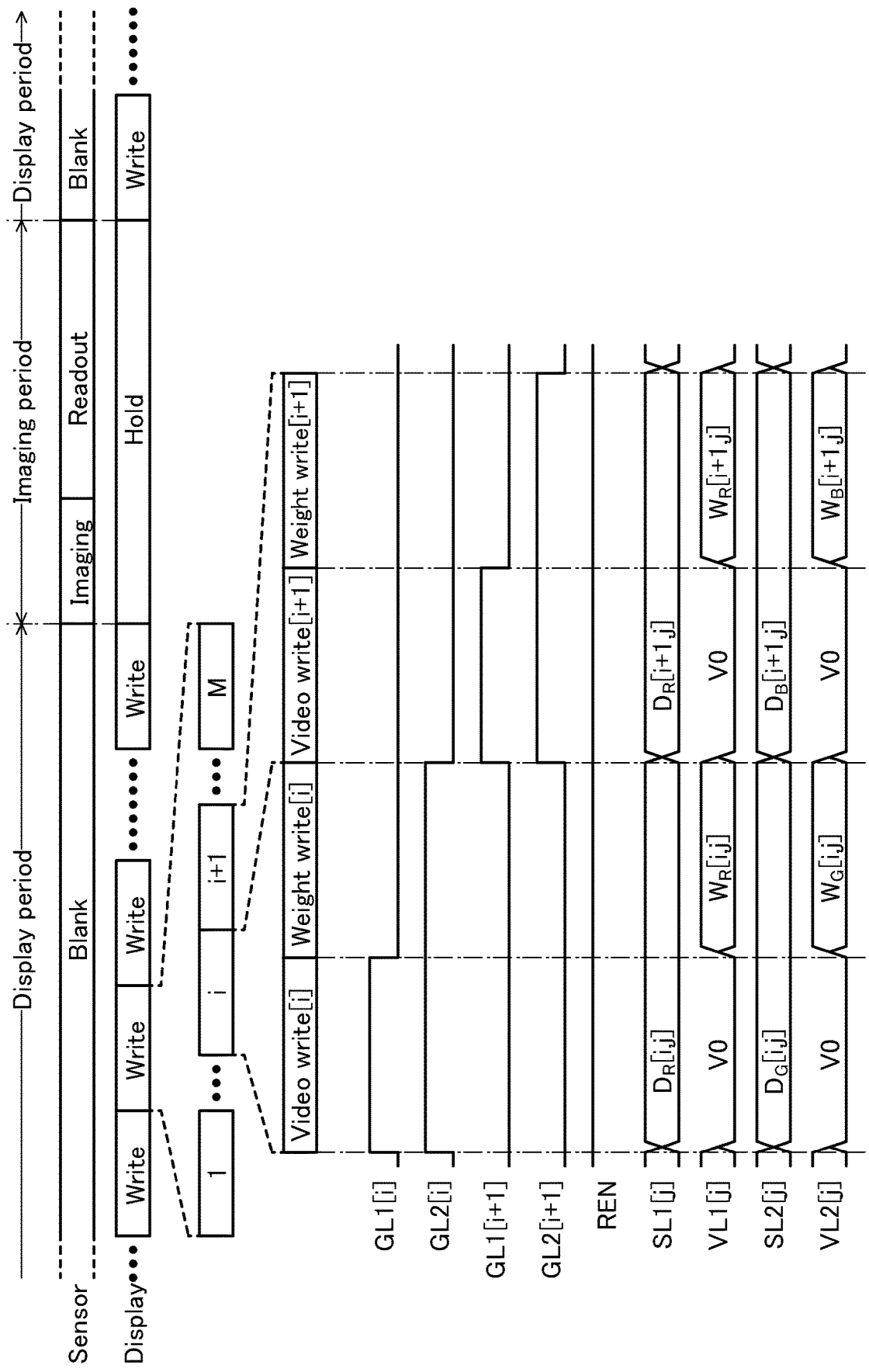
FIG. 10 is a diagram illustrating an example of a method for operating a display apparatus.
Figure 11:
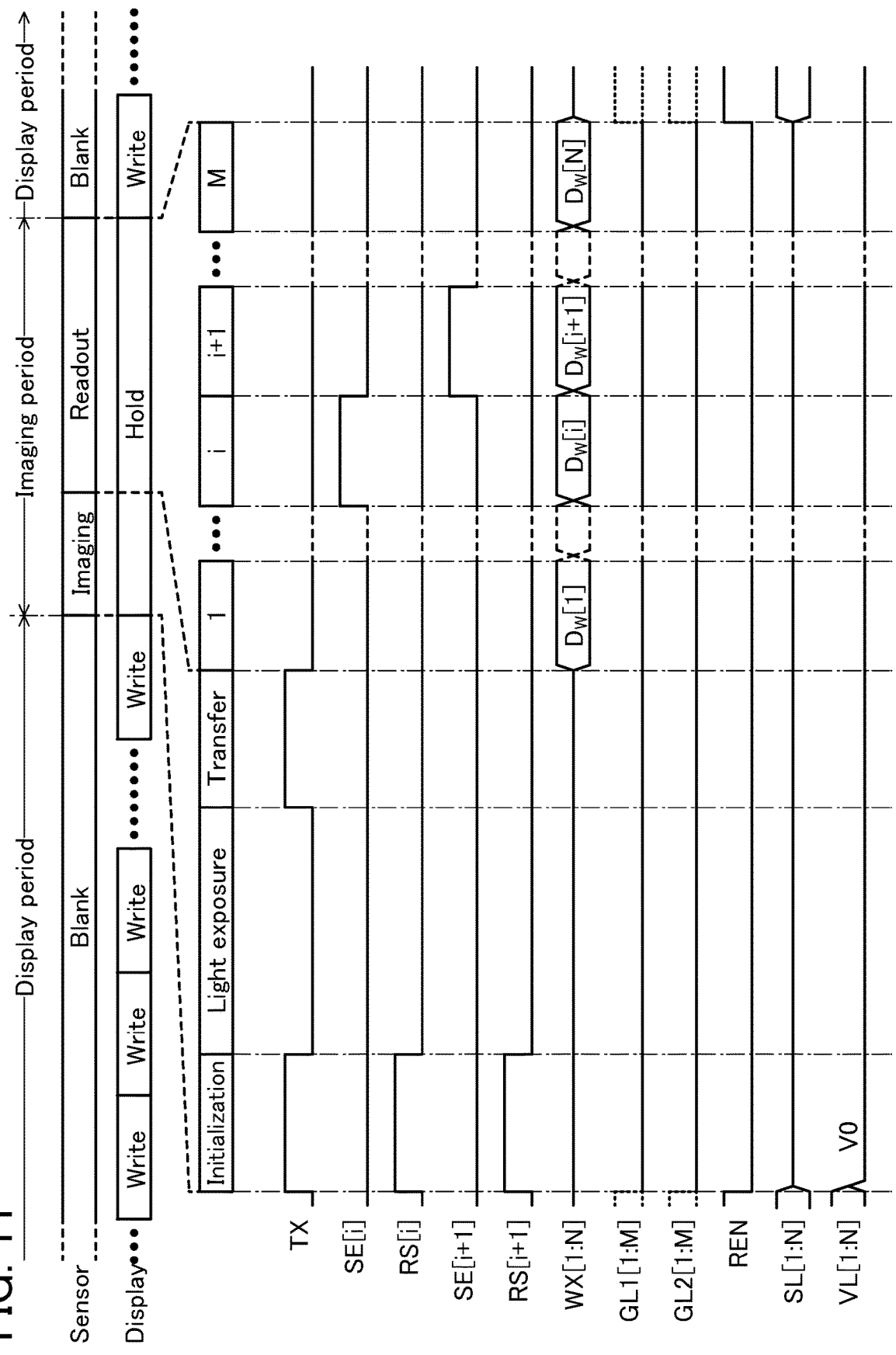
FIG. 11 is a diagram illustrating an example of a method for operating a display apparatus.

FIG. 10 and FIG. 11 schematically show the operation of the display apparatus. The operation of the display apparatus is roughly divided into a period during which an image is displayed using the light-emitting elements and the light-emitting/receiving elements (a display period) and a period during which imaging is performed using the light-emitting/receiving elements (also referred to as sensors) (an imaging period). The display period is a period during which image data is written to pixels and display based on the image data is performed. The imaging period is a period during which image capturing with the light-emitting/receiving elements is performed and imaging data is read out.

First, the operation in the display period is described with reference to FIG. 10.

In the display period, an operation of writing data to pixels is performed repeatedly. In the period, no sensor operation is performed (denoted as "blank"). Alternatively, an imaging operation can be performed in the display period.

Image data for one frame is written by one writing operation. As shown in FIG. 10, data is written to pixels sequentially from the first column to the M-th column by one writing operation (denoted as "write").

FIG. 10 shows a timing chart for the operation of writing data in the i-th row and the (i+1)th row. Here, changes in the potentials of the wiring GL1[i], the wiring GL2[i], a wiring GL1[i+1], a wiring GL2[i+1], the wiring REN, the wiring SL1[j], the wiring VL1[j], the wiring SL2[j], and the wiring VL2[j] are shown. FIG. 9 can be referred to for connection relations between the wirings and the pixels.

A period of writing data to one row is divided into two periods. Specifically, there are a period during which the first data potential $D_R$ and the like are written (denoted as "video write") and a period during which the second data potential $W_R$ and the like are written (denoted as "weight write").

In the video writing (video write[i]) period in the i-th row, the wiring GL1[i], the wiring GL2[i], and the wiring REN are set to a high-level potential. A first data potential $D_R[i,j]$ is supplied to the wiring SL1[j], and a first data potential $D_G[i,j]$ is supplied to the wiring SL2[j]. The reset potential V0 is supplied to the wiring VL1[j] and the wiring VL2[j]. Thus, the first data potential $D_R[i,j]$ is written to the subpixel 20aR in the pixel 30G in the i-th row and the j-th column, and the first data potential $D_G[i,j]$ is written to the subpixel 20aG.

Then, in the weight write[i] period, the potential of the wiring GL1[i] becomes a low-level potential. A second data potential $W_R[i,j]$ is supplied to the wiring VL1[j], and a second data potential $W_G[i,j]$ is supplied to the wiring VL2[j]. Thus, a potential generated from the first data potential $D_R[i,j]$ and the second data potential $W_R[i,j]$ is written to the subpixel 20aR[i,j] in the pixel 30G in the i-th row and the j-th column. Similarly, a potential generated from the first data potential $D_G[i,j]$ and the second data potential $W_G[i,j]$ is written to the subpixel 20aG[i,j].

Thus, the operation of writing data in the i-th row is completed.

Next, the operation of writing data in the (i+1)th row is performed. Also in the (i+1)th row, by performing an operation similar to that in the i-th row, a potential generated from a first data potential $D_R[i+1,j]$ and a second data potential $W_R[i+1,j]$ is written to the subpixel 20aR[i+1,j] in the pixel 30B in the (i+1)th row and the j-th column. Similarly, a potential generated from a first data potential $D_G[i+1,j]$ and a second data potential $W_G[i+1,j]$ is written to the subpixel 20aB[i+1,j].

By thus providing the two periods, a video writing period and a weight writing period, two kinds of data can be written to each subpixel. Hence, grayscale correction, luminance correction, or the like can be performed. In addition, display with two kinds of images superimposed on each other can be easily performed.

Next, the operation in the imaging period is described with reference to FIG. 11. The case of performing an imaging operation in a global shutter mode is described here. Note that without limitation to a global shutter mode, a driving method with a rolling shutter mode can also be employed.

The imaging period is divided into a period during which imaging is performed simultaneously in the pixels (this period is denoted as "imaging" and hereinafter also referred to as an imaging operation period to be distinguished from the imaging period) and a period during which imaging data is read out sequentially row by row (denoted as "readout").

The imaging operation period is divided into an initialization period, a light exposure period, and a transfer period. In the reading period, imaging data is read out from one row at a time from the first row to the M-th row.

FIG. 11 shows a timing chart in the imaging operation period and the reading period. Here, changes in the potentials of the wiring TX, the wiring SE[i], the wiring RS[i], a wiring SE[i+1], a wiring RS[i+1], wirings WX[1:N], wirings GL1[1:M], wirings GL2[1:M], the wiring REN, wirings SL[1:N], and wirings VL[1:N] are shown. Here, the wirings WX from the first column to the N-th column are collectively expressed as the wirings WX[1:N]. Similarly, the wirings GL1 are collectively expressed as the wirings GL1[1:M], and the wirings GL2 are collectively expressed as the wirings GL2[1:M]. The wirings SL1, the wirings SL2, and the like are collectively expressed as the wirings SL[1:N]; the wirings VL1, the wirings VL2, and the like are collectively expressed as the wirings VL[1:N].

In the initialization period, the wiring REN is set to a low-level potential. Thus, the transistor M10 is turned off in all the pixels.

By setting the wiring TX, the wiring RS[i], and the wiring RS[i+1] to a high-level potential, a predetermined potential is supplied from the wiring VRS to one of the light-emitting/receiving element MER and a node to which the gate of the transistor M13 is connected. Thus, the operation of resetting all the pixels is performed.

Then, in the light exposure period, the wiring TX, the wiring RS[i], and the wiring RS[i+1] are set to a low-level potential. Thus, electric charge is accumulated in the light-emitting/receiving element MER.

Next, in the transfer period, the wiring TX is set to a high-level potential. Thus, the electric charge accumulated in the light-emitting/receiving element MER can be transferred to the node to which the gate of the transistor M13 is connected. After that, setting the wiring TX to a low-level potential brings about a state where the potential of the node is held.

Then, imaging data is read out row by row. In the reading period, a high-level potential is sequentially supplied to a wiring SE[1] to a wiring SE[N], whereby data can be read out from all the pixels. For example, for reading in the i-th row, by setting the wiring SE[i] to a high-level potential, data $D_W[i]$ in the i-th row is output to the wirings WX[1:N]. Specifically, data $D_W[i,j]$ in the i-th row and the j-th column is output to one wiring WX[j].

Here, in the imaging period, a low-level potential is always supplied to the wiring REN. Accordingly, the light-emitting/receiving element MER and the transistor M2 are electrically insulated from each other particularly in the light exposure period and the transfer period. Consequently, noise is reduced, and imaging with high accuracy can be performed.

In the imaging period, each pixel is preferably set in a state of holding image data that is most recently written (denoted as "hold"). Thus, when the imaging period ends and the potential of the wiring REN changes from a low-level potential to a high-level potential, an image corresponding to the held image data can be displayed immediately. When image data written to the subpixel 20aG or the subpixel 20aB is held in the imaging period, crosstalk noise affecting the anode of the light-emitting/receiving element MER in the subpixel 20aR can be reduced.

The above is the description of the driving method example.

[Configuration Example of Driver Circuit]

A circuit that can be used in a source driver will be described below. Specifically, the description will be made on a circuit that can be favorably used in a source driver of the display apparatus that is shown in Structure example 3 above and includes pixels to which two kinds of data potentials are input.

Figure 12:
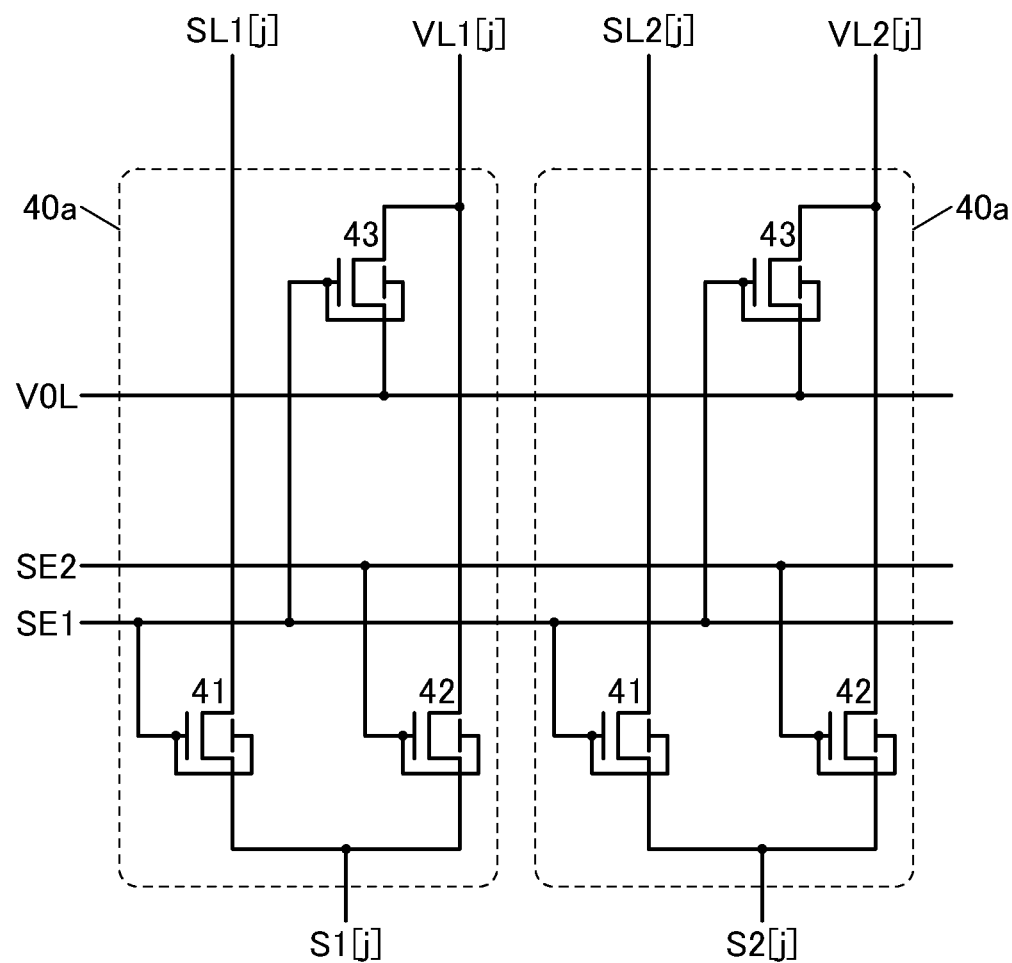
FIG. 12 is a circuit diagram illustrating an example of a driver circuit.

FIG. 12 is a circuit diagram of a circuit 40. The circuit 40 includes a plurality of circuits 40a. The circuit 40a is a circuit functioning as what is called a demultiplexer, which distributes one input signal to a plurality of wirings. The circuit 40 can include circuits 40a as many as the subpixels arranged in the column direction. FIG. 12 illustrates two circuits 40a as an example.

The circuit 40a includes a transistor 41, a transistor 42, and a transistor 43. The wiring V0L, a wiring SE1, and a wiring SE2 are connected to the circuit 40a. In addition, to the circuit 40a, a wiring S1[j] is connected as an input wiring, and the wiring SL1[j] and the wiring VL1[j] are connected as output wirings. Note that FIG. 12 also shows the neighboring circuit 40a to which a wiring S2[j], the wiring SL2[j], and the wiring VL2[j] are connected.

A gate of the transistor 41 is electrically connected to the wiring SE1, one of a source and a drain of the transistor 41 is electrically connected to the wiring S1[j], and the other thereof is electrically connected to the wiring SL1[j]. A gate of the transistor 42 is electrically connected to the wiring SE2, one of a source and a drain of the transistor 42 is electrically connected to the wiring S1[j], and the other thereof is electrically connected to the wiring VL1[j]. A gate of the transistor 43 is electrically connected to the wiring SE1, one of a source and a drain of the transistor 43 is electrically connected to the wiring V0L, and the other thereof is electrically connected to the wiring VL1[j].

The wiring SE1 and the wiring SE2 are supplied with signals that have a high-level potential in different periods. The wiring V0L is supplied with the reset potential V0.

When the wiring SE1 is at a high-level potential and the wiring SE2 is at a low-level potential, the transistor 41 is turned on, and a data potential (first data potential) input from the wiring S1[j] is output to the wiring SL1[j]. The transistor 42 is turned off and the transistor 43 is turned on, whereby the reset potential V0 is output from the wiring V0L to the wiring VL1[j].

When the wiring SE1 is at a low-level potential and the wiring SE2 is at a high-level potential, the transistor 42 is turned on and the transistor 43 is turned off; thus, a data potential (second data potential) input from the wiring S1[j] is output to the wiring VL1[j]. The transistor 41 is turned off, so that the wiring SL1[j] is brought into an electrically floating state.

The circuit 40a can alternately select the wiring SL1[j] and the wiring VL1[j] and output signals from the wiring S1[j] in a time-division manner. Furthermore, the circuit 40a can alternately output the second data potential and the reset potential to the wiring VL1[j].

Here, a structure may be employed in which the wiring SL1[j] in a non-selected state is supplied with the reset potential V0, like the wiring VL1[j]. The wiring SL1 [j] in a non-selected state is set in an electrically floating state, whereby the most recent potential is held. Accordingly, when the wiring SL1[j] is brought into a selected state next time and a data potential is supplied from the wiring S1[j], the time taken for charging and discharging the wiring SL1 [j] can be shortened as compared to the case where the potential of the wiring SL1 [j] is the reset potential (a low-level potential). Consequently, images can be displayed at a high frame frequency.

Using the circuit 40 in the source driver enables the number of signal lines to be reduced; hence, the structure of the display apparatus can be simplified.

[Configuration Example of Reading Circuit]

An example of a circuit that can be used as a reading circuit will be described below. The circuit shown below can be used in the circuit portion 15 illustrated in FIG. 3A, for example.

Figure 13A:
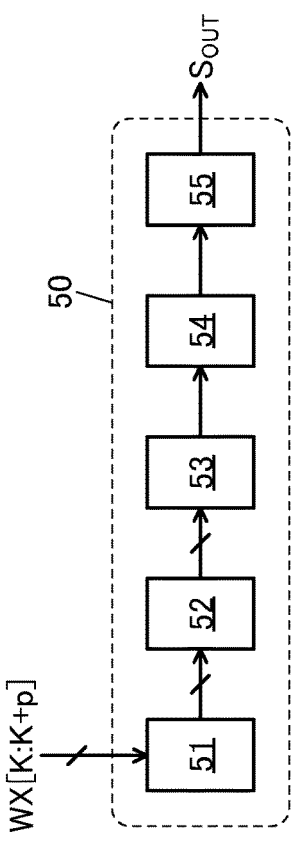
FIG. 13A is a block diagram illustrating an example of a reading circuit.

FIG. 13A is a block diagram of a circuit 50. The circuit 50 includes a plurality of circuits 51, a plurality of circuits 52, a circuit 53, a circuit 54, and a circuit 55.

Signals from K-th to (K+p)th wirings WX[K:K+p] (K is an integer greater than or equal to 1 and less than or equal to N) are input to the circuit 50. Signals from wirings WX as many as the number obtained by dividing the number (N) of pixels arranged in the row direction by a given integer x can be input to one circuit 50. That is, p is an integer satisfying N/x−1, and signals from N lx wirings WX are input to the circuit 50. In this case, the display apparatus can include x circuits 50 as reading circuits. Note that when N is not a multiple of x, the number of signals from wirings WX input to one circuit 50 can be adjusted as appropriate.

The circuit 51 is a circuit that converts a current output to one of the wirings WX into a voltage and outputs the voltage. As the circuit 51, a circuit that configures a source follower circuit with the transistor M13 in the above-described pixel can be used.

As the circuit 52, a correlated double sampling (CDS) circuit can be favorably used. The circuit 52 can generate a signal with less noise.

As the circuit 53, a multiplexer circuit can be used. The circuit 53 can convert parallel signals input from the plurality of circuits 52 into a serial signal and output the serial signal to the circuit 54.

As the circuit 54, a source follower circuit can be used. The circuit 54 has a function of amplifying a signal input from the circuit 53 and outputting the amplified signal.

As the circuit 55, an analog-to-digital converter circuit can be used. The circuit 55 has a function of converting an analog signal input from the circuit 54 into a signal $S_{OUT}$ that is a digital signal and outputting the signal $S_{OUT}$.

Figure 13B:
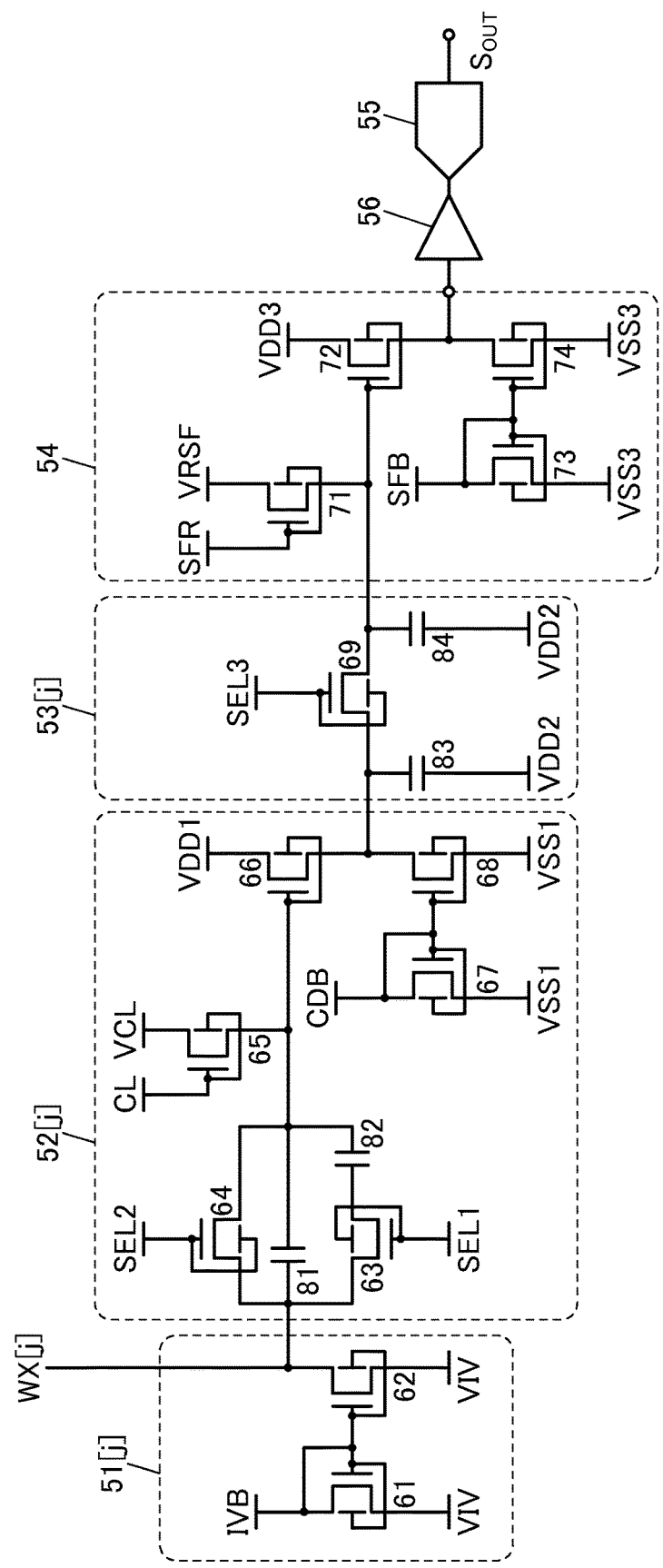
FIG. 13B is a circuit diagram thereof.

FIG. 13B illustrates an example of a more specific circuit diagram of the circuit 50. FIG. 13B illustrates a circuit 51[j] and a circuit 52[j] that are connected to the j-th wiring WX[j], part of the circuit 53, the circuit 54, the circuit 55, and a circuit 56. As for the circuit 53, some components connected to the circuit 52[j] are shown as a circuit 53[j]. The circuit 53 includes a plurality of circuits 53 [j].

The circuit 51[j] includes a transistor 61 and a transistor 62. A wiring IVB and a wiring VIV each of which is supplied with a constant potential are connected to the circuit 51[j]. The transistor 62 and the transistor M13 included in the pixel form a source follower circuit. The transistor 61 functions as a constant current source. The transistor 61 and the transistor 62 form a current mirror.

The circuit 52[j] includes a transistor 63 to a transistor 68, a capacitor 81, and a capacitor 82. A wiring SEL1, a wiring SEL2, and a wiring CL each of which is supplied with a signal for controlling the conducting state of the transistor, and a wiring VCL, a wiring CDB, a wiring VDD1, and a wiring VSS1 each of which is supplied with a constant potential are connected to the circuit 52[j].

The transistor 66 and the transistor 68 form a source follower circuit. The transistor 67 functions as a constant current source and forms a current mirror with the transistor 68. The capacitor 81 is provided between a gate of the transistor 66 and an output wiring of the circuit 51[j]. A signal supplied from the circuit 51[I] to the circuit 52[j] is transmitted to the gate of the transistor 66 through the capacitor 81.

The transistor 65 has a function of supplying an initial potential to a node to which the gate of the transistor 66 is connected. First, the potential of the wiring WX[j] is obtained in a state where the initial potential is supplied from the wiring VCL to the node to which the gate of the transistor 66 is connected. After that, the transistor 65 is turned off and the transistor M12 included in the pixel is turned on, and the potential of the wiring WX[j] is obtained. Thus, a potential corresponding to a difference from the initial potential can be read out as imaging data. With such a correlated double sampling operation, a signal with less noise can be output from the circuit 50.

The transistor 63 has a function of adjusting the capacitance of the CDS circuit. By turning on the transistor 63, the capacitor 81 and the capacitor 82 are connected in parallel. Thus, the sensitivity of the CDS circuit can be increased. On the other hand, by turning off the transistor 63, the speed of the reading operation can be increased. For example, when an image of an object with a low contrast or luminance is captured, the sensitivity can be increased by turning on the transistor 63 to increase the capacitance of the CDS circuit. Meanwhile, when high-speed reading is required, the capacitance of the CDS circuit can be decreased by turning off the transistor 63. The on/off state of the transistor 63 can be switched by a signal supplied to the wiring SEL1.

The transistor 64 has a function of establishing electrical continuity between the wiring WX[j] and the node to which the gate of the transistor 66 is connected. By turning on the transistor 64, a reading operation without using correlated double sampling can be performed. The on/off state of the transistor 64 can be switched by a signal supplied to the wiring SEL2.

The circuit 53[j] includes a transistor 69, a capacitor 83, and a capacitor 84. A wiring SEL3 supplied with a signal for controlling the conducting state of the transistor and a wiring VDD2 supplied with a constant potential are connected to the circuit 53[j]. The capacitor 83 and the capacitor 84 have a function of holding the potential of the wiring. One or both of the capacitor 83 and the capacitor 84 may be omitted when not needed.

To select the circuit 53[j] from the circuit 53, the transistor 69 is turned on. Thus, a signal output from the circuit 52[j] can be output to the circuit 54 through the transistor 69. By sequentially selecting a plurality of transistors 69 included in the circuit 53, parallel signals input from the plurality of circuits 52 can be converted into a serial signal to be output to the circuit 54.

The circuit 54 includes a transistor 71 to a transistor 74. A wiring SFR supplied with a signal for controlling the conducting state of the transistor and a wiring VRSF, a wiring SFB, a wiring VDD3, and a wiring VSS3 each of which is supplied with a constant potential are connected to the circuit 54.

The transistor 72 and the transistor 74 form a source follower circuit. The transistor 73 functions as a constant current source and forms a current mirror with the transistor 74.

The transistor 71 has a function of resetting the potential of a node to which a gate of the transistor 72 is connected, with the use of a potential supplied to the wiring VRSF.

As illustrated in FIG. 13B, the circuit 56 functioning as an amplifier circuit may be provided between the circuit 54 and the circuit 55. The circuit 56 has a function of amplifying a signal input from the circuit 54 and outputting the amplified signal to the circuit 55.

An example in which n-channel transistors are used as all the transistors included in the circuit 51, the circuit 52, the circuit 53, and the circuit 54 is shown here. In this case, each of the transistors is preferably a transistor using an oxide semiconductor in a semiconductor layer where a channel is formed. Transistors with an extremely low off-state current are preferably used particularly as the transistor 63, the transistor 64, the transistor 65, the transistor 69, the transistor 71, and the like, which function as switches. Note that without limitation to the above, some or all of the transistors may be transistors using silicon. Alternatively, some or all of the transistors may be p-channel transistors.

FIG. 13B illustrates an example in which all the transistors included in the circuit 51, the circuit 52, the circuit 53, and the circuit 54 are transistors each having a pair of gates electrically connected to each other. Note that without limitation thereto, some or all of the transistors may be transistors each having a single gate. Alternatively, some or all of the transistors may be transistors in each of which one of the gates is electrically connected to one of a source and a drain. Alternatively, some or all of the transistors may be transistors in each of which one of the gates is supplied with a constant potential or a signal for controlling the threshold voltage.

The circuit 51, the circuit 52, the circuit 53, and the circuit 54 are preferably formed over a substrate where pixels are provided, through the same process as the pixels. This allows the number of components of the display apparatus to be reduced, resulting in lower costs. An IC chip may be used as one or both of the circuit 56 and the circuit 55, and one or both of the circuit 56 and the circuit 55 may be formed over the substrate where the pixels are provided.

The above is the description of the configuration example of the reading circuit.

At least part of the configuration examples, the drawings corresponding thereto, and the like exemplified in this embodiment can be implemented in combination with the other configuration examples, the other drawings, and the like as appropriate.

At least part of this embodiment can be implemented in combination with the other embodiments described in this specification as appropriate.

Embodiment 2

In this embodiment, display apparatuses of embodiments of the present invention will be described with reference to FIG. 14 to FIG. 25.

The display apparatus of one embodiment of the present invention includes a light-emitting element and a light-emitting/receiving element.

The light-emitting/receiving element can be manufactured by combining an organic EL element and an organic photodiode, which are respectively a light-emitting element and a light-receiving element. For example, by adding an active layer of an organic photodiode to a layered structure of an organic EL element, the light-emitting/receiving element can be manufactured. Furthermore, in the light-emitting/receiving element formed of a combination of an organic EL element and an organic photodiode, forming layers common to the organic EL element in the same steps can inhibit an increase in the number of deposition steps.

For example, one of a pair of electrodes (a common electrode) can be a layer shared by the light-emitting/receiving element and the light-emitting element. For example, at least one of a hole-injection layer, a hole-transport layer, an electron-transport layer, and an electron-injection layer is preferably a layer shared by the light-emitting/receiving element and the light-emitting element. As another example, the light-emitting/receiving element and the light-emitting element can have the same structure except for the presence or absence of an active layer of the light-receiving element. That is, the light-emitting/receiving element can be manufactured by only adding the active layer of the light-receiving element to the light-emitting element. When the light-emitting/receiving element and the light-emitting element include common layers in such a manner, the number of deposition steps and the number of masks can be reduced, thereby reducing the number of manufacturing steps and the manufacturing cost of the display apparatus. Furthermore, the display apparatus including the light-emitting/receiving element can be manufactured using an existing manufacturing apparatus and an existing manufacturing method for the display apparatus.

Note that a layer included in the light-emitting/receiving element may have a different function between the case where the light-emitting/receiving element function as a light-receiving element and the case where the light-emitting/receiving element function as a light-emitting element. In this specification, the name of a component is based on its function in the case where the light-emitting/receiving element functions as a light-emitting element. For example, a hole-injection layer functions as a hole-injection layer in the case where the light-emitting/receiving element functions as a light-emitting element, and functions as a hole-transport layer in the case where the light-emitting/receiving element functions as a light-receiving element. Similarly, an electron-injection layer functions as an electron-injection layer in the case where the light-emitting/receiving element functions as a light-emitting element, and functions as an electron-transport layer in the case where the light-emitting/receiving element function as a light-receiving element.

As described above, the display apparatus of this embodiment includes light-emitting/receiving elements and light-emitting elements in its display portion. Specifically, light-emitting/receiving elements and light-emitting elements are arranged in a matrix in the display portion. Accordingly, the display portion has one or both of an image capturing function and a sensing function in addition to a function of displaying an image.

The display portion can be used as an image sensor, a touch sensor, or the like. That is, by sensing light with the display portion, an image can be captured or an approach or touch of an object (e.g., a finger or a stylus) can be detected. Furthermore, in the display apparatus of this embodiment, the light-emitting elements can be used as a light source for the sensor. Accordingly, a light-receiving portion and a light source do not need to be provided separately from the display apparatus; hence, the number of components of an electronic device can be reduced.

In the display apparatus of this embodiment, when an object reflects light emitted from the light-emitting element included in the display portion, the light-emitting/receiving element can sense the reflected light; thus, image capturing or touch (contact or approach) detection is possible even in a dark place.

The display apparatus of this embodiment has a function of displaying images with the use of the light-emitting elements and the light-emitting/receiving elements. That is, the light-emitting elements and the light-emitting/receiving elements function as display elements.

As the light-emitting element, an EL element such as an OLED (Organic Light Emitting Diode) or a QLED (Quantum-dot Light Emitting Diode) is preferably used. Examples of a light-emitting substance contained in the EL element include a substance exhibiting fluorescence (a fluorescent material), a substance exhibiting phosphorescence (a phosphorescent material), an inorganic compound (such as a quantum dot material), and a substance exhibiting thermally activated delayed fluorescence (a thermally activated delayed fluorescence (TADF) material). Alternatively, an LED such as a micro-LED (Light Emitting Diode) can be used as the light-emitting element.

The display apparatus of this embodiment has a function of detecting light with the use of the light-emitting/receiving elements. The light-emitting/receiving element can sense light having a shorter wavelength than light emitted by the light-emitting/receiving element itself.

When the light-emitting/receiving element is used as an image sensor, the display apparatus of this embodiment can capture an image using the light-emitting/receiving element. For example, the display apparatus of this embodiment can be used as a scanner.

For example, data on a fingerprint, a palm print, or the like can be obtained with the use of the image sensor. That is, a biological authentication sensor can be incorporated in the display apparatus of this embodiment. When the display apparatus incorporates a biological authentication sensor, the number of components of an electronic device can be reduced as compared to the case where a biological authentication sensor is provided separately from the display apparatus; thus, the size and weight of the electronic device can be reduced.

Data on facial expression, eye movement, change of the pupil diameter, or the like of a user can be obtained with the use of the image sensor. By analysis of the data, information on the user's physical and mental state can be obtained. Changing the output contents of one or both of display and sound on the basis of the information allows the user to safely use a device for VR (Virtual Reality), a device for AR (Augmented Reality), or a device for MR (Mixed Reality), for example.

When the light-emitting/receiving element is used as a touch sensor, the display apparatus of this embodiment can detect the approach or contact of an object with the use of the light-emitting/receiving element.

The light-emitting/receiving element functions as a photoelectric conversion element that detects light entering the light-emitting/receiving element and generates electric charge. The amount of generated electric charge depends on the amount of incident light.

The light-emitting/receiving element can be manufactured by adding an active layer of the light-receiving element to the above-described structure of the light-emitting element.

For the light-emitting/receiving element, an active layer of a pn photodiode or a pin photodiode can be used, for example.

It is particularly preferable to use, for the light-emitting/receiving element, an active layer of an organic photodiode including a layer containing an organic compound. An organic photodiode, which is easily made thin, lightweight, and large in area and has a high degree of freedom for shape and design, can be used in a variety of display apparatuses.

FIG. 14A to FIG. 14D are cross-sectional views of display apparatuses of embodiments of the present invention.

Figure 14A:
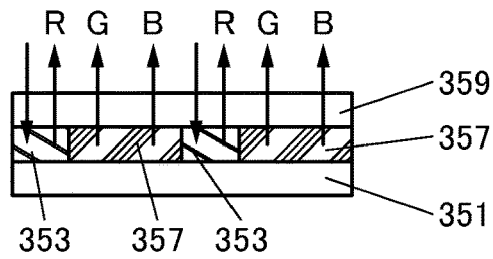
FIG. 14A to FIG. 14D are cross-sectional views illustrating examples of display apparatuses.

A display apparatus 350A illustrated in FIG. 14A includes, between a substrate 351 and a substrate 359, a layer 353 including a light-emitting/receiving element and a layer 357 including light-emitting elements.

Figure 14B:
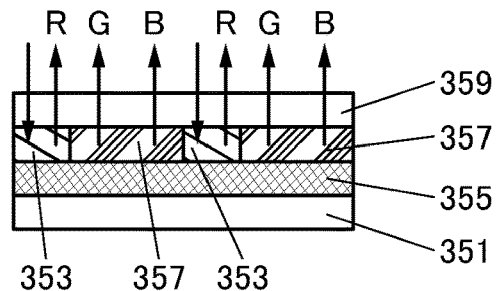

A display apparatus 350B illustrated in FIG. 14B includes, between the substrate 351 and the substrate 359, the layer 353 including a light-emitting/receiving element, a layer 355 including transistors, and the layer 357 including light-emitting elements.

In the display apparatus 350A and the display apparatus 350B, green (G) light and blue (B) light are emitted from the layer 357 including light-emitting elements, and red (R) light is emitted from the layer 353 including a light-emitting/receiving element. In the display apparatus of one embodiment of the present invention, the color of light emitted from the layer 353 including a light-emitting/receiving element is not limited to red.

The light-emitting/receiving element included in the layer 353 including the light-emitting/receiving element can detect light that enters from the outside of the display apparatus 350A or the display apparatus 350B. The light-emitting/receiving element can detect one or both of green (G) light and blue (B) light, for example.

The display apparatus of one embodiment of the present invention includes a plurality of pixels arranged in a matrix. One pixel includes one or more subpixels. One subpixel includes one light-emitting/receiving element or one light-emitting element. For example, the pixel can have a structure including three subpixels (e.g., three colors of R, G, and B or three colors of yellow (Y), cyan (C), and magenta (M)) or four subpixels (e.g., four colors of R, G, B, and white (W) or four colors of R, G, B, and Y). The subpixel of at least one color includes a light-emitting/receiving element. The light-emitting/receiving element may be provided in all the pixels or may be provided in some of the pixels. In addition, one pixel may include a plurality of light-emitting/receiving elements.

The layer 355 including transistors includes a transistor electrically connected to the light-emitting/receiving element and a transistor electrically connected to the light-emitting element, for example. The layer 355 including transistors may also include a wiring, an electrode, a terminal, a capacitor, a resistor, or the like.

Figure 14C:
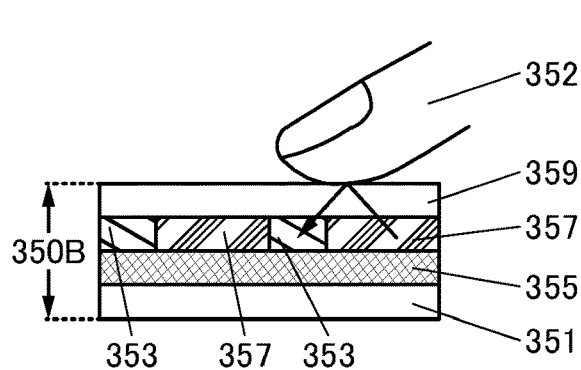
Figure 14D:
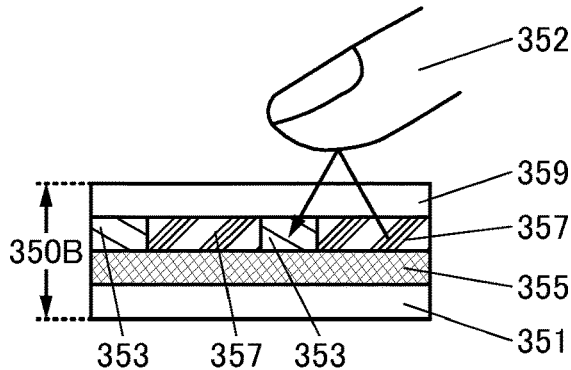

The display apparatus of one embodiment of the present invention may have a function of detecting an object such as a finger that is touching the display apparatus (FIG. 14C). Alternatively, the display apparatus of one embodiment of the present invention may have a function of detecting an object that is approaching (but is not touching) the display apparatus (FIG. 14D). For example, light emitted from the light-emitting element in the layer 357 including light-emitting elements is reflected by a finger 352 that touches or approaches the display apparatus 350B as illustrated in FIG. 14C and FIG. 14D; then, the light-emitting/receiving element in the layer 353 including the light-emitting/receiving element senses the reflected light. Thus, the touch or approach of the finger 352 on/to the display apparatus 350B can be detected.

[Pixel]

FIG. 14E to FIG. 14G and FIG. 15A to FIG. 15D illustrate examples of pixels. Note that the arrangement of subpixels is not limited to the illustrated order. For example, the positions of a subpixel (B) and a subpixel (G) may be reversed.

Figure 14E:
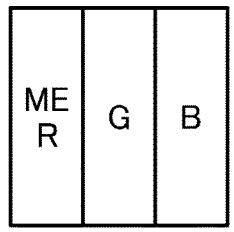
FIG. 14E to FIG. 14G are top views illustrating examples of pixels.

A pixel illustrated in FIG. 14E employs stripe arrangement and includes a subpixel (MER) that emits red light and has a light-receiving function, a subpixel (G) that emits green light, and a subpixel (B) that emits blue light. By using a light-emitting/receiving element instated of a light-emitting element in the R subpixel, a display apparatus including a pixel composed of three subpixels of RGB can have a light-receiving function in the pixel.

Figure 14F:
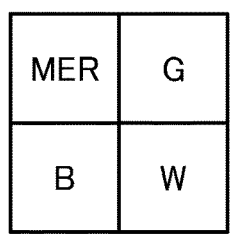

A pixel illustrated in FIG. 14F employs matrix arrangement and includes the subpixel (MER) that emits red light and has a light-receiving function, the subpixel (G) that emits green light, the subpixel (B) that emits blue light, and a subpixel (W) that emits white light. By using a light-emitting/receiving element instead of a light-emitting element in the R subpixel, a display apparatus including a pixel composed of four subpixels of RGBW can also have a light-receiving function in the pixel.

Figure 14G:
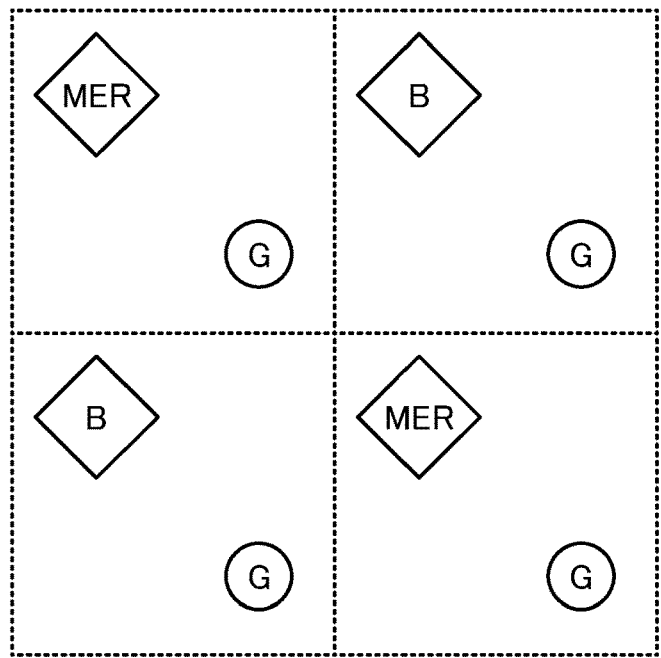

Pixels illustrated in FIG. 14G employ PenTile arrangement and each include subpixels emitting light of two colors that differ among the pixels. The upper left pixel and the lower right pixel in FIG. 14G each include the subpixel (MER) that emits red light and has a light-receiving function and the subpixel (G) that emits green light. The lower left pixel and the upper right pixel in FIG. 14G each include the subpixel (G) that emits green light and the subpixel (B) that emits blue light. Note that the shape of the subpixels illustrated in FIG. 14G indicates a top surface shape of the light-emitting element or the light-emitting/receiving element included in the subpixels.

Figure 15A:
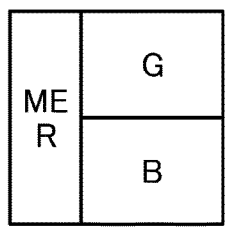
FIG. 15A to FIG. 15D are top views illustrating examples of pixels.

A pixel illustrated in FIG. 15A includes the subpixel (MER) that emits red light and has a light-receiving function, the subpixel (G) that emits green light, and the subpixel (B) that emits blue light. The subpixel (MER) is provided in a column different from a column where the subpixel (G) and the subpixel (B) are positioned. The subpixel (G) and the subpixel (B) are alternately arranged in the same column; one is provided in an odd-numbered row and the other is provided in an even-numbered row. Note that the color of the subpixel positioned in a column different from the column where the subpixels of the other colors are positioned is not limited to red (R) and may alternatively be green (G) or blue (B).

Figure 15B:
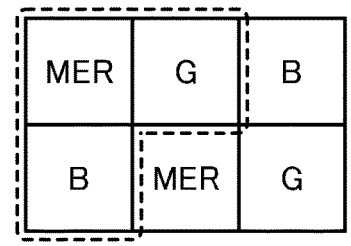

FIG. 15B illustrates two pixels, and one pixel is composed of three subpixels surrounded by dotted lines. The pixel illustrated in FIG. 15B includes the subpixel (MER) that emits red light and has a light-receiving function, the subpixel (G) that emits green light, and the subpixel (B) that emits blue light. In the pixel on the left in FIG. 15B, the subpixel (G) is positioned in the same row as the subpixel (MER), and the subpixel (B) is positioned in the same column as the subpixel (MER). In the pixel on the right in FIG. 15B, the subpixel (G) is positioned in the same row as the subpixel (MER), and the subpixel (B) is positioned in the same column as the subpixel (G). In the pixel layout illustrated in FIG. 15B, the subpixel (MER), the subpixel (G), and the subpixel (B) are repeatedly arranged in both the odd-numbered row and the even-numbered row. In addition, subpixels of different colors are arranged in the odd-numbered row and the even-numbered row in every column.

Figure 15C:
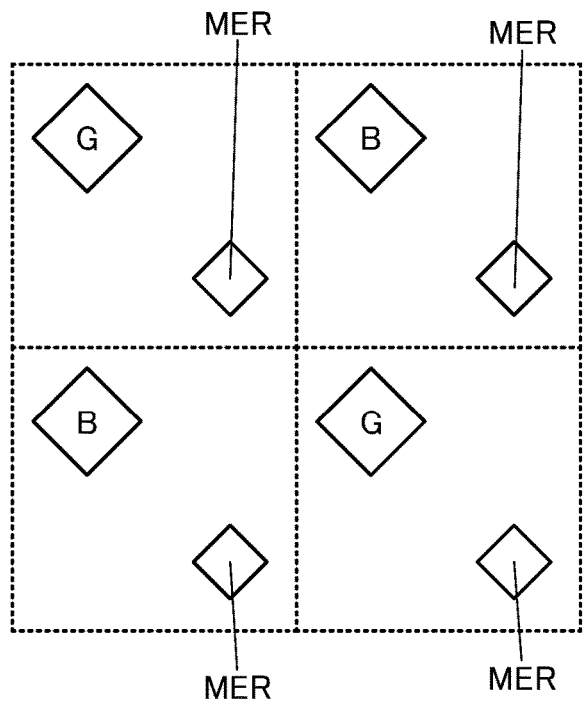

FIG. 15C shows a variation example of the pixel arrangement of FIG. 14G. The upper left pixel and the lower right pixel in FIG. 15C each include the subpixel (MER) that emits red light and has a light-receiving function and the subpixel (G) that emits green light. The lower left pixel and the upper right pixel in FIG. 15C each include the subpixel (MER) that emits red light and has a light-receiving function and the subpixel (B) that emits blue light.

In FIG. 14G, the subpixel (G) that emits green light is provided in each pixel. Meanwhile, in FIG. 15C, the subpixel (MER) that emits red light and has a light-receiving function is provided in each pixel. The structure illustrated in FIG. 15C achieves higher-resolution image capturing than the structure illustrated in FIG. 14G because the subpixel having a light-receiving function is provided in each pixel. Thus, the accuracy of biometric authentication can be increased, for example.

The top surface shape of the light-emitting elements and the light-emitting/receiving elements is not particularly limited and can be a circular shape, an elliptical shape, a polygonal shape, a polygonal shape with rounded corners, or the like. The top surface shape of the light-emitting elements included in the subpixels (G) is circular in the example in FIG. 14G and square in the example in FIG. 15C. The top surface shape of the light-emitting elements and the light-emitting/receiving elements may vary depending on the color thereof, or the light-emitting elements and the light-emitting/receiving elements of some colors or every color may have the same top surface shape.

The aperture ratio of subpixels may vary depending on the color thereof, or may be the same among the subpixels of some colors or all colors. For example, the aperture ratio of a subpixel provided in each pixel (the subpixel (G) in FIG. 14G, and the subpixel (MER) in FIG. 15C) may be made lower than that of a subpixel of another color.

Figure 15D:
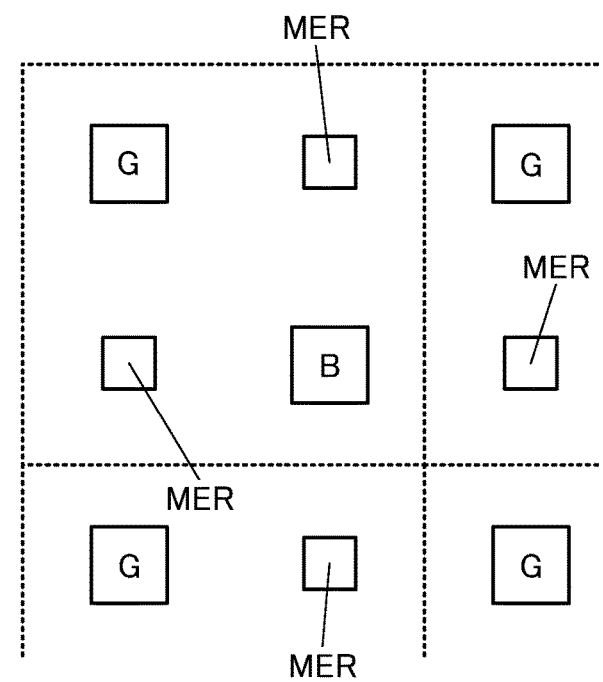

FIG. 15D shows a variation example of the pixel arrangement of FIG. 15C. Specifically, the structure of FIG. 15D is obtained by rotating the structure of FIG. 15C by 45°. Although one pixel is regarded as being composed of two subpixels in FIG. 15C, one pixel can be regarded as being composed of four subpixels as illustrated in FIG. 15D.

In the description with reference to FIG. 15D, one pixel is regarded as being composed of four subpixels surrounded by dotted lines. One pixel includes two subpixels (MER), one subpixel (G), and one subpixel (B). The pixel including a plurality of subpixels having a light-receiving function allows high-resolution image capturing. Accordingly, the accuracy of biometric authentication can be increased. For example, the resolution of image capturing can be the square root of 2 times the resolution of display.

A display apparatus that employs the structure illustrated in FIG. 15C or FIG. 15D includes p first light-emitting elements (p is an integer greater than or equal to 2), q second light-emitting elements (q is an integer greater than or equal to 2), and r light-emitting/receiving elements (r is an integer greater than p and greater than q). As for p and r, r=2p is satisfied. As for p, q, and r, r=p+q is satisfied. Either the first light-emitting elements or the second light-emitting elements emits green light, and the other light-emitting elements emit blue light. The light-emitting/receiving elements emit red light and have a light-receiving function.

In the case where touch detection is performed with the light-emitting/receiving elements, for example, it is preferable that light emitted from a light source be hard for a user to recognize. Since blue light has low visibility than green light, light-emitting elements that emit blue light are preferably used as a light source. Accordingly, the light-emitting/receiving elements preferably have a function of receiving blue light. Alternatively, infrared light, which is not perceived by the user, may be used for a light source.

As described above, the display apparatus of one embodiment of the present invention can employ pixels with a variety of arrangements.

The pixel arrangement in the display apparatus of this embodiment need not be changed when a light-receiving function is incorporated into pixels; thus, the display portion can be provided with one or both of an image capturing function and a sensing function without a reduction in the aperture ratio or resolution.

[Light-Emitting/Receiving Element]

FIG. 16A to FIG. 16E illustrate examples of layered structures of light-emitting/receiving elements.

The light-emitting/receiving element includes at least an active layer and a light-emitting layer between a pair of electrodes.

In addition to the active layer and the light-emitting layer, the light-emitting/receiving element may further include a layer containing a substance with a high hole-injection property, a substance with a high hole-transport property, a substance with a high hole-blocking property, a substance with a high electron-transport property, a substance with a high electron-injection property, a substance with a high electron-blocking property, a substance with a bipolar property (a substance with high electron- and hole-transport properties), or the like.

Figure 16A:
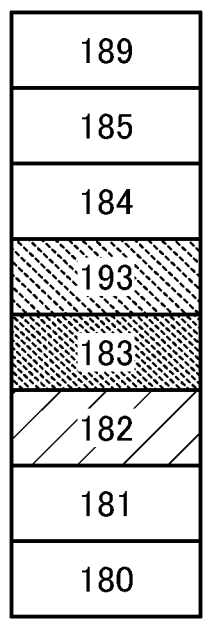
FIG. 16A to FIG. 16E are cross-sectional views illustrating examples of light-emitting/receiving elements.
Figure 16B:
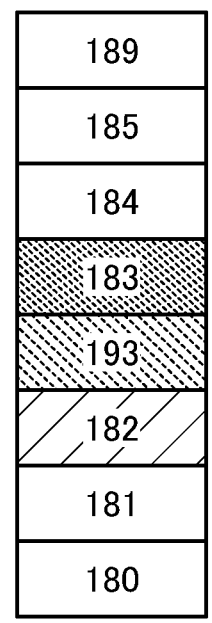
Figure 16C:
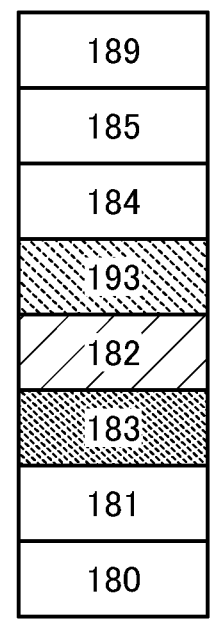

The light-emitting/receiving elements illustrated in FIG. 16A to FIG. 16C each include a first electrode 180, a hole-injection layer 181, a hole-transport layer 182, an active layer 183, a light-emitting layer 193, an electron-transport layer 184, an electron-injection layer 185, and a second electrode 189.

Note that each of the light-emitting/receiving elements illustrated in FIG. 16A to FIG. 16C can be regarded as having a structure where the active layer 183 is added to a light-emitting element. Therefore, the light-emitting/receiving element can be formed concurrently with the light-emitting element only by adding a step of forming the active layer 183 in the manufacturing process of the light-emitting element. The light-emitting element and the light-emitting/receiving element can be formed over one substrate. Thus, the display portion can be provided with one or both of an image capturing function and a sensing function without a significant increase in the number of manufacturing steps.

The stacking order of the light-emitting layer 193 and the active layer 183 is not limited. FIG. 16A illustrates an example in which the active layer 183 is provided over the hole-transport layer 182 and the light-emitting layer 193 is provided over the active layer 183. FIG. 16B illustrates an example in which the light-emitting layer 193 is provided over the hole-transport layer 182 and the active layer 183 is provided over the light-emitting layer 193. The active layer 183 and the light-emitting layer 193 may be in contact with each other as illustrated in FIG. 16A and FIG. 16B.

As illustrated in FIG. 16C, a buffer layer is preferably provided between the active layer 183 and the light-emitting layer 193. As the buffer layer, at least one layer of a hole-injection layer, a hole-transport layer, an electron-transport layer, an electron-injection layer, a hole-blocking layer, an electron-blocking layer, and the like can be used. FIG. 16C illustrates an example in which the hole-transport layer 182 is used as the buffer layer.

The buffer layer provided between the active layer 183 and the light-emitting layer 193 can inhibit transfer of excitation energy from the light-emitting layer 193 to the active layer 183. Furthermore, the buffer layer can also be used to adjust the optical path length (cavity length) of the microcavity structure. Thus, high emission efficiency can be obtained from the light-emitting/receiving element including the buffer layer between the active layer 183 and the light-emitting layer 193.

Figure 16D:
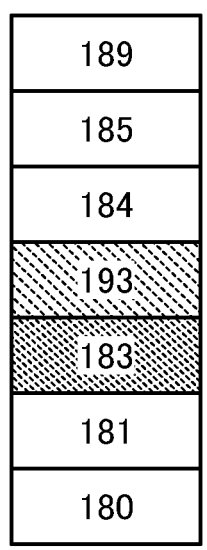

The light-emitting/receiving element illustrated in FIG. 16D is different from the light-emitting/receiving elements illustrated in FIG. 16A and FIG. 16C in not including the hole-transport layer 182. The light-emitting/receiving element may exclude at least one of the hole-injection layer 181, the hole-transport layer 182, the electron-transport layer 184, and the electron-injection layer 185. Furthermore, the light-emitting/receiving element may include another functional layer such as a hole-blocking layer or an electron-blocking layer.

Figure 16E:
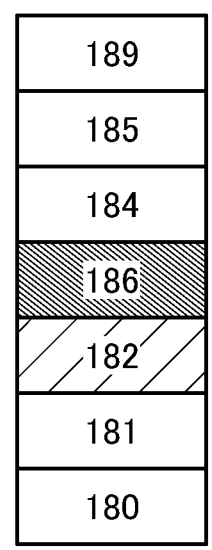

The light-emitting/receiving element illustrated in FIG. 16E is different from the light-emitting/receiving elements illustrated in FIG. 16A to FIG. 16C in including a layer 186 serving as both a light-emitting layer and an active layer instead of including the active layer 183 and the light-emitting layer 193.

As the layer 186 serving as both a light-emitting layer and an active layer, it is possible to use, for example, a layer containing three materials which are an n-type semiconductor that can be used for the active layer 183, a p-type semiconductor that can be used for the active layer 183, and a light-emitting substance that can be used for the light-emitting layer 193.

Note that an absorption band on the lowest energy side of an absorption spectrum of a mixed material of the n-type semiconductor and the p-type semiconductor and a maximum peak of an emission spectrum (PL spectrum) of the light-emitting substance preferably do not overlap each other and are further preferably positioned fully apart from each other.

In the light-emitting/receiving element, a conductive film that transmits visible light is used as the electrode through which light is extracted. A conductive film that reflects visible light is preferably used as the electrode through which light is not extracted.

When the light-emitting/receiving element is driven as a light-emitting element, the hole-injection layer serves as a layer that injects holes from the anode to the light-emitting/receiving element. The hole-injection layer is a layer containing a material with a high hole-injection property. As the material with a high hole-injection property, it is possible to use, for example, an aromatic amine compound or a composite material containing a hole-transport material and an acceptor material (electron-accepting material).

When the light-emitting/receiving element is driven as a light-emitting element, the hole-transport layer serves as a layer that transports holes injected from the anode by the hole-injection layer, to the light-emitting layer. When the light-emitting/receiving element is driven as a light-receiving element, the hole-transport layer serves as a layer that transports holes generated in the active layer on the basis of incident light, to the anode. The hole-transport layer is a layer containing a hole-transport material. As the hole-transport material, a substance having a hole mobility greater than or equal to $1 \times 10^{-6}$ cm$^2$/Vs is preferable. Note that other substances can also be used as long as they have a property of transporting more holes than electrons. As the hole-transport material, a material having a high hole-transport property, such as a $\pi$-electron-rich heteroaromatic compound (e.g., a carbazole derivative, a thiophene derivative, and a furan derivative) or an aromatic amine (a compound having an aromatic amine skeleton), is preferable.

When the light-emitting/receiving element is driven as a light-emitting element, the electron-transport layer serves as a layer that transports electrons injected from the cathode by the electron-injection layer, to the light-emitting layer. When the light-emitting/receiving element is driven as a light-receiving element, the electron-transport layer serves as a layer that transports electrons generated in the active layer on the basis of incident light, to the cathode. The electron-transport layer is a layer containing an electron-transport material. As the electron-transport material, a substance with an electron mobility greater than or equal to $1 \times 10^{-6}$ cm$^2$/Vs is preferable. Note that other substances can also be used as long as they have a property of transporting more electrons than holes. As the electron-transport material, it is possible to use a material having a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a $\pi$-electron deficient heteroaromatic compound such as a nitrogen-containing heteroaromatic compound.

When the light-emitting/receiving element is driven as a light-emitting element, the electron-injection layer serves as a layer that injects electrons from the cathode to the light-emitting/receiving element. The electron-injection layer is a layer containing a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

The light-emitting layer 193 is a layer that contains a light-emitting substance. The light-emitting layer 193 can contain one or more kinds of light-emitting substances. As the light-emitting substance, a substance that exhibits an emission color of blue, purple, bluish purple, green, yellowish green, yellow, orange, red, or the like is appropriately used. As the light-emitting substance, a substance that emits near-infrared light can also be used.

Examples of the light-emitting substance include a fluorescent material, a phosphorescent material, a TADF material, and a quantum dot material.

Examples of the fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of the phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer 193 may contain one or more kinds of organic compounds (e.g., a host material and an assist material) in addition to the light-emitting substance (guest material). As one or more kinds of organic compounds, one or both of the hole-transport material and the electron-transport material can be used. Alternatively, as one or more kinds of organic compounds, a bipolar material or a TADF material may be used.

The light-emitting layer 193 preferably contains a phosphorescent material and a combination of a hole-transport material and an electron-transport material that easily forms an exciplex. With such a structure, light emission can be efficiently obtained by ExTET (Exciplex—Triplet Energy Transfer), which is energy transfer from an exciplex to a light-emitting substance (a phosphorescent material). When a combination of materials is selected so as to form an exciplex that exhibits light emission whose wavelength overlaps the wavelength of a lowest-energy-side absorption band of the light-emitting substance, energy can be transferred smoothly and light emission can be obtained efficiently. With this structure, high efficiency, low-voltage driving, and a long lifetime of the light-emitting element can be achieved at the same time.

In the combination of materials for forming an exciplex, the HOMO level (highest occupied molecular orbital level) of the hole-transport material is preferably higher than or equal to the HOMO level of the electron-transport material. The LUMO level (lowest unoccupied molecular orbital level) of the hole-transport material is preferably higher than or equal to the LUMO level of the electron-transport material. The LUMO levels and the HOMO levels of the materials can be derived from the electrochemical characteristics (reduction potentials and oxidation potentials) of the materials that are measured by cyclic voltammetry (CV).

Note that the formation of an exciplex can be confirmed by a phenomenon in which the emission spectrum of a mixed film in which the hole-transport material and the electron-transport material are mixed is shifted to the longer wavelength side than the emission spectrum of each of the materials (or has another peak on the longer wavelength side), observed by comparison of the emission spectra of the hole-transport material, the electron-transport material, and the mixed film of these materials, for example. Alternatively, the formation of an exciplex can be confirmed by a difference in transient response, such as a phenomenon in which the transient photoluminescence (PL) lifetime of the mixed film has longer lifetime components or has a larger proportion of delayed components than that of each of the materials, observed by comparison of the transient PL of the hole-transport material, the transient PL of the electron-transport material, and the transient PL of the mixed film of these materials. The transient PL can be rephrased as transient electroluminescence (EL). That is, the formation of an exciplex can also be confirmed by a difference in transient response observed by comparison of the transient EL of the hole-transport material, the transient EL of the electron-transport material, and the transient EL of the mixed film of these materials.

The active layer 183 contains a semiconductor. Examples of the semiconductor include an inorganic semiconductor such as silicon and an organic semiconductor including an organic compound. This embodiment shows an example in which an organic semiconductor is used as the semiconductor included in the active layer. The use of an organic semiconductor is preferable because the light-emitting layer 193 and the active layer 183 can be formed by the same method (e.g., a vacuum evaporation method) and thus the same manufacturing apparatus can be used.

Examples of an n-type semiconductor material contained in the active layer 183 are electron-accepting organic semiconductor materials such as fullerene (e.g., $C_{60}$ and $C_{70}$) and fullerene derivatives. Fullerene has a soccer ball-like shape, which is energetically stable. Both the HOMO level and the LUMO level of fullerene are deep (low). Having a deep LUMO level, fullerene has an extremely high electron-accepting property (acceptor property). When π-electron conjugation (resonance) spreads in a plane as in benzene, the electron-donating property (donor property) usually increases. However, since fullerene has a spherical shape, fullerene has a high electron-accepting property even when π-electrons widely spread. The high electron-accepting property efficiently causes rapid charge separation and is useful for a light-receiving element. Both $C_{60}$ and $C_{70}$ have a wide absorption band in the visible light region, and $C_{70}$ is especially preferable because of having a larger π-electron conjugation system and a wider absorption band in the long wavelength region than $C_{60}$.

Examples of the n-type semiconductor material include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

Examples of the p-type semiconductor material contained in the active layer 183 include electron-donating organic semiconductor materials such as copper(II) phthalocyanine (CuPc), tetraphenyldibenzoperiflanthene (DBP), zinc phthalocyanine (ZnPc), tin phthalocyanine (SnPc), and quinacridone.

Examples of the p-type semiconductor material include a carbazole derivative, a thiophene derivative, a furan derivative, and a compound having an aromatic amine skeleton. Other examples of the p-type semiconductor material include a naphthalene derivative, an anthracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a polyphenylene vinylene derivative, a polyparaphenylene derivative, a polyfluorene derivative, a polyvinylcarbazole derivative, and a polythiophene derivative.

The HOMO level of the electron-donating organic semiconductor material is preferably shallower (higher) than the HOMO level of the electron-accepting organic semiconductor material. The LUMO level of the electron-donating organic semiconductor material is preferably shallower (higher) than the LUMO level of the electron-accepting organic semiconductor material.

Fullerene having a spherical shape is preferably used as the electron-accepting organic semiconductor material, and an organic semiconductor material having a substantially planar shape is preferably used as the electron-donating organic semiconductor material. Molecules of similar shapes tend to aggregate, and aggregated molecules of similar kinds, which have molecular orbital energy levels close to each other, can improve the carrier-transport property.

For example, the active layer 183 is preferably formed by co-evaporation of an n-type semiconductor and a p-type semiconductor.

The layer 186 serving as both a light-emitting layer and an active layer is preferably formed using the above-described light-emitting material, n-type semiconductor, and p-type semiconductor.

The hole-injection layer 181, the hole-transport layer 182, the active layer 183, the light-emitting layer 193, the electron-transport layer 184, the electron-injection layer 185, and the layer 186 serving as both a light-emitting layer and an active layer may be formed using either a low-molecular compound or a high-molecular compound and may contain an inorganic compound. Each of the layers can be formed by an evaporation method (including a vacuum evaporation method), a transfer method, a printing method, an inkjet method, a coating method, or the like.

Detailed structures of the light-emitting/receiving element and the light-emitting elements included in the display apparatus of one embodiment of the present invention will be described below with reference to FIG. 17 to FIG. 19.

The display apparatus of one embodiment of the present invention can have any of the following structures: a top-emission structure in which light is emitted in a direction opposite to the substrate where the light-emitting elements are formed, a bottom-emission structure in which light is emitted toward the substrate where the light-emitting elements are formed, and a dual-emission structure in which light is emitted toward both surfaces.

FIG. 17 to FIG. 19 illustrate top-emission display apparatuses as examples.

Structure Example 1

Figure 17A:
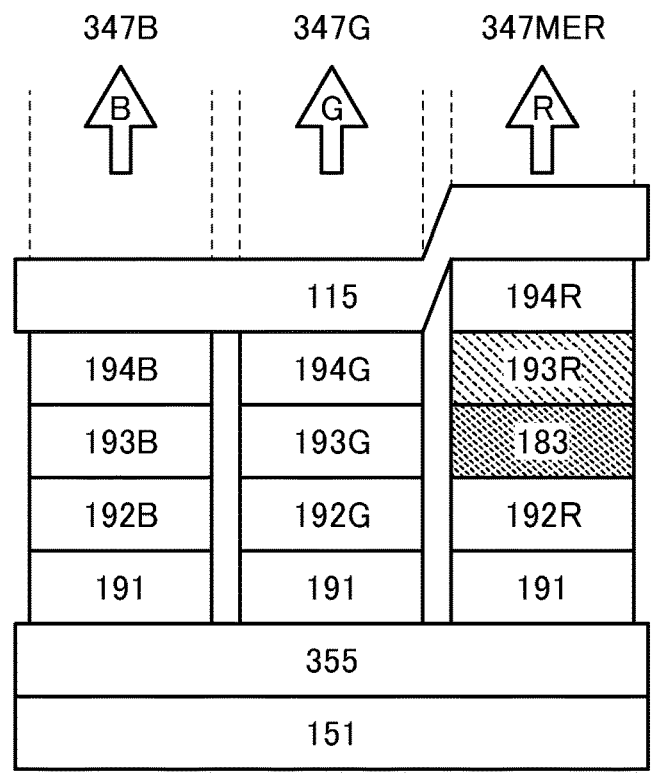
FIG. 17A and FIG. 17B are cross-sectional views illustrating an example of a display apparatus.
Figure 17B:
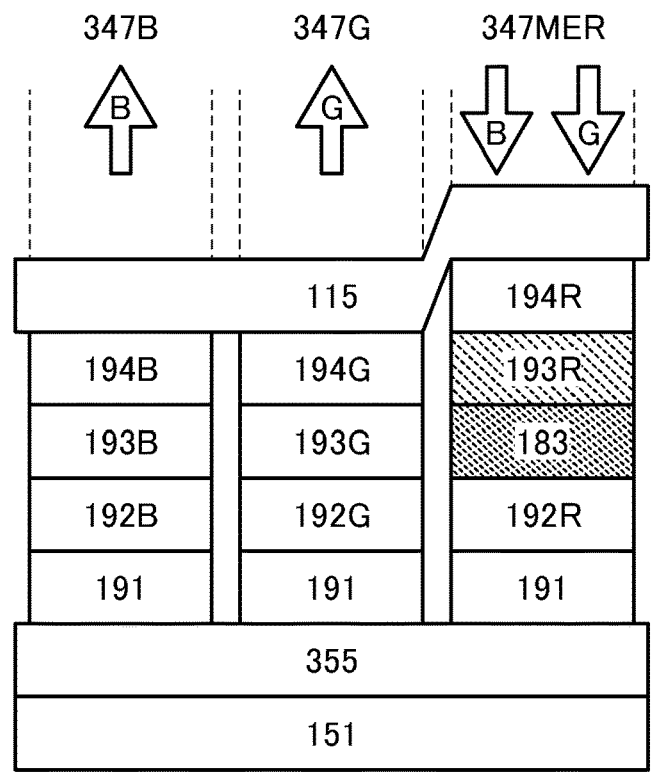

The display apparatus illustrated in FIG. 17A and FIG. 17B includes a light-emitting element 347B that emits blue (B) light, a light-emitting element 347G that emits green (G) light, and a light-emitting/receiving element 347MER that emits red (R) light and has a light-receiving function over a substrate 151 with the layer 355 including transistors therebetween.

FIG. 17A shows the case where the light-emitting/receiving element 347MER functions as a light-emitting element. FIG. 17A illustrates an example in which the light-emitting element 347B emits blue light, the light-emitting element 347G emits green light, and the light-emitting/receiving element 347MER emits red light.

FIG. 17B shows the case where the light-emitting/receiving element 347MER functions as a light-receiving element. FIG. 17B illustrates an example in which the light-emitting/receiving element 347MER detects blue light emitted by the light-emitting element 347B and green light emitted by the light-emitting element 347G.

The light-emitting element 347B, the light-emitting element 347G, and the light-emitting/receiving element 347MER each include a pixel electrode 191 and a common electrode 115. In this embodiment, the case where the pixel electrode 191 functions as an anode and the common electrode 115 functions as a cathode is described as an example.

In the description in this embodiment, also in the light-emitting/receiving element 347MER, the pixel electrode 191 functions as an anode and the common electrode 115 functions as a cathode as in the light-emitting elements. In other words, when the light-emitting/receiving element 347MER is driven by application of reverse bias between the pixel electrode 191 and the common electrode 115, light entering the light-emitting/receiving element 347MER can be detected and electric charge can be generated and extracted as current.

The common electrode 115 is shared by the light-emitting element 347B, the light-emitting element 347G, and the light-emitting/receiving element 347MER.

The material, thickness, and the like of the pair of electrodes can be the same in the light-emitting element 347B, the light-emitting element 347G, and the light-emitting/receiving element 347MER. Accordingly, the manufacturing cost of the display apparatus can be reduced, and the manufacturing process of the display apparatus can be simplified.

The structure of the display apparatus illustrated in FIG. 17A and FIG. 17B will be specifically described.

The light-emitting element 347B includes a buffer layer 192B, a light-emitting layer 193B, and a buffer layer 194B in this order over the pixel electrode 191. The light-emitting layer 193B contains a light-emitting substance that emits blue light. The light-emitting element 347B has a function of emitting blue light.

The light-emitting element 347G includes a buffer layer 192G, a light-emitting layer 193G, and a buffer layer 194G in this order over the pixel electrode 191. The light-emitting layer 193G contains a light-emitting substance that emits green light. The light-emitting element 347G has a function of emitting green light.

The light-emitting/receiving element 347MER includes a buffer layer 192R, the active layer 183, a light-emitting layer 193R, and a buffer layer 194R in this order over the pixel electrode 191. The light-emitting layer 193R contains a light-emitting substance that emits red light. The active layer 183 contains an organic compound that absorbs light having a shorter wavelength than red light (e.g., one or both of green light and blue light). Note that an organic compound that absorbs ultraviolet light as well as visible light may be used for the active layer 183. The light-emitting/receiving element 347MER has a function of emitting red light. The light-emitting/receiving element 347MER has a function of detecting light emitted from at least one of the light-emitting element 347G and the light-emitting element 347B and preferably has a function of detecting light emitted from both of them.

The active layer 183 preferably contains an organic compound that does not easily absorb red light and absorbs light having a shorter wavelength than red light. Thus, the light-emitting/receiving element 347MER can have a function of efficiently emitting red light and a function of accurately detecting light having a shorter wavelength than red light.

The pixel electrode 191, the buffer layer 192R, the buffer layer 192G, the buffer layer 192B, the active layer 183, the light-emitting layer 193R, the light-emitting layer 193G, the light-emitting layer 193B, the buffer layer 194R, the buffer layer 194G, the buffer layer 194B, and the common electrode 115 may each have a single-layer structure or a stacked-layer structure.

In the display apparatus illustrated in FIG. 17A and FIG. 17B, the buffer layer, the active layer, and the light-emitting layer are formed in each element individually.

The buffer layers 192R, 192G, and 192B can each include one or both of a hole-injection layer and a hole-transport layer. Furthermore, the buffer layers 192R, 192G, and 192B may each include an electron-blocking layer. The buffer layers 194B, 194G, and 194R can each include one or both of an electron-injection layer and an electron-transport layer. Furthermore, the buffer layers 194R, 194G, and 194B may each include a hole-blocking layer. Note that the above description of the layers included in the light-emitting/receiving element can be referred to for materials and the like of the layers included in the light-emitting elements.

Structure Example 2

Figure 18A:
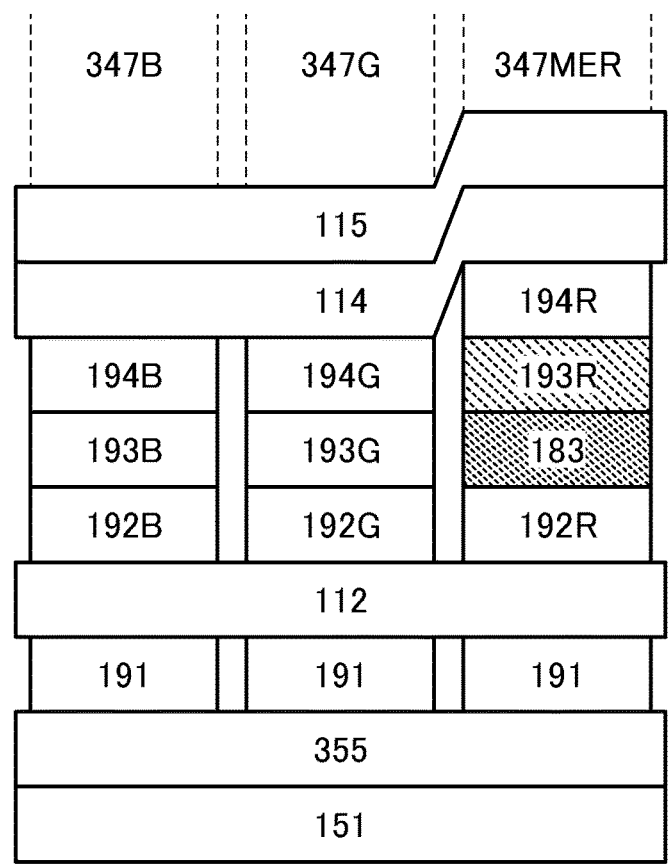
FIG. 18A and FIG. 18B are cross-sectional views illustrating examples of a display apparatus.
Figure 18B:
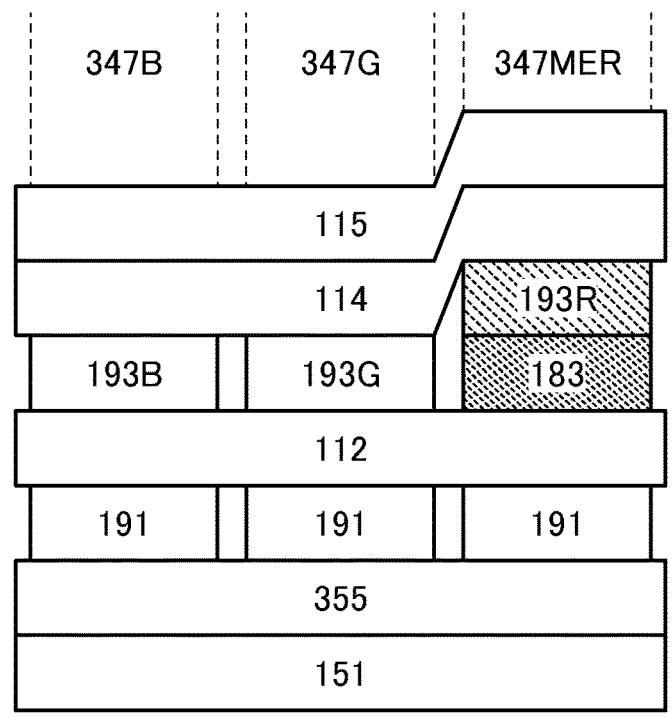

As illustrated in FIG. 18A and FIG. 18B, the light-emitting element 347B, the light-emitting element 347G, and the light-emitting/receiving element 347MER may include common layers between the pair of electrodes. Thus, the light-emitting/receiving element can be incorporated into the display apparatus without a significant increase in the number of manufacturing steps.

The light-emitting element 347B, the light-emitting element 347G, and the light-emitting/receiving element 347MER illustrated in FIG. 18A include a common layer 112 and a common layer 114 in addition to the components illustrated in FIG. 17A and FIG. 17B.

The light-emitting element 347B, the light-emitting element 347G, and the light-emitting/receiving element 347MER illustrated in FIG. 18B are different from those illustrated in FIG. 17A and FIG. 17B in that the buffer layers 192R, 192G, and 192B and the buffer layers 194R, 194G, and 194B are not included and the common layer 112 and the common layer 114 are included.

The common layer 112 can include one or both of a hole-injection layer and a hole-transport layer. The common layer 114 can include one or both of an electron-injection layer and an electron-transport layer.

The common layer 112 and the common layer 114 may each have a single-layer structure or a stacked-layer structure.

Structure Example 3

Figure 19A:
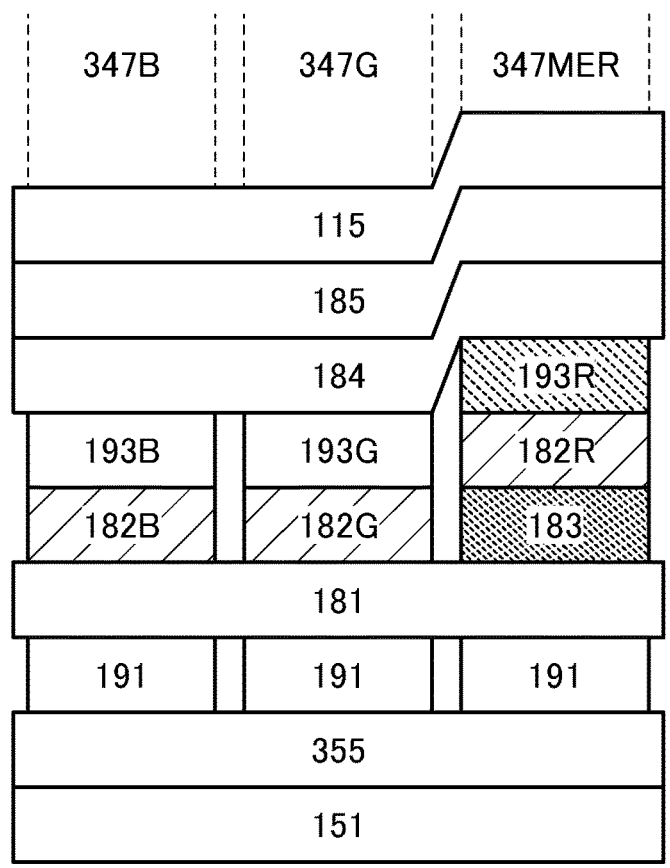
FIG. 19A and FIG. 19B are cross-sectional views illustrating examples of a display apparatus.

The display apparatus illustrated in FIG. 19A is an example in which the light-emitting/receiving element 347MER employs the layered structure illustrated in FIG. 16C.

The light-emitting/receiving element 347MER includes the hole-injection layer 181, the active layer 183, a hole-transport layer 182R, the light-emitting layer 193R, the electron-transport layer 184, the electron-injection layer 185, and the common electrode 115 in this order over the pixel electrode 191.

The hole-injection layer 181, the electron-transport layer 184, the electron-injection layer 185, and the common electrode 115 are common layers to the light-emitting element 347G and the light-emitting element 347B.

The light-emitting element 347G includes the hole-injection layer 181, a hole-transport layer 182G, the light-emitting layer 193G, the electron-transport layer 184, the electron-injection layer 185, and the common electrode 115 in this order over the pixel electrode 191.

The light-emitting element 347B includes the hole-injection layer 181, a hole-transport layer 182B, the light-emitting layer 193B, the electron-transport layer 184, the electron-injection layer 185, and the common electrode 115 in this order over the pixel electrode 191.

The light-emitting element included in the display apparatus of this embodiment preferably employs a microcavity structure. Thus, one of the pair of electrodes of the light-emitting element is preferably an electrode having properties of transmitting and reflecting visible light (a transflective electrode), and the other is preferably an electrode having a property of reflecting visible light (a reflective electrode). When the light-emitting element has a microcavity structure, light obtained from the light-emitting layer can be resonated between both of the electrodes, whereby light emitted from the light-emitting element can be intensified.

Note that the transflective electrode can have a stacked-layer structure of a reflective electrode and an electrode having a property of transmitting visible light (also referred to as a transparent electrode). In this specification and the like, a reflective electrode functioning as part of a transflective electrode may be referred to as a pixel electrode or a common electrode, and a transparent electrode may be referred to as an optical adjustment layer; however, in some cases, a transparent electrode (optical adjustment layer) can also be regarded as having a function of a pixel electrode or a common electrode.

The transparent electrode has a light transmittance higher than or equal to 40%. For example, an electrode whose transmittance for visible light (light with a wavelength greater than or equal to 400 nm and less than 750 nm) and near-infrared light (light with a wavelength greater than or equal to 750 nm and less than or equal to 1300 nm) is greater than or equal to 40% is preferably used in the light-emitting element. The reflectance of the transflective electrode for visible light and near-infrared light is greater than or equal to 10% and less than or equal to 95%, preferably greater than or equal to 30% and less than or equal to 80%. The reflectance of the reflective electrode for visible light and near-infrared light is greater than or equal to 40% and less than or equal to 100%, preferably greater than or equal to 70% and less than or equal to 100%. These electrodes preferably have a resistivity of $1 \times 10^{-2}$ Ωcm or lower.

The hole-transport layers 182B, 182G, and 182R may each have a function of an optical adjustment layer. Specifically, the thickness of the hole-transport layer 182B is preferably adjusted such that the optical distance between the pair of electrodes in the light-emitting element 347B intensifies blue light. Similarly, the thickness of the hole-transport layer 182G is preferably adjusted such that the optical distance between the pair of electrodes in the light-emitting element 347G intensifies green light. The thickness of the hole-transport layer 182R is preferably adjusted such that the optical distance between the pair of electrodes in the light-emitting/receiving element 347MER intensifies red light. The layer used as the optical adjustment layer is not limited to the hole-transport layer. Note that when the transflective electrode has a stacked-layer structure of a reflective electrode and a transparent electrode, the optical distance between the pair of electrodes represents the optical distance between a pair of reflective electrodes.

Structure Example 4

Figure 19B:
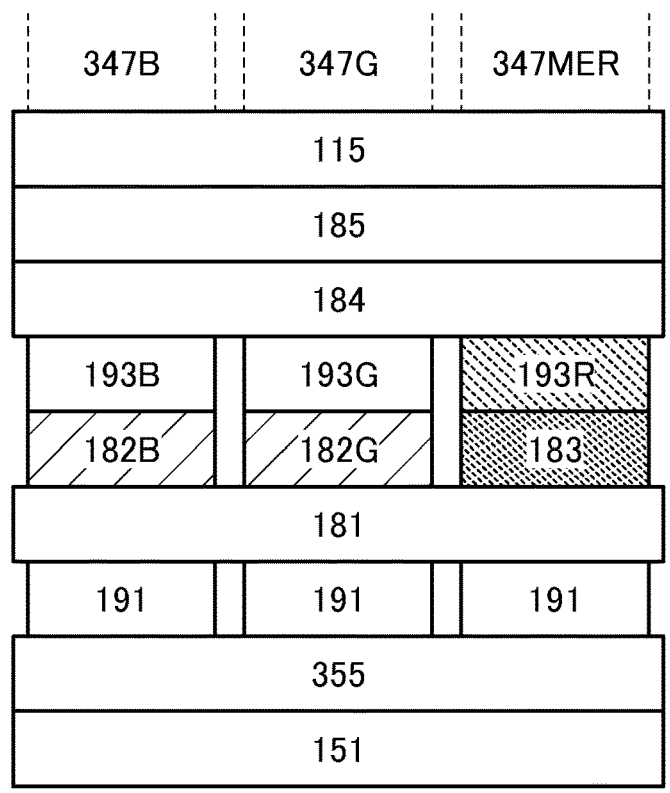

The display apparatus illustrated in FIG. 19B is an example in which the light-emitting/receiving element 347MER employs the layered structure illustrated in FIG. 16D.

The light-emitting/receiving element 347MER includes the hole-injection layer 181, the active layer 183, the light-emitting layer 193R, the electron-transport layer 184, the electron-injection layer 185, and the common electrode 115 in this order over the pixel electrode 191.

The hole-injection layer 181, the electron-transport layer 184, the electron-injection layer 185, and the common electrode 115 are common layers to the light-emitting element 347G and the light-emitting element 347B.

The light-emitting element 347G includes the hole-injection layer 181, the hole-transport layer 182G, the light-emitting layer 193G, the electron-transport layer 184, the electron-injection layer 185, and the common electrode 115 in this order over the pixel electrode 191.

The light-emitting element 347B includes the hole-injection layer 181, the hole-transport layer 182B, the light-emitting layer 193B, the electron-transport layer 184, the electron-injection layer 185, and the common electrode 115 in this order over the pixel electrode 191.

The hole-transport layer is provided in the light-emitting element 347G and the light-emitting element 347B and is not provided in the light-emitting/receiving element 347MER. In this manner, a layer provided in only one of the light-emitting element and the light-emitting/receiving element may exist in addition to the active layer and the light-emitting layer.

A detailed structure of the display apparatus of one embodiment of the present invention will be described below with reference to FIG. 20 to FIG. 25.

[Display Apparatus 310A]

Figure 20A:
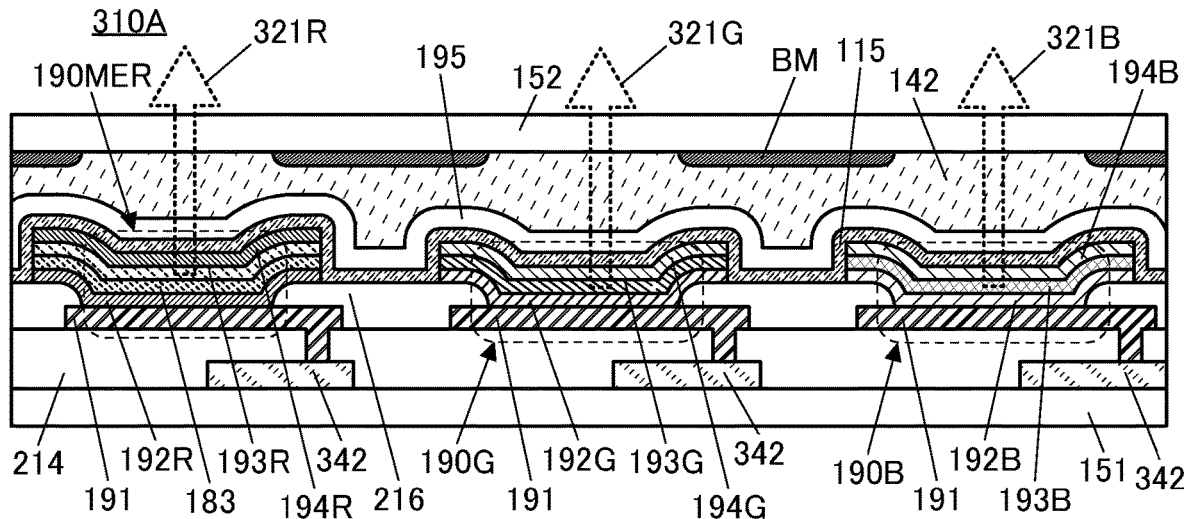
FIG. 20A and FIG. 20B are cross-sectional views illustrating an example of a display apparatus.
Figure 20B:
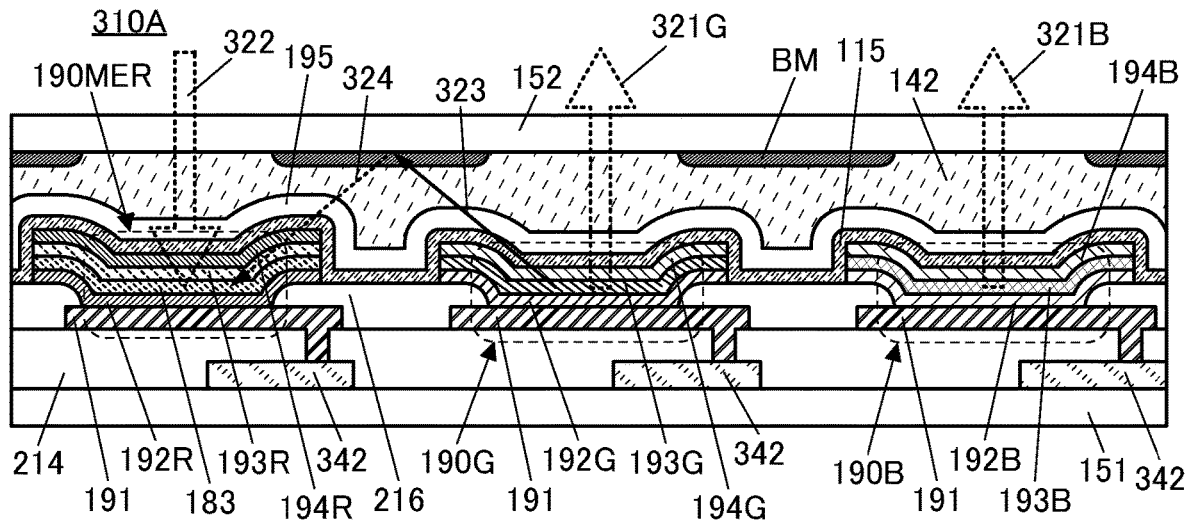

FIG. 20A and FIG. 20B are cross-sectional views of a display apparatus 310A.

The display apparatus 310A includes a light-emitting element 190B, a light-emitting element 190G, and a light-emitting/receiving element 190MER.

The light-emitting element 190B includes the pixel electrode 191, the buffer layer 192B, the light-emitting layer 193B, the buffer layer 194B, and the common electrode 115. The light-emitting element 190B has a function of emitting blue light 321B.

The light-emitting element 190G includes the pixel electrode 191, the buffer layer 192G, the light-emitting layer 193G, the buffer layer 194G, and the common electrode 115. The light-emitting element 190G has a function of emitting green light 321G.

The light-emitting/receiving element 190MER includes the pixel electrode 191, the buffer layer 192R, the active layer 183, the light-emitting layer 193R, the buffer layer 194R, and the common electrode 115. The light-emitting/receiving element 190MER has a function of emitting red light 321R and a function of detecting light 322.

FIG. 20A shows the case where the light-emitting/receiving element 190MER functions as a light-emitting element. FIG. 20A illustrates an example in which the light-emitting element 190B emits blue light, the light-emitting element 190G emits green light, and the light-emitting/receiving element 190MER emits red light.

FIG. 20B shows the case where the light-emitting/receiving element 190MER functions as a light-receiving element. FIG. 20B illustrates an example in which the light-emitting/receiving element 190MER detects blue light emitted by the light-emitting element 190B and green light emitted by the light-emitting element 190G.

The pixel electrode 191 is positioned over an insulating layer 214. An end portion of the pixel electrode 191 is covered with a partition 216. Two adjacent pixel electrodes 191 are electrically insulated (electrically isolated) from each other by the partition 216.

An organic insulating film is suitable for the partition 216. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins. The partition 216 is a layer that transmits visible light. Although the details will be described later, a partition that blocks visible light may be provided in place of the partition 216.

The display apparatus 310A includes the light-emitting/receiving element 190MER, the light-emitting element 190G, the light-emitting element 190B, a transistor 342, and the like between a pair of substrates (the substrate 151 and a substrate 152).

The light-emitting/receiving element 190MER has a function of sensing light. Specifically, the light-emitting/receiving element 190MER is a photoelectric conversion element that receives the light 322 incident from the outside of the display apparatus 310A and converts it into an electric signal. The light 322 can also be referred to as light that is emitted from one or both of the light-emitting element 190G and the light-emitting element 190B and then reflected by an object. The light 322 may enter the light-emitting/receiving element 190MER through a lens.

The light-emitting element 190G and the light-emitting element 190B have a function of emitting visible light. Specifically, the light-emitting element 190G and the light-emitting element 190B are each an electroluminescent element that emits light to the substrate 152 side by voltage application between the pixel electrode 191 and the common electrode 115 (see the light 321G and the light 321B).

The buffer layer 192 (the buffer layer 192R, the buffer layer 192G, and the buffer layer 192B), the light-emitting layer 193, and the buffer layer 194 (the buffer layer 194R, the buffer layer 194G, and the buffer layer 194B) can also be referred to as organic layers (layers containing an organic compound) or EL layers. The pixel electrode 191 preferably has a function of reflecting visible light. The common electrode 115 has a function of transmitting visible light.

The pixel electrode 191 is electrically connected to a source or a drain of the transistor 342 through an opening provided in the insulating layer 214. The transistor 342 has a function of controlling the driving of the light-emitting element or the light-emitting/receiving element.

At least part of a circuit electrically connected to the light-emitting/receiving element 190MER is preferably formed using the same material in the same steps as a circuit electrically connected to the light-emitting element 190G and the light-emitting element 190B. In that case, the thickness of the display apparatus can be reduced compared with the case where the two circuits are separately formed, resulting in simplification of the manufacturing process.

The light-emitting/receiving element 190MER, the light-emitting element 190G, and the light-emitting element 190B are preferably covered with a protective layer 195. In FIG. 20A and the like, the protective layer 195 is provided over and in contact with the common electrode 115. Providing the protective layer 195 can inhibit entry of impurities into the light-emitting/receiving element 190MER and the light-emitting elements of different colors and improve the light-emitting/receiving element 190MER and the light-emitting devices of the different colors. The protective layer 195 and the substrate 152 are bonded to each other with an adhesive layer 142.

A light-blocking layer BM is provided on a surface of the substrate 152 that faces the substrate 151. The light-blocking layer BM has openings at positions overlapping the light-emitting element 190G and the light-emitting element 190B and a position overlapping the light-emitting/receiving element 190MER. Note that in this specification and the like, the position overlapping the light-emitting element 190G or the light-emitting element 190B refers specifically to a position overlapping a light-emitting region of the light-emitting element 190G or the light-emitting element 190B. Similarly, the position overlapping the light-emitting/receiving element 190MER refers specifically to a position overlapping a light-emitting region and a light-receiving region of the light-emitting/receiving element 190MER.

As illustrated in FIG. 20B, the light-emitting/receiving element 190MER is capable of sensing light that is emitted from the light-emitting element 190G or the light-emitting element 190B and then reflected by an object. However, in some cases, light emitted from the light-emitting element 190G or the light-emitting element 190B is reflected inside the display apparatus 310A and enters the light-emitting/ receiving element 190MER without involving an object. The light-blocking layer BM can reduce the influence of such stray light. For example, in the case where the light-blocking layer BM is not provided, light 323 emitted from the light-emitting element 190G is reflected by the substrate 152 and reflected light 324 enters the light-emitting/receiving element 190MER in some cases. Providing the light-blocking layer BM can inhibit the reflected light 324 from entering the light-emitting/receiving element 190MER. Consequently, noise can be reduced, and the sensitivity of a sensor using the light-emitting/receiving element 190MER can be increased.

For the light-blocking layer BM, a material that blocks light emitted from the light-emitting elements can be used. The light-blocking layer BM preferably absorbs visible light. As the light-blocking layer BM, a black matrix can be formed using a metal material or a resin material containing pigment (e.g., carbon black) or dye, for example. The light-blocking layer BM may have a stacked-layer structure of a red color filter, a green color filter, and a blue color filter.

[Display Apparatus 310B]

Figure 21A:
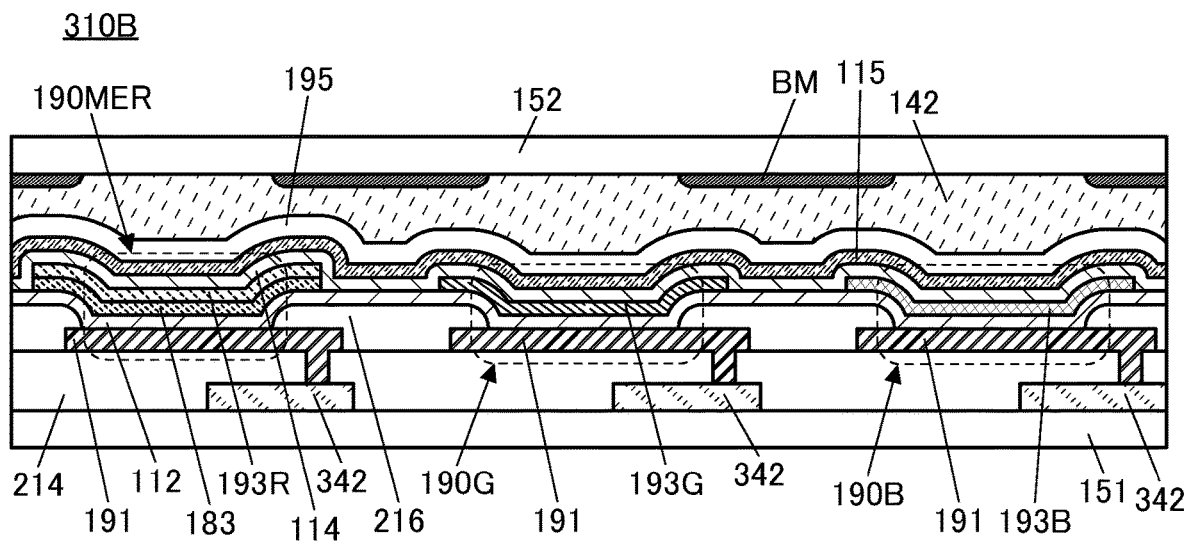
FIG. 21A and FIG. 21B are cross-sectional views illustrating examples of display apparatuses.

A display apparatus 310B illustrated in FIG. 21A is different from the display apparatus 310A in that each of the light-emitting element 190G, the light-emitting element 190B, and the light-emitting/receiving element 190MER does not include the buffer layer 192 and the buffer layer 194 and includes the common layer 112 and the common layer 114. Note that in the following description of the display apparatus, components similar to those of the above-mentioned display apparatus are not described in some cases.

Note that the layered structure of the light-emitting element 190B, the light-emitting element 190G, and the light-emitting/receiving element 190MER is not limited to the structures in the display apparatuses 310A and 310B. For example, any of the layered structures illustrated in FIG. 16 to FIG. 19 can be appropriately used for each element.

[Display Apparatus 310C]

Figure 21B:
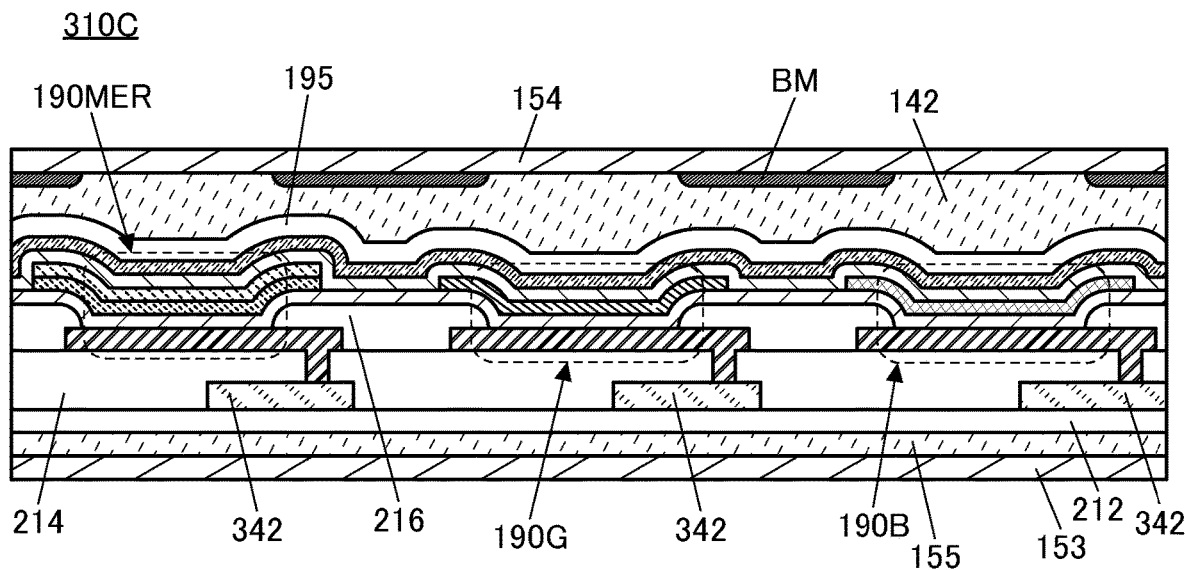

A display apparatus 310C illustrated in FIG. 21B is different from the display apparatus 310B in that the substrate 151 and the substrate 152 are not included but a substrate 153, a substrate 154, an adhesive layer 155, and an insulating layer 212 are included.

The substrate 153 and the insulating layer 212 are bonded to each other with the adhesive layer 155. The substrate 154 and the protective layer 195 are bonded to each other with the adhesive layer 142.

The display apparatus 310C has a structure obtained in such a manner that the insulating layer 212, the transistor 342, the light-emitting/receiving element 190MER, the light-emitting element 190G, the light-emitting element 190B, and the like are formed over a formation substrate and then transferred onto the substrate 153. The substrate 153 and the substrate 154 preferably have flexibility. Accordingly, the flexibility of the display apparatus 310C can be increased. For example, a resin is preferably used for the substrate 153 and the substrate 154.

For the substrate 153 and the substrate 154, it is possible to use, for example, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyether sulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, or cellulose nanofiber. Glass that is thin enough to have flexibility may be used for one or both of the substrate 153 and the substrate 154.

As the substrate included in the display apparatus of this embodiment, a film having high optical isotropy may be used. Examples of the film having high optical isotropy include a triacetyl cellulose (TAC, also referred to as cellulose triacetate) film, a cycloolefin polymer (COP) film, a cycloolefin copolymer (COC) film, and an acrylic film.

A more detailed structure of the display apparatus of one embodiment of the present invention will be described below with reference to FIG. 22 to FIG. 25.

[Display Apparatus 100A]

Figure 22:
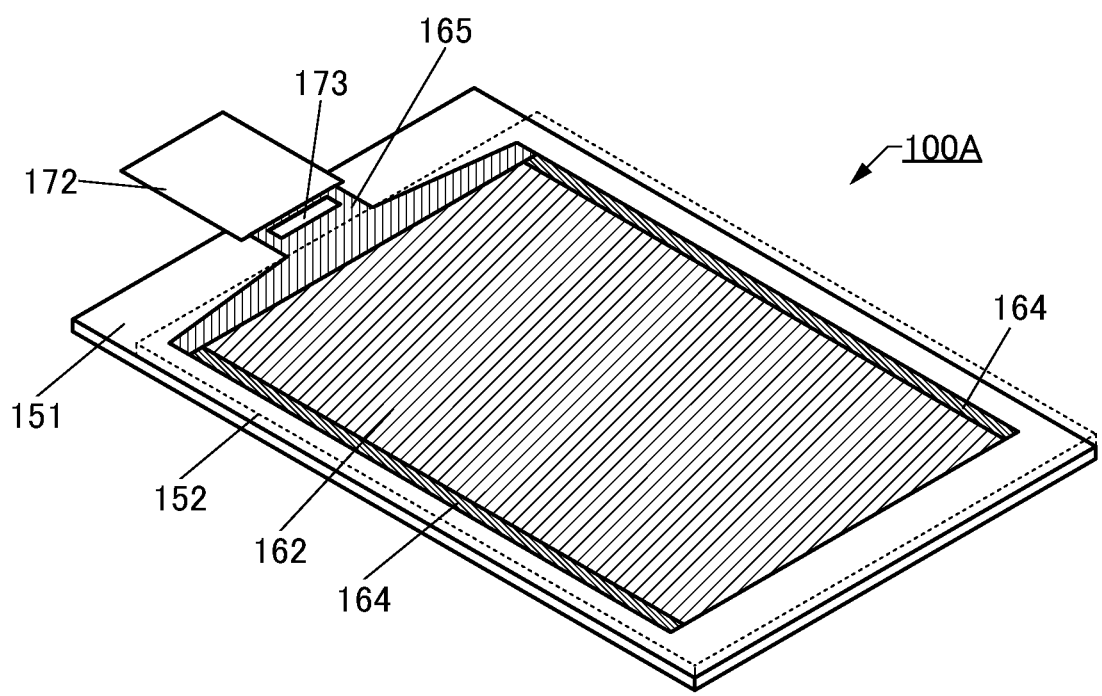
FIG. 22 is a perspective view illustrating an example of a display apparatus.
Figure 23:
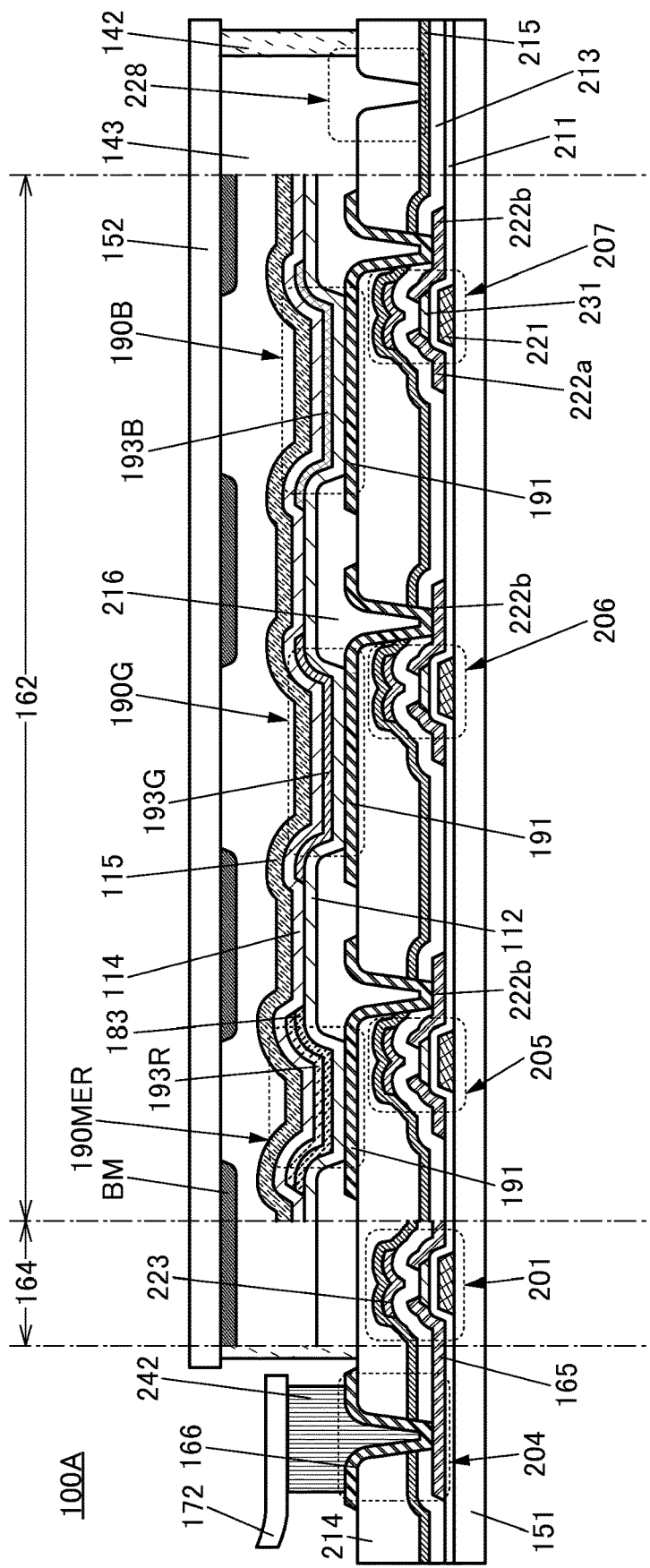
FIG. 23 is a cross-sectional view illustrating an example of a display apparatus.

FIG. 22 is a perspective view of a display apparatus 100A, and FIG. 23 is a cross-sectional view of the display apparatus 100A.

The display apparatus 100A has a structure in which the substrate 152 and the substrate 151 are bonded to each other. In FIG. 22, the substrate 152 is denoted by a dashed line.

The display apparatus 100A includes a display portion 162, a circuit 164, a wiring 165, and the like. FIG. 22 illustrates an example in which the display apparatus 100A is provided with an IC (integrated circuit) 173 and an FPC 172. Thus, the structure illustrated in FIG. 22 can be regarded as a display module including the display apparatus 100A, the IC, and the FPC.

As the circuit 164, for example, a scan line driver circuit can be used.

The wiring 165 has a function of supplying a signal and power to the display portion 162 and the circuit 164. The signal and power are input to the wiring 165 from the outside through the FPC 172 or input to the wiring 165 from the IC 173.

FIG. 22 illustrates an example in which the IC 173 is provided over the substrate 151 by a COG (Chip On Glass) method, a COF (Chip on Film) method, or the like. An IC including a scan line driver circuit or a signal line driver circuit, for example, can be used as the IC 173. Note that the display apparatus 100A and the display module may have a structure not including an IC. The IC may be mounted on the FPC by a COF method or the like.

FIG. 23 illustrates an example of cross sections of part of a region including the FPC 172, part of a region including the circuit 164, part of a region including the display portion 162, and part of a region including an end portion of the display apparatus 100A illustrated in FIG. 22.

The display apparatus 100A in FIG. 23 includes a transistor 201, a transistor 205, a transistor 206, a transistor 207, the light-emitting element 190B, the light-emitting element 190G, the light-emitting/receiving element 190MER, and the like between the substrate 151 and the substrate 152.

The substrate 152 and the insulating layer 214 are attached to each other with the adhesive layer 142. A solid sealing structure, a hollow sealing structure, or the like can be employed to seal the light-emitting element 190B, the light-emitting element 190G, and the light-emitting/receiving element 190MER. In FIG. 23, a hollow sealing structure is employed in which a space 143 surrounded by the substrate 152, the adhesive layer 142, and the insulating layer 214 is filled with an inert gas (e.g., nitrogen or argon). The adhesive layer 142 may be provided to overlap the light-emitting element 190B, the light-emitting element 190G, and the light-emitting/receiving element 190MER. The space 143 surrounded by the substrate 152, the adhesive layer 142, and the insulating layer 214 may be filled with a resin different from that of the adhesive layer 142.

The light-emitting element 190B has a layered structure in which the pixel electrode 191, the common layer 112, the light-emitting layer 193B, the common layer 114, and the common electrode 115 are stacked in this order from the insulating layer 214 side. The pixel electrode 191 is connected to a conductive layer 222b included in the transistor 207 through an opening provided in the insulating layer 214. The transistor 207 has a function of controlling the driving of the light-emitting element 190B. The end portion of the pixel electrode 191 is covered with the partition 216. The pixel electrode 191 contains a material that reflects visible light, and the common electrode 115 contains a material that transmits visible light.

The light-emitting element 190G has a layered structure in which the pixel electrode 191, the common layer 112, the light-emitting layer 193G, the common layer 114, and the common electrode 115 are stacked in this order from the insulating layer 214 side. The pixel electrode 191 is connected to the conductive layer 222b included in the transistor 206 through an opening provided in the insulating layer 214. The transistor 206 has a function of controlling the driving of the light-emitting element 190G.

The light-emitting/receiving element 190MER has a layered structure in which the pixel electrode 191, the common layer 112, the active layer 183, the light-emitting layer 193R, the common layer 114, and the common electrode 115 are stacked in this order from the insulating layer 214 side. The pixel electrode 191 is electrically connected to the conductive layer 222b included in the transistor 205 through an opening provided in the insulating layer 214. The transistor 205 has a function of controlling the driving of the light-emitting/receiving element 190MER.

Light emitted from the light-emitting element 190B, the light-emitting element 190G, and the light-emitting/receiving element 190MER is emitted toward the substrate 152. Light enters the light-emitting/receiving element 190MER through the substrate 152 and the space 143. For the substrate 152, a material that has high transmittance with respect to visible light is preferably used.

The pixel electrodes 191 can be formed using the same material in the same step. The common layer 112, the common layer 114, and the common electrode 115 are used in common in the light-emitting element 190B, the light-emitting element 190G, and the light-emitting/receiving element 190MER. The light-emitting/receiving element 190MER has the structure of a red-light-emitting element to which the active layer 183 is added. Alternatively, the light-emitting element 190B, the light-emitting element 190G, and the light-emitting/receiving element 190MER can have a common structure except for the active layer 183 and the light-emitting layer 193 of each color. Thus, the display portion 162 of the display apparatus 100A can have a light-receiving function without a significant increase in the number of manufacturing steps.

The light-blocking layer BM is provided on a surface of the substrate 152 that faces the substrate 151. The light-blocking layer BM includes openings at positions overlapping the light-emitting element 190B, the light-emitting element 190G, and the light-emitting/receiving element 190MER. Providing the light-blocking layer BM can control the range where the light-emitting/receiving element 190MER senses light. Furthermore, with the light-blocking layer BM, light can be prevented from directly entering the light-emitting/receiving element 190MER from the light-emitting element 190G or the light-emitting element 190B without involving any object. Hence, a sensor with less noise and high sensitivity can be obtained.

The transistor 201, the transistor 205, the transistor 206, and the transistor 207 are formed over the substrate 151. These transistors can be formed using the same materials in the same steps.

An insulating layer 211, an insulating layer 213, an insulating layer 215, and the insulating layer 214 are provided in this order over the substrate 151. Parts of the insulating layer 211 function as gate insulating layers of the transistors. Parts of the insulating layer 213 function as gate insulating layers of the transistors. The insulating layer 215 is provided to cover the transistors. The insulating layer 214 is provided to cover the transistors and has a function of a planarization layer. Note that there is no limitation on the number of gate insulating layers and the number of insulating layers covering the transistors, and each insulating layer may be either a single layer or two or more layers.

A material into which impurities such as water or hydrogen do not easily diffuse is preferably used for at least one of the insulating layers that cover the transistors. This allows the insulating layer to serve as a barrier layer. Such a structure can effectively inhibit diffusion of impurities into the transistors from the outside and increase the reliability of the display apparatus.

An inorganic insulating film is preferably used as each of the insulating layer 211, the insulating layer 213, and the insulating layer 215. As the inorganic insulating film, for example, a silicon nitride film, a silicon oxynitride film, a silicon oxide film, a silicon nitride oxide film, an aluminum oxide film, an aluminum nitride film, or the like, which is an inorganic insulating film, can be used. A hafnium oxide film, a hafnium oxynitride film, a hafnium nitride oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used. Note that a base film may be provided between the substrate 151 and the transistors. Any of the above-described inorganic insulating films can be used as the base film.

Here, an organic insulating film often has a lower barrier property than an inorganic insulating film. Therefore, the organic insulating film preferably has an opening in the vicinity of an end portion of the display apparatus 100A. This can inhibit entry of impurities from the end portion of the display apparatus 100A through the organic insulating film. Alternatively, the organic insulating film may be formed so that an end portion of the organic insulating film is positioned on the inner side compared to the end portion of the display apparatus 100A, to prevent the organic insulating film from being exposed at the end portion of the display apparatus 100A.

An organic insulating film is suitable for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

In a region 228 illustrated in FIG. 23, an opening is formed in the insulating layer 214. This can inhibit entry of impurities into the display portion 162 from the outside through the insulating layer 214 even when an organic insulating film is used as the insulating layer 214. Thus, the reliability of the display apparatus 100A can be increased.

The transistor 201, the transistor 205, the transistor 206, and the transistor 207 each include a conductive layer 221 functioning as a gate, the insulating layer 211 functioning as a gate insulating layer, a conductive layer 222a and the conductive layer 222b functioning as a source and a drain, a semiconductor layer 231, the insulating layer 213 functioning as a gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display apparatus of this embodiment. For example, a planar transistor, a staggered transistor, or an inverted staggered transistor can be used. A top-gate or a bottom-gate transistor structure may be employed. Alternatively, gates may be provided above and below a semiconductor layer in which a channel is formed.

The structure in which the semiconductor layer where a channel is formed is provided between two gates is used for the transistor 201, the transistor 205, the transistor 206, and the transistor 207. The two gates may be connected to each other and supplied with the same signal to drive the transistor. Alternatively, a potential for controlling the threshold voltage may be supplied to one of the two gates and a potential for driving may be supplied to the other to control the threshold voltage of the transistor.

There is no particular limitation on the crystallinity of a semiconductor material used for the transistors; any of an amorphous semiconductor, a single crystal semiconductor, and a semiconductor having crystallinity (a microcrystalline semiconductor, a polycrystalline semiconductor, or a semiconductor partly including crystal regions) may be used. A single crystal semiconductor or a semiconductor having crystallinity is preferably used, in which case deterioration of the transistor characteristics can be inhibited.

A semiconductor layer of a transistor preferably includes a metal oxide (also referred to as an oxide semiconductor). Alternatively, the semiconductor layer of the transistor may include silicon. Examples of silicon include amorphous silicon and crystalline silicon (e.g., low-temperature polysilicon and single crystal silicon).

The semiconductor layer preferably includes indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. In particular, M is preferably one or more kinds selected from aluminum, gallium, yttrium, and tin.

It is particularly preferable to use an oxide containing indium (In), gallium (Ga), and zinc (Zn) (also referred to as IGZO) for the semiconductor layer. Alternatively, it is preferable to use an oxide containing indium, gallium, zinc, and tin. Alternatively, it is preferable to use an oxide containing indium, tin, and zinc.

When the semiconductor layer is an In-M-Zn oxide, the atomic ratio of In is preferably greater than or equal to the atomic ratio of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=10:1:3 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of ±30% of an intended atomic ratio.

For example, when the atomic ratio is described as In:Ga:Zn=4:2:3 or a composition in the neighborhood thereof, the case is included where the atomic ratio of Ga is greater than or equal to 1 and less than or equal to 3 and the atomic ratio of Zn is greater than or equal to 2 and less than or equal to 4 with the atomic ratio of In being 4. When the atomic ratio is described as In:Ga:Zn=5:1:6 or a composition in the neighborhood thereof, the case is included where the atomic ratio of Ga is greater than 0.1 and less than or equal to 2 and the atomic ratio of Zn is greater than or equal to 5 and less than or equal to 7 with the atomic ratio of In being 5. When the atomic ratio is described as In:Ga:Zn=1:1:1 or a composition in the neighborhood thereof, the case is included where the atomic ratio of Ga is greater than 0.1 and less than or equal to 2 and the atomic ratio of Zn is greater than 0.1 and less than or equal to 2 with the atomic ratio of In being 1.

The transistor included in the circuit 164 and the transistor included in the display portion 162 may have the same structure or different structures. A plurality of transistors included in the circuit 164 may have the same structure or two or more kinds of structures. Similarly, a plurality of transistors included in the display portion 162 may have the same structure or two or more kinds of structures.

A connection portion 204 is provided in a region of the substrate 151 that is not overlapped by the substrate 152. In the connection portion 204, the wiring 165 is electrically connected to the FPC 172 through a conductive layer 166 and a connection layer 242. On the top surface of the connection portion 204, the conductive layer 166 obtained by processing the same conductive film as the pixel electrode 191 is exposed. Thus, the connection portion 204 and the FPC 172 can be electrically connected to each other through the connection layer 242.

A variety of optical members can be arranged on the outer surface of the substrate 152. Examples of the optical members include a polarizing plate, a retardation plate, a light diffusion layer (e.g., a diffusion film), an anti-reflective layer, and a light-condensing film. Furthermore, an antistatic film inhibiting the attachment of dust, a water repellent film inhibiting the attachment of stain, a hard coat film inhibiting generation of a scratch caused by the use, a shock absorbing layer, or the like may be provided on the outside of the substrate 152.

For each of the substrate 151 and the substrate 152, glass, quartz, ceramic, sapphire, a resin, or the like can be used. When a flexible material is used for the substrate 151 and the substrate 152, the flexibility of the display apparatus can be increased.

As the adhesive layer, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. Alternatively, a two-component resin may be used. An adhesive sheet or the like may be used.

As the connection layer, an anisotropic conductive film (ACF), an anisotropic conductive paste (ACP), or the like can be used.

Examples of materials that can be used for a gate, a source, and a drain of a transistor and conductive layers such as a variety of wirings and electrodes included in a display apparatus include metals such as aluminum, titanium, chromium, nickel, copper, yttrium, zirconium, molybdenum, silver, tantalum, or tungsten, and an alloy containing any of these metals as its main component. A film containing any of these materials can be used as a single layer or in a stacked-layer structure.

As a light-transmitting conductive material, a conductive oxide such as indium oxide, indium tin oxide, indium zinc oxide, zinc oxide, or zinc oxide containing gallium, or graphene can be used. Alternatively, a metal material such as gold, silver, platinum, magnesium, nickel, tungsten, chromium, molybdenum, iron, cobalt, copper, palladium, or titanium, or an alloy material containing the metal material can be used. Further alternatively, a nitride of the metal material (e.g., titanium nitride) or the like may be used. Note that in the case of using the metal material or the alloy material (or the nitride thereof), the thickness is preferably set small enough to be able to transmit light. A stacked film of any of the above materials can be used as a conductive layer. For example, a stacked film of indium tin oxide and an alloy of silver and magnesium is preferably used, in which case the conductivity can be increased. These materials can also be used for conductive layers such as a variety of wirings and electrodes included in a display apparatus, or conductive layers (conductive layers functioning as a pixel electrode, a common electrode, or the like) included in a light-emitting element and a light-emitting/receiving element.

Examples of an insulating material that can be used for each insulating layer include a resin such as an acrylic resin and an epoxy resin, and an inorganic insulating material such as silicon oxide, silicon oxynitride, silicon nitride oxide, silicon nitride, and aluminum oxide.

[Display Apparatus 100B]

Figure 24:
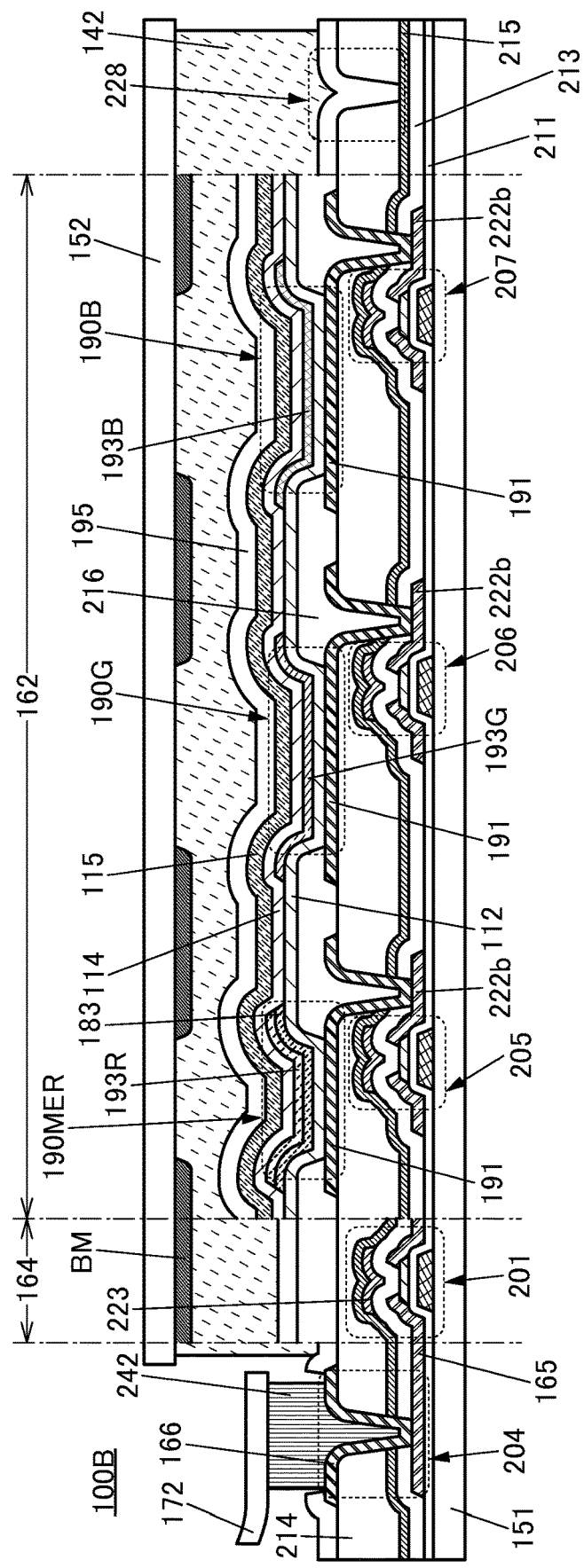
FIG. 24 is a cross-sectional view illustrating an example of a display apparatus.

FIG. 24 is a cross-sectional view of a display apparatus 100B.

The display apparatus 100B is different from the display apparatus 100A mainly in including the protective layer 195. Detailed description of a structure similar to that of the display apparatus 100A is omitted.

Providing the protective layer 195 that covers the light-emitting element 190B, the light-emitting element 190G, and the light-emitting/receiving element 190MER can inhibit entry of impurities such as water into the light-emitting element 190B, the light-emitting element 190G, and the light-emitting/receiving element 190MER, leading to an increase in the reliability of the light-emitting element 190B, the light-emitting element 190G, and the light-emitting/receiving element 190MER.

In the region 228 in the vicinity of an end portion of the display apparatus 100B, the insulating layer 215 and the protective layer 195 are preferably in contact with each other through an opening in the insulating layer 214. In particular, the inorganic insulating film included in the insulating layer 215 and the inorganic insulating film included in the protective layer 195 are preferably in contact with each other. Thus, entry of impurities from the outside into the display portion 162 through the organic insulating film can be inhibited. Consequently, the reliability of the display apparatus 100B can be increased.

The protective layer 195 may have a single-layer structure or a stacked-layer structure; for example, the protective layer 195 may have a three-layer structure that includes an inorganic insulating layer over the common electrode 115, an organic insulating layer over the inorganic insulating layer, and an inorganic insulating layer over the organic insulating layer. In that case, an end portion of the inorganic insulating film preferably extends beyond an end portion of the organic insulating film.

Furthermore, a lens may be provided in a region overlapping the light-emitting/receiving element 190MER. Thus, the sensitivity and accuracy of a sensor using the light-emitting/receiving element 190MER can be increased.

The lens preferably has a refractive index greater than or equal to 1.3 and less than or equal to 2.5. The lens can be formed using at least one of an inorganic material and an organic material. For example, a material containing a resin can be used for the lens. Moreover, a material containing at least one of an oxide and a sulfide can be used for the lens.

Specifically, a resin containing chlorine, bromine, or iodine, a resin containing a heavy metal atom, a resin having an aromatic ring, a resin containing sulfur, and the like can be used for the lens. Alternatively, a material containing a resin and nanoparticles of a material having a higher refractive index than the resin can be used for the lens. Titanium oxide, zirconium oxide, or the like can be used for the nanoparticles.

In addition, cerium oxide, hafnium oxide, lanthanum oxide, magnesium oxide, niobium oxide, tantalum oxide, titanium oxide, yttrium oxide, zinc oxide, an oxide containing indium and tin, an oxide containing indium, gallium, and zinc, and the like can be used for the lens. Alternatively, zinc sulfide and the like can be used for the lens.

In the display apparatus 100B, the protective layer 195 and the substrate 152 are bonded to each other with the adhesive layer 142. The adhesive layer 142 is provided to overlap the light-emitting element 190B, the light-emitting element 190G, and the light-emitting/receiving element 190MER; that is, the display apparatus 100B employs a solid sealing structure.

[Display Apparatus 100C]

FIG. 25A is a cross-sectional view of a display apparatus 100C.

The display apparatus 100C is different from the display apparatus 100B in transistor structures.

The display apparatus 100C includes a transistor 208, a transistor 209, and a transistor 210 over the substrate 151.

The transistor 208, the transistor 209, and the transistor 210 each include the conductive layer 221 functioning as a gate, the insulating layer 211 functioning as a gate insulating layer, a semiconductor layer including a channel formation region 231$i$ and a pair of low-resistance regions 231$n$, the conductive layer 222$a$ connected to one of the pair of low-resistance regions 231$n$, the conductive layer 222$b$ connected to the other of the pair of low-resistance regions 231$n$, an insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231$i$. The insulating layer 225 is positioned between the conductive layer 223 and the channel formation region 231$i$.

The conductive layer 222$a$ and the conductive layer 222$b$ are connected to the corresponding low-resistance regions 231n through openings provided in the insulating layer 225 and the insulating layer 215. One of the conductive layer 222a and the conductive layer 222b serves as a source, and the other serves as a drain.

The pixel electrode 191 of the light-emitting element 190G is electrically connected to one of the pair of low-resistance regions 231n of the transistor 208 through the conductive layer 222b.

The pixel electrode 191 of the light-emitting/receiving element 190MER is electrically connected to the other of the pair of low-resistance regions 231n of the transistor 209 through the conductive layer 222b.

FIG. 25A illustrates an example in which the insulating layer 225 covers the top surface and a side surface of the semiconductor layer. Meanwhile, in a transistor 202 illustrated in FIG. 25B, the insulating layer 225 overlaps the channel formation region 231i of the semiconductor layer 231 and does not overlap the low-resistance regions 231n. The structure illustrated in FIG. 25B can be obtained by processing the insulating layer 225 using the conductive layer 223 as a mask, for example. In FIG. 25B, the insulating layer 215 is provided to cover the insulating layer 225 and the conductive layer 223, and the conductive layer 222a and the conductive layer 222b are connected to the low-resistance regions 231n through openings in the insulating layer 215. Furthermore, an insulating layer 218 covering the transistor may be provided.

In addition, the display apparatus 100C is different from the display apparatus 100B in that neither the substrate 151 nor the substrate 152 is included and the substrate 153, the substrate 154, the adhesive layer 155, and the insulating layer 212 are included.

The substrate 153 and the insulating layer 212 are bonded to each other with the adhesive layer 155. The substrate 154 and the protective layer 195 are bonded to each other with the adhesive layer 142.

The display apparatus 100C is formed in such a manner that the insulating layer 212, the transistor 208, the transistor 209, the transistor 210, the light-emitting/receiving element 190MER, the light-emitting element 190G, and the like which are formed over a formation substrate are transferred onto the substrate 153. The substrate 153 and the substrate 154 preferably have flexibility. Accordingly, the flexibility of the display apparatus 100C can be increased.

The inorganic insulating film that can be used as the insulating layer 211, the insulating layer 213, and the insulating layer 215 can be used as the insulating layer 212.

In the display apparatus of this embodiment, a subpixel exhibiting light of any of the colors includes a light-emitting/receiving element instead of a light-emitting element as described above. The light-emitting/receiving element functions as both a light-emitting element and a light-receiving element, whereby the pixel can have a light-receiving function without an increase in the number of subpixels included in the pixel. Moreover, the pixel can have a light-receiving function without a reduction in the resolution of the display apparatus, the aperture ratio of each subpixel, or the like.

At least part of this embodiment can be implemented in combination with the other embodiments described in this specification as appropriate.

Embodiment 3

Described in this embodiment is a metal oxide (also referred to as an oxide semiconductor) that can be used in an OS transistor described in the above embodiment.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

The metal oxide can be formed by a sputtering method, a chemical vapor deposition (CVD) method such as a metal organic chemical vapor deposition (MOCVD) method, an atomic layer deposition (ALD) method, or the like.

<Classification of Crystal Structures>

Amorphous (including a completely amorphous structure), CAAC (c-axis-aligned crystalline), nc (nanocrystalline), CAC (cloud-aligned composite), single crystal, and polycrystalline (poly crystal) structures can be given as examples of a crystal structure of an oxide semiconductor.

A crystal structure of a film or a substrate can be analyzed with an X-ray diffraction (XRD) spectrum. For example, evaluation is possible using an XRD spectrum obtained by GIXD (Grazing-Incidence XRD) measurement. Note that a GIXD method is also referred to as a thin film method or a Seemann-Bohlin method.

For example, the XRD spectrum of a quartz glass substrate shows a peak with a substantially bilaterally symmetrical shape. On the other hand, the peak of the XRD spectrum of an IGZO film having a crystal structure has a bilaterally asymmetrical shape. The asymmetrical peak of the XRD spectrum clearly shows the existence of crystal in the film or the substrate. In other words, the crystal structure of the film or the substrate cannot be regarded as "amorphous" unless it has a bilaterally symmetrical peak in the XRD spectrum.

A crystal structure of a film or a substrate can also be evaluated with a diffraction pattern obtained by a nanobeam electron diffraction method (NBED) (such a pattern is also referred to as a nanobeam electron diffraction pattern). For example, a halo pattern is observed in the diffraction pattern of the quartz glass substrate, which indicates that the quartz glass substrate is in an amorphous state. Furthermore, not a halo pattern but a spot-like pattern is observed in the diffraction pattern of the IGZO film deposited at room temperature. Thus, it is suggested that the IGZO film deposited at room temperature is in an intermediate state, which is neither a crystal state nor an amorphous state, and it cannot be concluded that the IGZO film is in an amorphous state.

<<Structure of Oxide Semiconductor>>

Oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC- OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM (Transmission Electron Microscope) image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, or the like.

A crystal structure in which a clear grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is unlikely to occur. Moreover, since the crystallinity of an oxide semiconductor might be decreased by entry of impurities, formation of defects, or the like, the CAAC-OS can be regarded as an oxide semiconductor that has a small amount of impurities or defects (e.g., oxygen vacancies). Hence, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Hence, the orientation in the whole film is not observed. Accordingly, the nc-OS cannot be distinguished from an a-like OS or an amorphous oxide semiconductor by some analysis methods. For example, when an nc-OS film is subjected to structural analysis using out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., greater than or equal to 1 nm and less than or equal to 30 nm).

[a-Like OS]

The a-like OS is an oxide semiconductor having a structure between those of the nc-OS and the amorphous oxide semiconductor. The a-like OS includes a void or a low-density region. That is, the a-like OS has lower crystallinity than the nc-OS and the CAAC-OS. Moreover, the a-like OS has higher hydrogen concentration in the film than the nc-OS and the CAAC-OS.

<<Composition of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. For example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof. These regions are randomly dispersed to form a mosaic pattern. Thus, it is suggested that the CAC-OS has a structure in which metal elements are unevenly distributed.

The CAC-OS can be formed by a sputtering method under a condition where a substrate is not heated intentionally, for example. Moreover, in the case of forming the CAC-OS by a sputtering method, any one or more selected from an inert gas (typically, argon), an oxygen gas, and a nitrogen gas are used as a deposition gas. The flow rate of the oxygen gas to the total flow rate of the deposition gas in deposition is preferably as low as possible; for example, the flow rate of the oxygen gas to the total flow rate of the deposition gas in deposition is higher than or equal to 0% and lower than 30%, preferably higher than or equal to 0% and lower than or equal to 10%.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

Here, the first region has a higher conductivity than the second region. In other words, when carriers flow through the first region, the conductivity of a metal oxide is exhibited. Accordingly, when the first regions are distributed in a metal oxide as a cloud, high field-effect mobility ($\mu$) can be achieved.

The second region has a higher insulating property than the first region. In other words, when the second regions are distributed in a metal oxide, leakage current can be inhibited.

Thus, in the case where a CAC-OS is used for a transistor, by the complementary function of the conducting function due to the first region and the insulating function due to the second region, the CAC-OS can have a switching function (On/Off function). A CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility ($\mu$), and excellent switching operation can be achieved.

A transistor using a CAC-OS has high reliability. Thus, the CAC-OS is most suitable for a variety of semiconductor devices such as display apparatuses.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor with a low carrier concentration is preferably used for the transistor. For example, the carrier concentration of an oxide semiconductor is lower than or equal to $1 \times 10^{17}$ cm$^{-3}$, preferably lower than or equal to $1 \times 10^{15}$ cm$^{-3}$, further preferably lower than or equal to $1 \times 10^{13}$ cm$^{-3}$, still further preferably lower than or equal to $1 \times 10^{11}$ cm$^{-3}$, yet further preferably lower than $1 \times 10^{10}$ cm$^{-3}$, and higher than or equal to $1 \times 10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurities>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration measured by secondary ion mass spectrometry (SIMS)) are lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Accordingly, a transistor including an oxide semiconductor that contains an alkali metal or an alkaline earth metal tends to have normally-on characteristics. Thus, the concentration of an alkali metal or an alkaline earth metal in the oxide semiconductor, which is obtained by SIMS, is lower than or equal to $1\times10^{18}$ atoms/cm$^3$, preferably lower than or equal to $2\times10^{16}$ atoms/cm$^3$.

When the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained using SIMS, is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained using SIMS, is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

At least part of this embodiment can be implemented in combination with the other embodiments described in this specification as appropriate.

Embodiment 4

In this embodiment, electronic devices of embodiments of the present invention will be described with reference to FIG. 26 to FIG. 28.

An electronic device in this embodiment includes the display apparatus of one embodiment of the present invention. For example, the display apparatus of one embodiment of the present invention can be used in a display portion of the electronic device. The display apparatus of one embodiment of the present invention has a function of sensing light, and thus can perform biological authentication with the display portion or detect a touch operation (a contact or an approach), for example. Consequently, the electronic device can have improved functionality and convenience, for example.

Examples of electronic devices include a digital camera, a digital video camera, a digital photo frame, a mobile phone, a portable game console, a portable information terminal, and an audio reproducing device, in addition to electronic devices with a relatively large screen, such as a television device, a desktop or laptop personal computer, a monitor of a computer or the like, digital signage, and a large game machine such as a pachinko machine.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device can have a function of displaying a variety of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 26A:
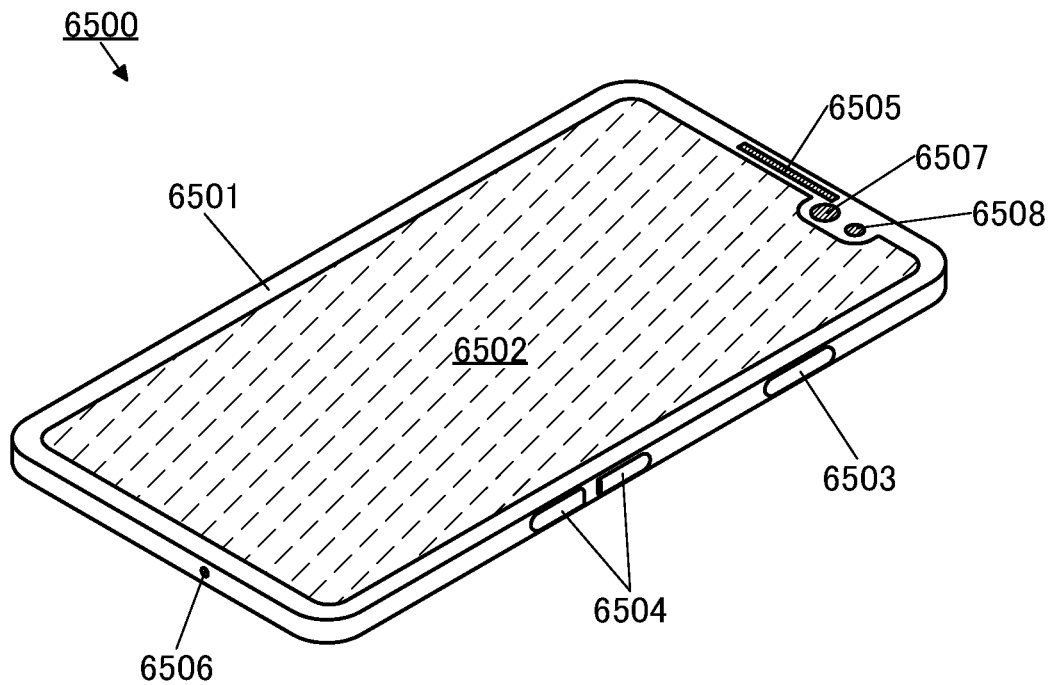
FIG. 26A and FIG. 26B are diagrams illustrating an example of an electronic device.

An electronic device 6500 illustrated in FIG. 26A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display apparatus of one embodiment of the present invention can be used in the display portion 6502.

Figure 26B:
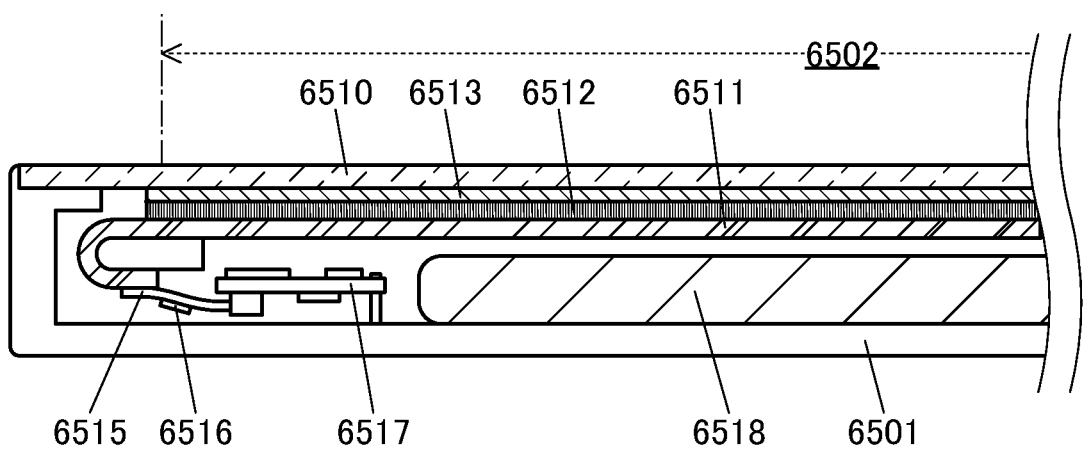

FIG. 26B is a schematic cross-sectional view including an end portion of the housing 6501 on the microphone 6506 side.

A protection member 6510 having a light-transmitting property is provided on the display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be achieved. Since the display panel 6511 is extremely thin, the battery 6518 with high capacity can be mounted with the thickness of the electronic device controlled. An electronic device with a narrow frame can be achieved when part of the display panel 6511 is folded back so that the portion connected to the FPC 6515 is provided on the rear side of a pixel portion.

Using the display apparatus of one embodiment of the present invention as the display panel 6511 allows image capturing on the display portion 6502. For example, an image of a fingerprint is captured by the display panel 6511; thus, fingerprint identification can be performed.

By further including the touch sensor panel 6513, the display portion 6502 can have a touch panel function. A variety of types such as a capacitive type, a resistive type, a surface acoustic wave type, an infrared type, an optical type, and a pressure-sensitive type can be used for the touch sensor panel 6513. Alternatively, the display panel 6511 may function as a touch sensor; in such a case, the touch sensor panel 6513 is not necessarily provided.

Figure 27A:
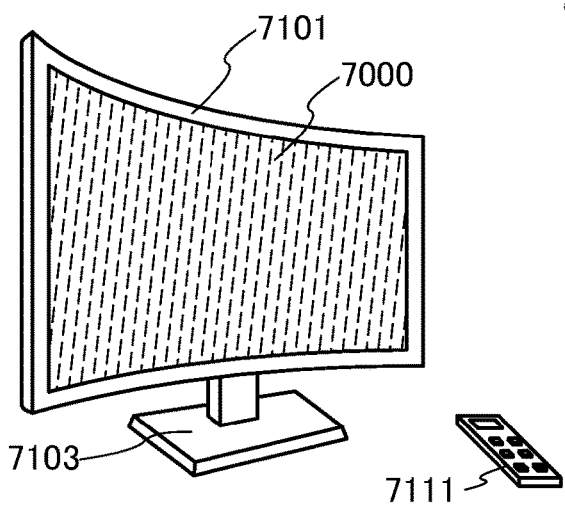
FIG. 27A to FIG. 27D are diagrams illustrating examples of electronic devices.

FIG. 27A illustrates an example of a television device. In a television device 7100, a display portion 7000 is incorporated in a housing 7101. Here, a structure in which the housing 7101 is supported by a stand 7103 is illustrated.

The display apparatus of one embodiment of the present invention can be used in the display portion 7000.

Operation of the television device 7100 illustrated in FIG. 27A can be performed with an operation switch provided in the housing 7101, a separate remote controller 7111, or the like. Alternatively, the display portion 7000 may include a touch sensor, and the television device 7100 may be operated by a touch on the display portion 7000 with a finger or the like. The remote controller 7111 may include a display portion for displaying information output from the remote controller 7111. With operation keys or a touch panel provided in the remote controller 7111, channels and volume can be controlled, and videos displayed on the display portion 7000 can be controlled.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

Figure 27B:
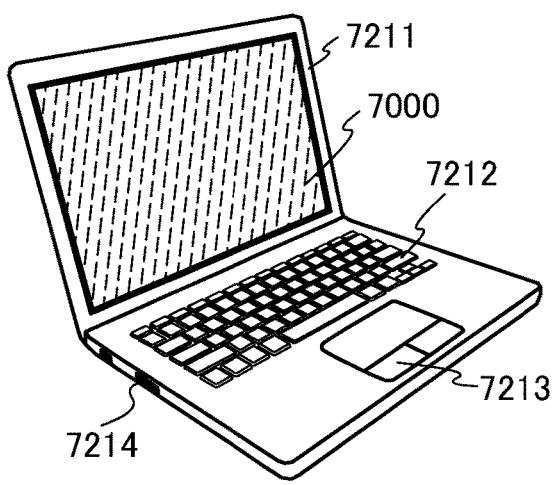

FIG. 27B illustrates an example of a laptop personal computer. A laptop personal computer 7200 includes a housing 7211, a keyboard 7212, a pointing device 7213, an external connection port 7214, and the like. The display portion 7000 is incorporated in the housing 7211.

The display apparatus of one embodiment of the present invention can be used in the display portion 7000.

Figure 27C:
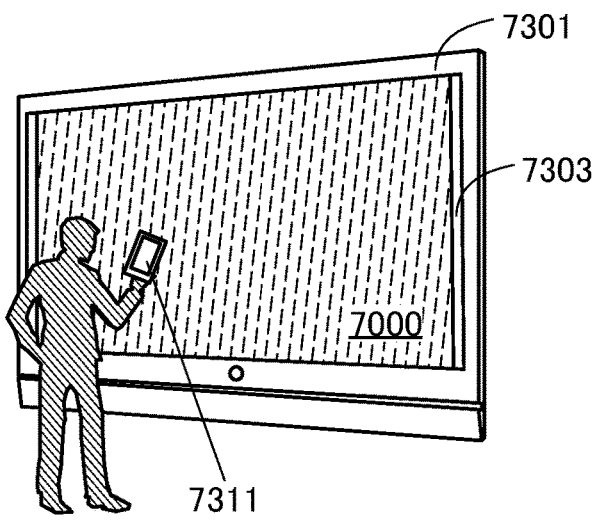
Figure 27D:
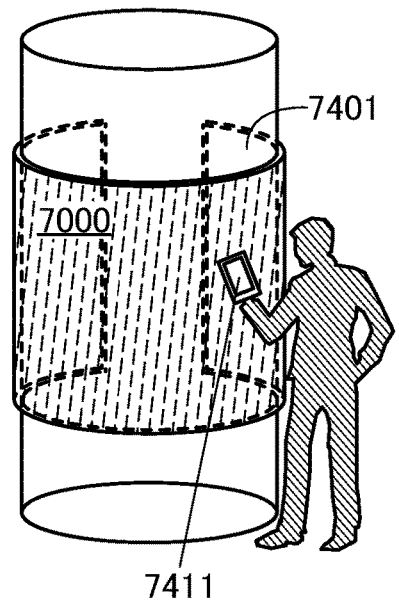

FIG. 27C and FIG. 27D illustrate examples of digital signage.

Digital signage 7300 illustrated in FIG. 27C includes a housing 7301, the display portion 7000, a speaker 7303, and the like. Furthermore, the digital signage can include an LED lamp, operation keys (including a power switch or an operation switch), a connection terminal, a variety of sensors, a microphone, and the like.

FIG. 27D shows digital signage 7400 attached to a cylindrical pillar 7401. The digital signage 7400 includes the display portion 7000 provided along a curved surface of the pillar 7401.

The display apparatus of one embodiment of the present invention can be used in the display portion 7000 in FIG. 27C and FIG. 27D.

A larger area of the display portion 7000 can increase the amount of information that can be provided at a time. The larger display portion 7000 attracts more attention, so that the advertising effectiveness can be enhanced, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIG. 27C and FIG. 27D, it is preferable that the digital signage 7300 or the digital signage 7400 can work with an information terminal 7311 or an information terminal 7411, such as a smartphone a user has, through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Electronic devices illustrated in FIG. 28A to FIG. 28F include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 28A to FIG. 28F have a variety of functions. For example, the electronic devices can have a function of displaying a variety of information (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may each include a camera or the like and have a function of taking a still image or a moving image and storing the taken image in a recording medium (an external recording medium or a recording medium incorporated in the camera), a function of displaying the taken image on the display portion, or the like.

The details of the electronic devices illustrated in FIG. 28A to FIG. 28F are described below.

Figure 28A:
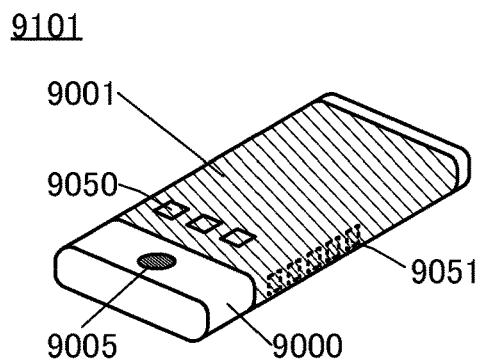
FIG. 28A to FIG. 28F are diagrams illustrating examples of electronic devices.

FIG. 28A is a perspective view illustrating a portable information terminal 9101. The portable information terminal 9101 can be used as a smartphone, for example. Note that the portable information terminal 9101 may be provided with the speaker 9003, the connection terminal 9006, the sensor 9007, or the like. The portable information terminal 9101 can display letters, image information, or the like on its plurality of surfaces. FIG. 28A shows an example where three icons 9050 are displayed. Information 9051 indicated by dashed rectangles can be displayed on another surface of the display portion 9001. Examples of the information 9051 include notification of reception of an e-mail, SNS, an incoming call, or the like, the title and sender of an e-mail, SNS, or the like, the date, the time, remaining battery, and the reception strength of an antenna. Alternatively, the icon 9050 or the like may be displayed at the position where the information 9051 is displayed.

Figure 28B:
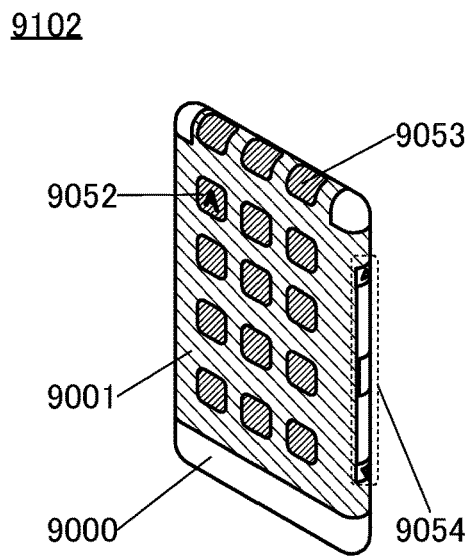

FIG. 28B is a perspective view illustrating a portable information terminal 9102. The portable information terminal 9102 has a function of displaying information on three or more surfaces of the display portion 9001. Here, an example in which information 9052, information 9053, and information 9054 are displayed on different surfaces is shown. For example, a user can check the information 9053 displayed at a position that can be observed from above the portable information terminal 9102, with the portable information terminal 9102 put in a breast pocket of his/her clothes. The user can see the display without taking out the portable information terminal 9102 from the pocket and decide whether to answer the call, for example.

Figure 28C:
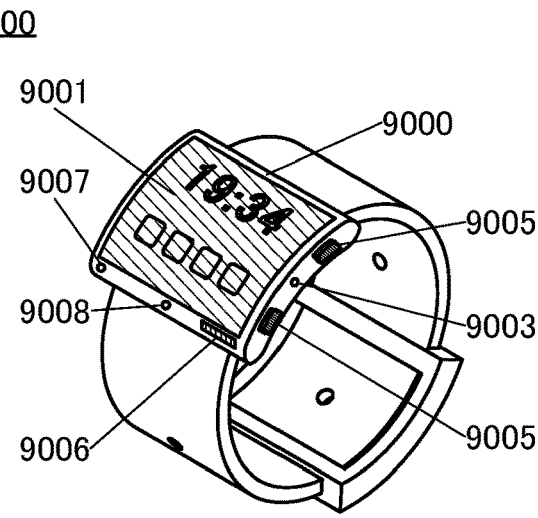

FIG. 28C is a perspective view illustrating a watch-type portable information terminal 9200. The display portion 9001 is provided such that its display surface is curved, and display can be performed along the curved display surface. Mutual communication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

Figure 28D:
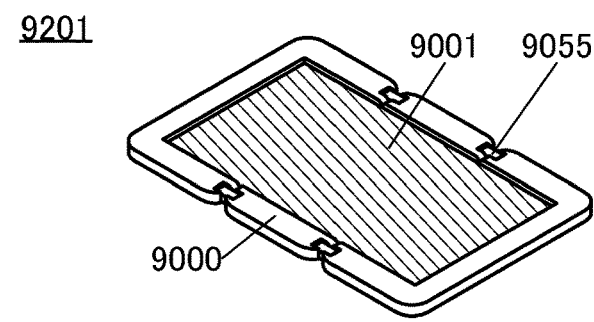
Figure 28E:
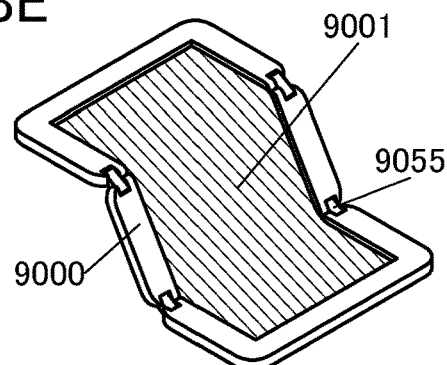
Figure 28F:
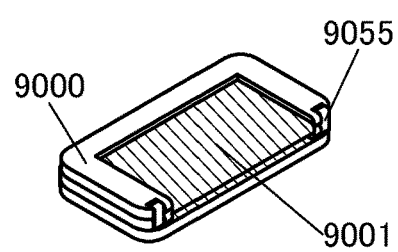

FIG. 28D to FIG. 28F are perspective views illustrating a foldable portable information terminal 9201. FIG. 28D is a perspective view of an opened state of the portable information terminal 9201, FIG. 28F is a perspective view of a folded state thereof, and FIG. 28E is a perspective view of a state in the middle of change from one of FIG. 28D and FIG. 28F to the other. The portable information terminal 9201 is highly portable in the folded state and is highly browsable in the opened state because of a seamless large display region. The display portion 9001 of the portable information terminal 9201 is supported by three housings 9000 joined by hinges 9055. For example, the display portion 9001 can be curved with a radius of curvature greater than or equal to 0.1 mm and less than or equal to 150 mm.

At least part of this embodiment can be implemented in combination with the other embodiments described in this specification as appropriate.

REFERENCE NUMERALS

REN: wiring: RS: wiring: SE: wiring: AL: wiring: CL: wiring: GL: wiring: TX: wiring: VCP: wiring: VPI: wiring: VRS: wiring: WX: wiring: GL1: wiring: GL2: wiring: SL1: wiring: SL2: wiring: SL3: wiring: ME, MER: light-emitting/receiving element: ELB, ELG: light-emitting element: SW1 to SW3: switch: Tr1 to Tr2: transistor: M to M4: transistor: M10 to M14: transistor: C1 to C3: capacitor: CS to CS2: capacitor: 10: display apparatus: 11: display portion: 12 to 14: driver circuit portion: 15: circuit portion: 20R, 20G, 20B: pixel: 21R, 21G, 21B: circuit: 22: circuit: 30, 30a, 30B, 30G: pixel: 40, 40a: circuit: 41 to 43: transistor: 50 to 56: circuit: 61 to 69: transistor: 71 to 74: transistor: 81 to 84: capacitor

The invention claimed is:

1. A display apparatus comprising:
first to third switches, a first transistor, a second transistor, and a light-emitting/receiving element,
wherein the first switch is electrically connected to a gate of the first transistor,
wherein the second switch is positioned between one of a source and a drain of the first transistor and one electrode of the light-emitting/receiving element,
wherein the third switch is positioned between the one electrode of the light-emitting/receiving element and a gate of the second transistor,
wherein the other of the source and the drain of the first transistor is supplied with a first potential,
wherein the other electrode of the light-emitting/receiving element is supplied with a second potential,
wherein the light-emitting/receiving element is configured to emit light of a first color and to receive light of a second color,
wherein in a period during which a potential is supplied to the gate of the first transistor, the first switch is on and the second switch is on or off,
wherein in a period during which the light-emitting/receiving element emits light, the second switch is on,
wherein in a period during which the light-emitting/receiving element receives light, the second switch is off and the third switch is off, and
wherein in a period during which electric charge is transferred from the light-emitting/receiving element to the gate of the second transistor, the second switch is off and the third switch is on.

2. A display apparatus comprising:
a pixel, a first wiring, and a second wiring,
wherein the pixel comprises a first subpixel,
wherein the first subpixel comprises first to seventh transistors and a light-emitting/receiving element,
wherein one of a source and a drain of the first transistor is supplied with a first potential, and the other of the source and the drain of the first transistor is electrically connected to one of a source and a drain of the fourth transistor,
wherein one of a source and a drain of the third transistor is electrically connected to the first wiring, and the other of the source and the drain of the third transistor is electrically connected to a gate of the first transistor,
wherein the other of the source and the drain of the fourth transistor is electrically connected to one electrode of the light-emitting/receiving element and one of a source and a drain of the fifth transistor,
wherein the other of the source and the drain of the fifth transistor is electrically connected to one of a source and a drain of the sixth transistor and a gate of the second transistor,
wherein one of a source and a drain of the second transistor is electrically connected to one of a source and a drain of the seventh transistor, wherein the other of the source and the drain of the seventh transistor is electrically connected to the second wiring, wherein the other electrode of the light-emitting/receiving element is supplied with a second potential, and wherein the light-emitting/receiving element is configured to emit light of a first color and to receive light of a second color.

3. The display apparatus according to claim 2, wherein the fourth transistor is controlled to be turned on in a period during which the light-emitting/receiving element emits light, and to be turned off in a period during which the light-emitting/receiving element receives light and a period during which electric charge is transferred from the light-emitting/receiving element to the gate of the second transistor through the fifth transistor.

4. The display apparatus according to claim 2, further comprising:

an eighth transistor, a first capacitor, and a third wiring, wherein one of a source and a drain of the eighth transistor is electrically connected to the third wiring, and the other of the source and the drain of the eighth transistor is electrically connected to one electrode of the first capacitor and the other of the source and the drain of the first transistor, and wherein the other electrode of the first capacitor is electrically connected to the gate of the first transistor.

5. The display apparatus according to claim 2, further comprising:

a ninth transistor, a tenth transistor, a second capacitor, and a fourth wiring, wherein one of a source and a drain of the ninth transistor is electrically connected to the fourth wiring, and the other of the source and the drain of the ninth transistor is electrically connected to one electrode of the second capacitor and one of a source and a drain of the tenth transistor, wherein the other electrode of the second capacitor is electrically connected to the gate of the first transistor, and wherein the other of the source and the drain of the tenth transistor is electrically connected to the other of the source and the drain of the first transistor.

6. The display apparatus according to claim 5, wherein the first wiring is supplied with a first data potential in a first period, and wherein the fourth wiring is supplied with a reset potential in the first period, and is supplied with second data potential in a second period.

7. The display apparatus according to claim 2, wherein the other of the source and the drain of the sixth transistor is supplied with a third potential, wherein the first potential is higher than the second potential, and wherein the third potential is lower than the second potential.

8. The display apparatus according to claim 2, wherein the pixel comprises a second subpixel comprising a light-emitting element, and wherein the light-emitting element is configured to emit light of the second color.

9. The display apparatus according to claim 8, wherein the light-emitting/receiving element and the light-emitting element are provided on one plane.

10. The display apparatus according to claim 9, wherein the light-emitting/receiving element comprises an electron-injection layer, an electron-transport layer, a light-emitting layer, an active layer, a hole-injection layer, and a hole-transport layer between a pixel electrode and a first electrode, and wherein the light-emitting element comprises at least one of the first electrode, the electron-injection layer, the electron-transport layer, the hole-injection layer, and the hole-transport layer.

11. A display module comprising:

the display apparatus according to claim 1; and a connector or an integrated circuit.

12. An electronic device comprising:

the display module according to claim 11; and at least one of an antenna, a battery, a housing, a camera, a speaker, a microphone, a touch sensor, and an operation button.

13. A display module comprising:

the display apparatus according to claim 2; and a connector or an integrated circuit.

14. An electronic device comprising:

the display module according to claim 13; and at least one of an antenna, a battery, a housing, a camera, a speaker, a microphone, a touch sensor, and an operation button.

* * * * *